US012796262B2

(12) United States Patent
Okamoto et al.

(10) Patent No.: US 12,796,262 B2
(45) Date of Patent: Nov. 10, 2026

(54) SEMICONDUCTOR DEVICE

(71) Applicant: Semiconductor Energy Laboratory Co., Ltd., Atsugi (JP)

(72) Inventors: Yuki Okamoto, Ebina (JP); Tatsuya Onuki, Atsugi (JP); Hidetomo Kobayashi, Isehara (JP); Takanori Matsuzaki, Atsugi (JP); Munehiro Kozuma, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 408 days.

(21) Appl. No.: 18/688,811

(22) PCT Filed: Aug. 29, 2022

(86) PCT No.: PCT/IB2022/058054
§ 371 (c)(1),
(2) Date: Mar. 4, 2024

(87) PCT Pub. No.: WO2023/037203
PCT Pub. Date: Mar. 16, 2023

(65) Prior Publication Data

US 2024/0373709 A1 Nov. 7, 2024

(30) Foreign Application Priority Data

Sep. 10, 2021 (JP) ................................ 2021-147666

(51) Int. Cl.
*H10K 59/131* (2023.01)
*H10D 86/40* (2025.01)
(Continued)

(52) U.S. Cl.
CPC ....... *H10K 59/1315* (2023.02); *H10D 86/423* (2025.01); *H10D 86/471* (2025.01);
(Continued)

(58) Field of Classification Search
CPC ........... H10K 59/1315; H10K 59/1213; H10K 59/1216; H10K 50/19; H10D 86/471; H10D 86/60; H10D 86/423
(Continued)

(56) References Cited

U.S. PATENT DOCUMENTS 7,399,991 B2 7/2008 Seo et al.
7,663,149 B2 2/2010 Seo et al.
(Continued)

FOREIGN PATENT DOCUMENTS

CN 101551973 A 10/2009
CN 111199705 A 5/2020
(Continued)

OTHER PUBLICATIONS

International Search Report (Application No. PCT/IB2022/058054) Dated Nov. 15, 2022.
(Continued)

*Primary Examiner* — Mark Edwards
(74) *Attorney, Agent, or Firm* — Eric J. Robinson; Robinson Intellectual Property Law Office, P.C.

(57) ABSTRACT

An object is to provide a semiconductor device in which the number of control wirings is reduced. In a semiconductor device of one embodiment of the present invention, a first wiring (GLa) is connected to a first input terminal (54*a*) of a logic circuit (54) and a gate of a sixth transistor (M6); a second wiring (GLb) is connected to a second input terminal (54*b*) of the logic circuit (54), a gate of the third transistor (M3), a gate of the fourth transistor (M4), and a gate of the fifth transistor (M5); a gate of the first transistor (M1) is connected to an output terminal (54*y*) of the logic circuit (54); and the logic circuit (54) has a function of outputting a signal obtained by a logic operation of a signal input to the
(Continued)

first input terminal (54*a*) and a signal input to the second input terminal (54*b*) to the output terminal (54*y*).

13 Claims, 31 Drawing Sheets

(51) Int. Cl.
*H10D 86/60* (2025.01)
*H10K 50/19* (2023.01)
*H10K 59/121* (2023.01)

(52) U.S. Cl.
CPC ............. *H10D 86/60* (2025.01); *H10K 50/19* (2023.02); *H10K 59/1213* (2023.02); *H10K 59/1216* (2023.02)

(58) Field of Classification Search
USPC .......................................................... 345/214
See application file for complete search history.

(56) References Cited

U.S. PATENT DOCUMENTS

| | | | |
|---|---|---|---|
| 8,987,731 | B2 | 3/2015 | Yamazaki |
| 9,853,068 | B2 | 12/2017 | Miyake |
| 10,002,972 | B2 | 6/2018 | Miyake |
| 10,453,873 | B2 | 10/2019 | Miyake |
| 10,614,758 | B2 | 4/2020 | Kim et al. |
| 11,417,273 | B2 | 8/2022 | Toyotaka et al. |
| 11,664,391 | B2 | 5/2023 | Miyake |
| 2002/0113546 | A1 | 8/2002 | Seo et al. |
| 2008/0197769 | A1 | 8/2008 | Seo et al. |
| 2009/0243978 | A1 | 10/2009 | Yamamoto et al. |
| 2013/0135277 | A1 | 5/2013 | Ikeda et al. |
| 2013/0320330 | A1 | 12/2013 | Yamazaki |
| 2015/0171156 | A1 | 6/2015 | Miyake |
| 2016/0300900 | A1 | 10/2016 | Miyake |
| 2017/0139253 | A1 | 5/2017 | Hirakata et al. |
| 2018/0114799 | A1 | 4/2018 | Miyake |
| 2018/0180960 | A1 | 6/2018 | Kubota et al. |
| 2020/0135091 | A1 | 4/2020 | Kim |
| 2020/0194471 | A1 | 6/2020 | Miyake |
| 2020/0320930 | A1 * | 10/2020 | Toyotaka .................. G09F 9/30 |
| 2023/0261010 | A1 | 8/2023 | Miyake |

FOREIGN PATENT DOCUMENTS

| | | | | |
|---|---|---|---|---|
| CN | 111406280 | A | 7/2020 | |
| JP | 2002-324673 | A | 11/2002 | |
| JP | 2009-244526 | A | 10/2009 | |
| JP | 2015-132816 | A | 7/2015 | |
| JP | 2015-132818 | A | 7/2015 | |
| JP | 2017-010000 | A | 1/2017 | |
| KR | 2020-0048652 | A | 5/2020 | |
| KR | 2020-0096237 | A | 8/2020 | |
| WO | WO-2019/111137 | | 6/2019 | |
| WO | WO-2019111137 | A1 * | 6/2019 | ............. H10D 86/60 |

OTHER PUBLICATIONS

Written Opinion (Application No. PCT/IB2022/058054) Dated Nov. 15, 2022.

* cited by examiner

SEMICONDUCTOR DEVICE

TECHNICAL FIELD

One embodiment of the present invention relates to a semiconductor device.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof.

In this specification and the like, a semiconductor device refers to a device that utilizes semiconductor characteristics, and means a circuit including a semiconductor element (e.g., a transistor, a diode, or a photodiode) or a device including the circuit, for example. The semiconductor device also means all devices that can function by utilizing semiconductor characteristics. For example, an integrated circuit, a chip including an integrated circuit, and an electronic component including a chip in a package are examples of the semiconductor device. Moreover, for example, a memory device, a display apparatus, a light-emitting apparatus, a lighting device, an electronic device, and the like themselves may be semiconductor devices and may each include a semiconductor device.

BACKGROUND ART

In recent years, higher-resolution or higher-definition display panels have been required. Examples of devices that require high-definition display panels include a smartphone, a tablet terminal, a laptop computer, and the like. In addition, higher definition has been required for a stationary display apparatus such as a television device or a monitor device with an increase in resolution. Furthermore, a device for virtual reality (VR) or augmented reality (AR) is given as an example of a device that is required to have the highest definition.

Examples of display apparatuses applicable to such devices include a liquid crystal display apparatus and a light-emitting apparatus including a light-emitting element such as an organic EL (Electro Luminescence) element or a light-emitting diode (LED).

For example, the basic structure of an organic EL element is a structure where a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus or the like, for example; thus, a thin, lightweight, high-contrast, and low-power-consumption display apparatus can be achieved. Since the response speed of the organic EL element is high, a display apparatus suitable for displaying a fast-moving image can be achieved. Patent Document 1, for example, discloses an example of a display apparatus using an organic EL element.

Patent Document 2 discloses a circuit structure of a pixel circuit for controlling the emission luminance of an organic EL element, in which a threshold voltage variation between transistors is corrected in each pixel to increase the display quality of a display apparatus.

REFERENCE

Patent Document

[Patent Document 1] Japanese Published Patent Application No. 2002-324673
[Patent Document 2] Japanese Published Patent Application No. 2015-132816

SUMMARY OF THE INVENTION

Problems to be Solved by the Invention

An object of one embodiment of the present invention is to provide a downsized semiconductor device or display apparatus. Another object of one embodiment of the present invention is to provide a semiconductor device or display apparatus with high display quality. Another object of one embodiment of the present invention is to provide a semiconductor device or display apparatus in which high color reproducibility is achieved. Another object of one embodiment of the present invention is to provide a high-definition semiconductor device or display apparatus. Another object of one embodiment of the present invention is to provide a highly reliable semiconductor device or display apparatus. Another object of one embodiment of the present invention is to provide a semiconductor device or display apparatus with reduced power consumption. Another object of one embodiment of the present invention is to provide a novel semiconductor device or display apparatus.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems (1)

One embodiment of the present invention is a semiconductor device including a first transistor, a second transistor, a third transistor, a fourth transistor, a fifth transistor, a sixth transistor, a first capacitor, a second capacitor, a display element, a first wiring, a second wiring, and a logic circuit. The first wiring is electrically connected to a first input terminal of the logic circuit and a gate of the sixth transistor. The second wiring is electrically connected to a second input terminal of the logic circuit, a gate of the third transistor, a gate of the fourth transistor, and a gate of the fifth transistor. A gate of the first transistor is electrically connected to an output terminal of the logic circuit. One of a source and a drain of the first transistor is electrically connected to a gate of the second transistor, one of a source and a drain of the third transistor, and one terminal of the first capacitor. The second transistor includes a back gate. The back gate is electrically connected to one of a source and a drain of the fourth transistor and one terminal of the second capacitor. One of a source and a drain of the second transistor is electrically connected to the other of the source and the drain of the third transistor, one of a source and a drain of the fifth transistor, one of a source and a drain of the sixth transistor, the other terminal of the first capacitor, and the other terminal of the second capacitor. The other of the source and the drain of the fifth transistor is electrically connected to one terminal of the display element. The logic circuit has a function of outputting a signal obtained by a logic operation of a signal input to the first input terminal and a signal input to the second input terminal to the output terminal.

(2)

In (1) above, the logic operation may be a logical conjunction of the signal input to the first input terminal and a negation of the signal input to the second input terminal.

(3)

In (1) or (2) above, the logic circuit may include a seventh transistor, an eighth transistor, a ninth transistor, and a tenth transistor. A gate of the seventh transistor and a gate of the ninth transistor may be electrically connected to the first input terminal. A gate of the eighth transistor and a gate of the tenth transistor may be electrically connected to the second input terminal. One of a source and a drain of the seventh transistor may be electrically connected to one of a source and a drain of the eighth transistor. Either the other of the source and the drain of the seventh transistor or the other of the source and the drain of the eighth transistor may be electrically connected to the output terminal. One of a source and a drain of the ninth transistor and one of a source and a drain of the tenth transistor may be electrically connected to the output terminal.

(4)

In (3) above, the seventh transistor and the tenth transistor may be n-channel transistors and the eighth transistor and the ninth transistor may be p-channel transistors.

(5)

In any one of (1) to (4) above, the third transistor and the fourth transistor may be n-channel transistors and the fifth transistor may be a p-channel transistor.

(6)

In (4) or (5) above, the p-channel transistor may contain silicon in a semiconductor layer where a channel is formed.

(7)

In any one of (4) to (6) above, the n-channel transistor may contain a metal oxide in a semiconductor layer where a channel is formed.

(8)

In (7) above, the metal oxide preferably contains at least one of indium and zinc.

(9)

In any one of (1) to (8) above, an organic EL element with a tandem structure can be used as the display element, for example.

Effect of the Invention

With one embodiment of the present invention, a downsized semiconductor device or display apparatus can be provided. With one embodiment of the present invention, a semiconductor device or display apparatus with high display quality can be provided. With one embodiment of the present invention, a semiconductor device or display apparatus in which high color reproducibility is achieved can be provided. With one embodiment of the present invention, a high-definition semiconductor device or display apparatus can be provided. With one embodiment of the present invention, a highly reliable semiconductor device or display apparatus can be provided. With one embodiment of the present invention, a semiconductor device or display apparatus with reduced power consumption can be provided. With one embodiment of the present invention, a novel semiconductor device or display apparatus can be provided.

Note that the description of these effects does not preclude the existence of other effects. One embodiment of the present invention does not need to have all of these effects. Note that effects other than these can be derived from the description of the specification, the drawings, the claims, and the like.

MODE FOR CARRYING OUT THE INVENTION

Figure 1A:
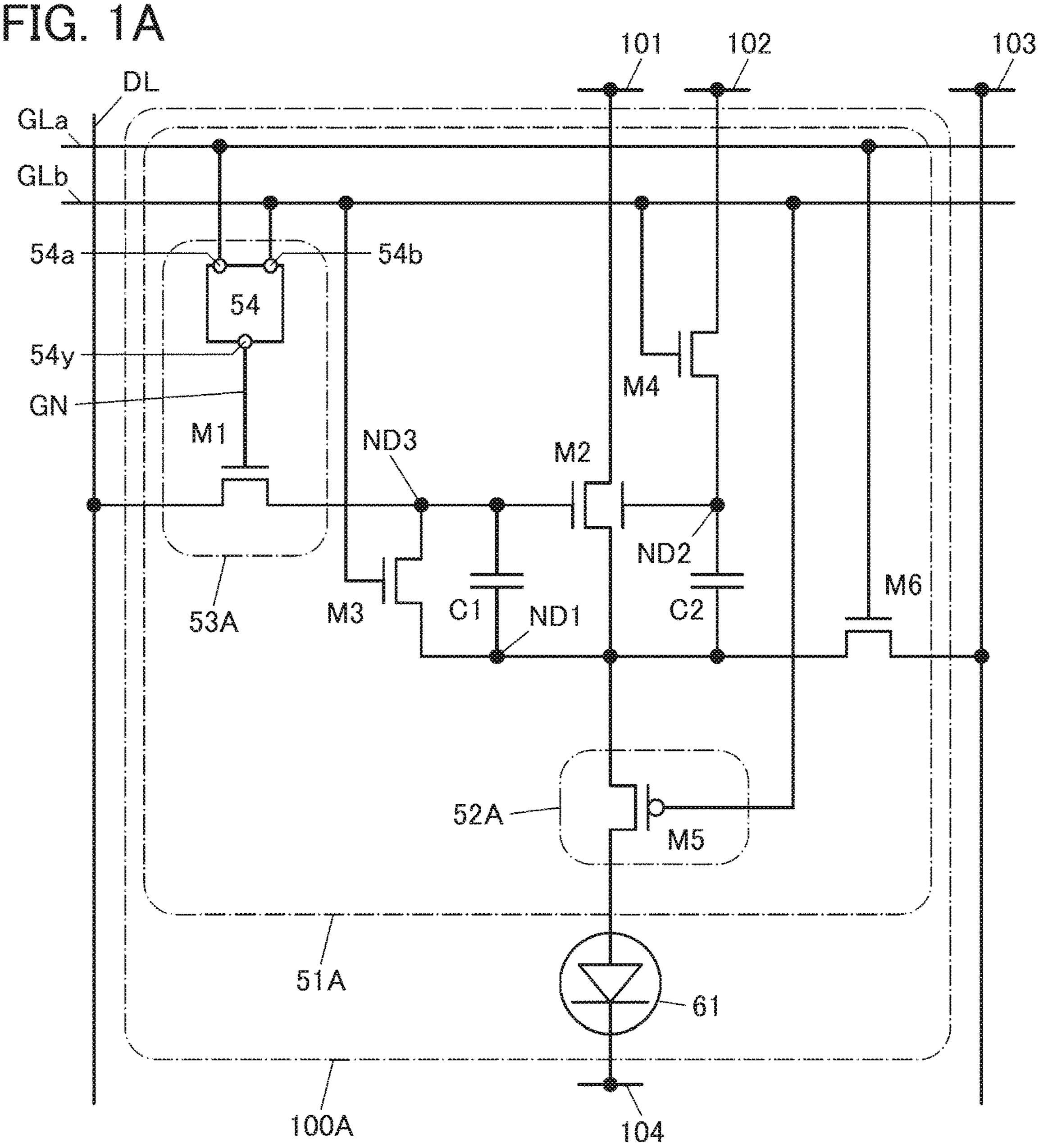
FIG. 1A and FIG. 1B are diagrams illustrating an example of a semiconductor device.

Embodiments are described below with reference to the drawings. Note that the embodiments can be implemented in many different modes. Therefore, it will be readily understood by those skilled in the art that the modes and details can be changed in various ways without departing from the spirit and scope thereof. Thus, the present invention should not be interpreted as being limited to the following description of the embodiments.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit (e.g., a step-up circuit and a step-down circuit) or a level shifter circuit for changing the potential level of a signal); a voltage source; a current source; a switch circuit; an amplifier circuit (e.g., a circuit that can increase signal amplitude, the current amount, or the like, an operational amplifier, a differential amplifier circuit, a source follower circuit, or a buffer circuit); a signal generation circuit; a memory circuit; or a control circuit) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: the wiring and the electrode. Thus, electrical connection in this specification and the like includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" is not limited to only a circuit element that has a pair of electrodes and a dielectric between the electrodes. A "capacitor" includes, for example, parasitic capacitance generated between wirings, gate capacitance generated between a gate and one of a source and a drain of a transistor, and the like. The term "capacitor", "parasitic capacitance", "gate capacitance", or the like can be replaced with the term "capacitance" and the like, for example. Conversely, the term "capacitance" can be replaced with the term "capacitor", "parasitic capacitance", "gate capacitance", or the like, for example. The term "a pair of electrodes" of a "capacitor" can be replaced with "a pair of conductors", "a pair of conductive regions", "a pair of regions", or the like, for example. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms “source” and “drain” can be replaced with each other in this specification and the like. Furthermore, in this specification and the like, expressions “one of a source and a drain” (or a first electrode or a first terminal) and “the other of the source and the drain” (or a second electrode or a second terminal) are used in the description of the connection relationship of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms “gate” and “back gate” can be replaced with each other in one transistor in some cases. In the case where a transistor includes three or more gates, the gates may be referred to as a first gate, a second gate, and a third gate, for example, in this specification and the like.

In this specification and the like, a “node” can be referred to as a “terminal”, a “wiring”, an “electrode”, a “conductive layer”, a “conductor”, an “impurity region”, or the like depending on the circuit structure, the device structure, or the like, for example. Furthermore, a “terminal”, a “wiring”, or the like can be referred to as a “node”, for example.

Ordinal numbers such as “first”, “second”, and “third” in this specification and the like are used to avoid confusion among components. Thus, the ordinal numbers do not limit the number of components. In addition, the ordinal numbers do not limit the order of components. For example, a “first” component in one embodiment in this specification and the like can be referred to as a “second” component in other embodiments, the scope of claims, or the like. Furthermore, for example, a “first” component in one embodiment in this specification and the like can be omitted in other embodiments, the scope of claims, or the like.

In this specification and the like, for example, terms for describing arrangement, such as “over”, “under”, “above”, and “below” are sometimes used for convenience to describe the positional relationship between components with reference to drawings. The positional relationship between components is changed as appropriate in accordance with a direction in which each component is described. Thus, the terms for describing arrangement in this specification and the like are not limited to those and can be replaced with another term as appropriate depending on the situation. For example, the expression “an insulator positioned over (on) a top surface of a conductor” can be replaced with the expression “an insulator positioned under (on) a bottom surface of a conductor” when the direction of a drawing illustrating these components is rotated by 180°.

The term “over” or “under” does not necessarily mean that a component is placed directly over or directly under and directly in contact with another component. For example, the expression “electrode B over insulating layer A” does not necessarily mean that the electrode B is formed over and in direct contact with the insulating layer A, and does not exclude the case where another component is provided between the insulating layer A and the electrode B.

Furthermore, the term “overlap”, for example, in this specification and the like does not limit a state such as the stacking order of components. For example, the expression “electrode B overlapping with insulating layer A” does not necessarily mean the state where the electrode B is formed over the insulating layer A. The expression “electrode B overlapping with insulating layer A”, for example, does not exclude the state where the electrode B is formed under the insulating layer A and the state where the electrode B is formed on the right side (or the left side) of the insulating layer A.

The term “adjacent” or “proximity” in this specification and the like does not necessarily mean that a component is directly in contact with another component. For example, the expression “electrode B adjacent to insulating layer A” does not necessarily mean that the electrode B is formed in direct contact with the insulating layer A and does not exclude the case where another component is provided between the insulating layer A and the electrode B.

In this specification and the like, the term “film”, “layer”, or the like can be, for example, interchanged with each other depending on the situation, in some cases. For example, the term “conductive layer” can be changed into the term “conductive film” in some cases. For another example, the term “insulating film” can be changed into the term “insulating layer” in some cases. Alternatively, for example, the term “film”, “layer”, or the like is not used and can be interchanged with another term depending on the situation, in some cases. For example, the term “conductive layer” or “conductive film” can be changed into the term “conductor” in some cases. Furthermore, the term “conductor” can be changed into the term “conductive layer” or “conductive film” in some cases. For example, the term “insulating layer” or “insulating film” can be changed into the term “insulator” in some cases. Furthermore, the term “insulator” can be changed into the term “insulating layer” or “insulating film” in some cases.

In addition, in this specification and the like, for example, the term such as “electrode”, “wiring”, or “terminal” does not limit the function of a component. For example, an “electrode” is used as part of a wiring in some cases, and vice versa. Furthermore, the term “electrode” or “wiring” also includes, for example, the case where a plurality of “electrodes” or “wirings” are formed in an integrated manner. For example, a “terminal” is used as part of a “wiring”, an “electrode”, or the like in some cases, and vice versa. Furthermore, the term “terminal” also includes the case where a plurality of “electrodes”, “wirings”, “terminals”, or the like are formed in an integrated manner, for example. Therefore, for example, an “electrode” can be part of a “wiring” or a “terminal”. Furthermore, a “terminal” can be part of a “wiring” or an “electrode”. Moreover, the term “electrode”, “wiring”, “terminal”, or the like is sometimes replaced with the term “region”, for example.

In addition, in this specification and the like, for example, the terms such as “wiring”, “signal line”, and “power supply line” can be interchanged with each other depending on the situation, in some cases. For example, the term “wiring” can be changed into the term “signal line” in some cases. For another example, the term “wiring” can be changed into the term “power supply line” or the like in some cases. Conversely, for example, the term “signal line”, “power supply line”, or the like can be changed into the term “wiring” in some cases. Furthermore, for example, the term “power supply line” or the like can be changed into the term “signal line” or the like in some cases. Conversely, for example, the term “signal line” or the like can be changed into the term “power supply line” or the like in some cases. Moreover, the term “potential” that is applied to a wiring can be changed into the term “signal” or the like depending on the situation, for example. Conversely, for example, the term “signal” or the like can be changed into the term “potential” in some cases.

In this specification and the like, a “switch” includes a plurality of terminals and has a function of switching (selecting) electrical continuity and discontinuity between the terminals. For example, in the case where a switch includes two terminals and electrical continuity is established between the two terminals, the switch is in a “conduction state” or an “on state”. In the case where electrical continuity is not established between the two terminals, the switch is in a “non-conduction state” or an “off state”. Note that switching to one of a conduction state and a non-conduction state or maintaining one of a conduction state and a non-conduction state is sometimes referred to as “controlling a conduction state”.

That is, a switch has a function of controlling whether current flows therethrough or not. Alternatively, a switch has a function of selecting and changing a current path. For example, an electrical switch or a mechanical switch can be used as the switch. That is, a switch can be any element capable of controlling current, and is not limited to a particular element.

Note that as a kind of a switch, there is a switch which is normally in a non-conduction state and brought into a conduction state by controlling a conduction state; such a switch is referred to as an “A contact” in some cases. Furthermore, as another kind of a switch, there is a switch which is normally in a conduction state and brought into a non-conduction state by controlling a conduction state; such a switch is referred to as a “B contact” in some cases.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a “conduction state” or “on state” of the transistor refers to a state where a source electrode and a drain electrode of the transistor can be regarded as being electrically short-circuited. Furthermore, a “non-conduction state” or “off state” of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects a conduction or non-conduction state with the movement of the electrode.

In this specification and the like, “parallel” indicates a state where two straight lines are placed at an angle greater than or equal to −10' and less than or equal to 10°. Thus, the case where the angle is greater than or equal to −5° and less than or equal to 5° is also included. In addition, “approximately parallel” or “substantially parallel” indicates a state where two straight lines are placed at an angle greater than or equal to −30° and less than or equal to 30°. Moreover, “perpendicular” indicates a state where two straight lines are placed at an angle greater than or equal to 800 and less than or equal to 100°. Thus, the case where the angle is greater than or equal to 85° and less than or equal to 950 is also included. Furthermore, “approximately perpendicular” or “substantially perpendicular” indicates a state where two straight lines are placed at an angle greater than or equal to 60° and less than or equal to 120°.

Note that in this specification and the like, the terms “identical”, “the same”, “equal”, “uniform”, and the like (including synonyms thereof) used in describing calculation values and measurement values contain an error of ±20% unless otherwise specified.

Embodiments described in this specification are described with reference to the drawings. Note that the embodiments can be implemented in many different modes. Therefore, it will be readily understood by those skilled in the art that the modes and details can be changed in various ways without departing from the spirit and scope thereof. Therefore, the present invention should not be interpreted as being limited to the description in the embodiments. As for the drawings illustrating the embodiments, in the structures of the invention, the same reference numerals are used in common for the same portions or portions having similar functions in different drawings, and repeated description thereof is omitted in some cases. Furthermore, the same hatch pattern is used for the portions having similar functions throughout the drawings, and the portions are not especially denoted by reference numerals in some cases. Moreover, some components are omitted in a perspective view, a top view, and the like for easy understanding of the drawings in some cases.

In addition, in the drawings and the like in this specification, the size, the layer thickness, or the region is exaggerated for clarity in some cases. Therefore, the drawings are not necessarily limited to the drawings with the illustrated size, aspect ratio, and the like, for example. Note that the drawings schematically illustrate ideal examples, and embodiments of the present invention are not limited to shapes, values, and the like illustrated in the drawings, for example. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the “X direction” is a direction along the X-axis, and the forward direction and the reverse direction are not distinguished in some cases, unless otherwise specified. The same applies to the “Y direction” and the “Z direction”. The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a “first direction” in some cases. Another one of the directions is referred to as a “second direction” in some cases. The remaining one of the directions is referred to as a “third direction” in some cases.

In this specification and the like, when a plurality of components are denoted by the same reference numerals, and in particular need to be distinguished from each other, an identification sign such as “A”, “b”, “_1”, “[n]”, or “[m, n]” is sometimes added to the reference numerals, for example.

Embodiment 1

A semiconductor device 100A of one embodiment of the present invention will be described. The semiconductor device 100A of one embodiment of the present invention can be used in a pixel of a display apparatus, for example.

Structure Example

FIG. 1A illustrates a circuit structure example of the semiconductor device 100A. The semiconductor device 100A includes a pixel circuit 51A and a light-emitting element 61. The pixel circuit 51A includes a transistor M1 to a transistor M6, a capacitor C1, a capacitor C2, and a logic circuit 54. In this embodiment and the like, the transistor M1 to the transistor M4 and the transistor M6 are n-channel field-effect transistors. The transistor M5 is a p-channel field-effect transistor.

The logic circuit 54 includes an input terminal 54*a*, an input terminal 54*b*, and an output terminal 54*y*. The input terminal 54*a* is electrically connected to a wiring GLa. The input terminal 54*b* is electrically connected to a wiring GLb. The logic circuit 54 has a function of outputting a signal obtained by a logic operation of a signal input to the input terminal 54*a* and a signal input to the input terminal 54*b* to the output terminal 54*y*.

A gate of the transistor M1 is electrically connected to the output terminal 54*y*. One of a source and a drain of the transistor M1 is electrically connected to a gate of the transistor M2. The other of the source and the drain of the transistor M1 is electrically connected to a wiring DL. The transistor M1 has a function of establishing or breaking electrical continuity between the gate of the transistor M2 and the wiring DL.

The gate of the transistor M2 is electrically connected to one terminal of the capacitor C1. One of a source and a drain of the transistor M2 is electrically connected to the other terminal of the capacitor C1. The other of the source and the drain of the transistor M2 is electrically connected to a wiring 101. Moreover, the transistor M2 includes a back gate. The back gate of the transistor M2 is electrically connected to one terminal of the capacitor C2. The other terminal of the capacitor C2 is electrically connected to the one of the source and the drain of the transistor M2.

A gate of the transistor M3 is electrically connected to the wiring GLb. One of a source and a drain of the transistor M3 is electrically connected to the one terminal of the capacitor C1. The other of the source and the drain of the transistor M3 is electrically connected to the other terminal of the capacitor C1. The transistor M3 has a function of establishing or breaking electrical continuity between the gate of the transistor M2 and the one of the source and the drain of the transistor M2.

A gate of the transistor M4 is electrically connected to the wiring GLb. One of a source and a drain of the transistor M4 is electrically connected to the one terminal of the capacitor C2. The other of the source and the drain of the transistor M4 is electrically connected to a wiring 102. The transistor M4 has a function of establishing or breaking electrical continuity between the one terminal of the capacitor C2 and the wiring 102.

A gate of the transistor M5 is electrically connected to the wiring GLb. One of a source and a drain of the transistor M5 is electrically connected to the one of the source and the drain of the transistor M2. The other of the source and the drain of the transistor M5 is electrically connected to one terminal (e.g., an anode terminal) of the light-emitting element 61. The transistor M5 has a function of establishing or breaking electrical continuity between the one of the source and the drain of the transistor M2 and the one terminal of the light-emitting element 61.

A gate of the transistor M6 is electrically connected to the wiring GLa. One of a source and a drain of the transistor M6 is electrically connected to the one of the source and the drain of the transistor M2. The other of the source and the drain of the transistor M6 is electrically connected to a wiring 103. The transistor M6 has a function of establishing or breaking electrical continuity between the one of the source and the drain of the transistor M2 and the wiring 103.

The other terminal (e.g., a cathode terminal) of the light-emitting element 61 is electrically connected to a wiring 104.

The light-emitting element 61 emits light with the emission intensity corresponding to the amount of current flowing through the light-emitting element 61. As the light-emitting element 61, for example, any of a variety of display elements such as an EL element (e.g., an EL element containing an organic substance and an inorganic substance, an organic EL element, or an inorganic EL element), an LED (e.g., a white LED, a red LED, a green LED, or a blue LED), a micro LED (e.g., an LED with a side of less than 0.1 mm), a QLED (Quantum-dot Light Emitting Diode), and an electron emitter element can be used.

Note that the transistor M2 has a function of controlling the amount of current flowing through the light-emitting element 61. That is, the transistor M2 has a function of controlling the emission intensity of the light-emitting element 61. Thus, in this specification and the like, the transistor M2 is referred to as a "driving transistor" in some cases.

A region where the other terminals of the capacitor C1 and the capacitor C2, the one of the source and the drain of the transistor M2, the other of the source and the drain of the transistor M3, the one of the source and the drain of the transistor M5, and the one of the source and the drain of the transistor M6 are electrically connected to one another is referred to as a node ND1.

A region where the one terminal of the capacitor C2, the back gate of the transistor M2, and the one of the source and the drain of the transistor M4 are electrically connected to one another is referred to as a node ND2.

A region where the one of the source and the drain of the transistor M1, the one of the source and the drain of the transistor M3, the one terminal of the capacitor C1, and the gate of the transistor M2 are electrically connected to one another is referred to as a node ND3.

A region where the gate of the transistor M1 and the output terminal 54*y* are electrically connected to each other is referred to as a node GN.

The capacitor C1 has, for example, a function of retaining a potential difference (voltage) between the other of the source and the drain of the transistor M2 and the gate of the transistor M2 at the time when the node ND3 is in a floating state.

The capacitor C2 has, for example, a function of retaining a potential difference (voltage) between the other of the source and the drain of the transistor M2 and the back gate of the transistor M2 at the time when the node ND2 is in a floating state.

In this embodiment and the like, the logic circuit 54 can have a structure in which, for example, a signal obtained by the logical conjunction of the signal input to the input terminal 54*a* and the negation of the signal input to the input terminal 54*b* is output to the output terminal 54*y*.

Figure 1B:
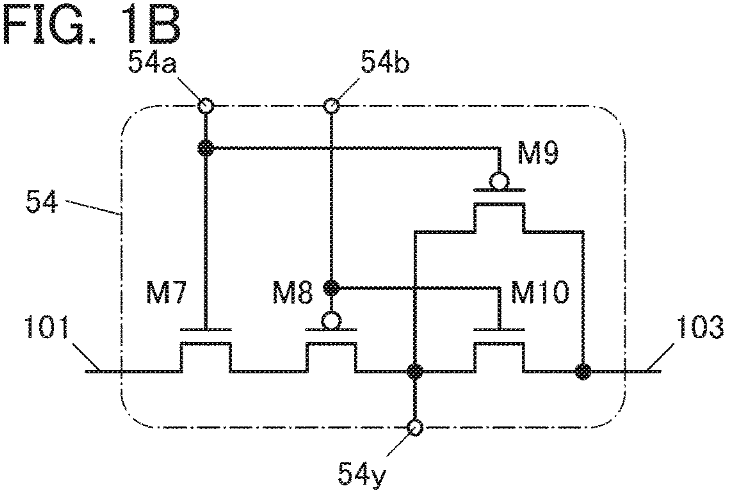

In order to achieve the function of the logic circuit 54, a variety of circuit structures can be used. FIG. 1B illustrates a circuit structure example of the logic circuit 54. The logic circuit 54 includes a transistor M7 to a transistor M10. In this embodiment and the like, the transistor M7 and the transistor M10 are n-channel field-effect transistors. The transistor M8 and the transistor M9 are p-channel field-effect transistors.

A gate of the transistor M7 and a gate of the transistor M9 are electrically connected to the input terminal 54*a*. A gate of the transistor M8 and a gate of the transistor M10 are electrically connected to the input terminal 54*b*. One of a source and a drain of the transistor M7 is electrically connected to one of a source and a drain of the transistor M8. The other of the source and the drain of the transistor M7 is electrically connected to the wiring 101. The other of the source and the drain of the transistor M8 is electrically connected to the output terminal 54*y*. One of a source and a drain of the transistor M9 and one of a source and a drain of the transistor M10 are electrically connected to the output terminal 54*y*. The other of the source and the drain of the transistor M9 and the other of the source and the drain of the transistor M10 are electrically connected to the wiring 103.

Note that the circuit structure of the logic circuit 54 is not limited to the structure in FIG. 1B. For example, a structure may be employed in which the other of the source and the drain of the transistor M8 is electrically connected to the wiring 101, and the other of the source and the drain of the transistor M7 is electrically connected to the output terminal 54*y*.

Note that in this embodiment and the like, unless otherwise specified, the transistor M1 to the transistor M10 are enhancement (normally-off) field-effect transistors. Thus, the threshold voltage (also referred to as "Vth") of the enhancement field-effect transistor is higher than 0 V in the case of an n-channel transistor and lower than 0 V in the case of a p-channel transistor. Note that the threshold voltages of the transistor M1 to the transistor M10 may be different from one another. For example, the threshold voltage of the transistor M2 may be referred to as Vth2. The threshold voltage of the transistor M7 may be referred to as Vth7. The threshold voltage of the transistor M9 may be referred to as Vth9.

A transistor containing any of various semiconductors can be used in the pixel circuit 51A of one embodiment of the present invention. For example, a transistor containing a single crystal semiconductor, a polycrystalline semiconductor, a microcrystalline semiconductor, or an amorphous semiconductor in a channel formation region can be used. Furthermore, for example, a compound semiconductor (e.g., silicon germanium (SiGe) or gallium arsenide (GaAs)), an oxide semiconductor, or the like as well as a single element semiconductor whose main component is a single element (e.g., silicon (Si) or germanium (Ge)) can be used.

Any of transistors having a variety of structures can be used in the pixel circuit 51A of one embodiment of the present invention. For example, any of transistors having a variety of structures such as a planar type, a FIN-type, a TRI-GATE type, a top-gate type, a bottom-gate type, and a dual-gate type (a structure in which gates are placed above and below a channel) can be used. A MOS transistor, a junction transistor, a bipolar transistor, or the like can be used, for example, as the transistor of one embodiment of the present invention.

As each of the transistors included in the pixel circuit 51A, an OS transistor (a transistor containing an oxide semiconductor in a semiconductor layer where a channel is formed) may be used, for example. An oxide semiconductor has a band gap of higher than or equal to 2 eV, and thus has extremely low off-state current.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor (a transistor containing silicon in a semiconductor layer where a channel is formed) at room temperature is higher than or equal to 1 fA ($1\times10^{-15}$ A) and lower than or equal to 1 pA ($1\times10^{-12}$ A). Thus, the off-state current of the OS transistor is lower than the off-state current of the Si transistor by approximately ten orders of magnitude.

When the OS transistor is used as each of the transistors included in the pixel circuit 51A, charge written to the nodes can be retained for a long period. For example, in the case of displaying a still image for which rewriting every frame is not required, displaying an image can be kept even when the operation of a peripheral driver circuit is stopped. Such a driving method in which the operation of a peripheral driver circuit is stopped during displaying a still image is also referred to as "idling stop driving". The power consumption of a display apparatus can be reduced by performing idling stop driving.

The off-state current of the OS transistor hardly increases even in a high-temperature environment. Specifically, the off-state current of the OS transistor hardly increases even at an environment temperature higher than or equal to room temperature and lower than or equal to 200° C. Furthermore, the on-state current of the OS transistor is unlikely to decrease even in a high-temperature environment. A semiconductor device including the OS transistor can operate stably and have high reliability even in a high-temperature environment.

Furthermore, the OS transistor has high withstand voltage between its source and drain. The use of the OS transistor as each of the transistors included in the pixel circuit 51A makes a semiconductor device operate stably even in the case where a potential difference (voltage) between a potential supplied to the wiring 101 (also referred to as an anode potential) and a potential supplied to the wiring 104 (also referred to as a cathode potential) is large; accordingly, a semiconductor device with high reliability can be obtained. It is particularly preferable to use the OS transistor as the transistor M2.

The semiconductor layer of the OS transistor preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as "IGZO") for the semiconductor layer. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. The atomic ratio of In may be smaller than the atomic ratio of M in the In-M-Zn oxide. Examples of the atomic ratio of the metal elements in such an In-M-Zn oxide include In:M:Zn=1:3:2 or a composition in the neighborhood thereof or In:M:Zn=1:3:4 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the content ratio of each element is as follows; Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the content ratio of each element is as follows; Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where the content ratio of each element is as follows; Ga is greater than 0.1 and less than or equal to 2 and Zn is greater than 0.1 and less than or equal to 2 with In being 1.

The pixel circuit 51A may include a plurality of kinds of transistors formed using different semiconductor materials. For example, the pixel circuit 51A may include a transistor containing low-temperature polysilicon (LTPS) in its semiconductor layer (hereinafter also referred to as an LTPS transistor) and an OS transistor. A structure where an LTPS transistor and an OS transistor are used in combination is referred to as LTPO in some cases.

In this embodiment and the like, for example, an OS transistor may be used as an n-channel transistor and an LTPS transistor may be used as a p-channel transistor among the transistors included in the pixel circuit 51A. For example, by electrically connecting a gate of the n-channel OS transistor and a gate of the p-channel LTPS transistor, a circuit that operates complementarily, i.e., a CMOS logic gate, a CMOS logic circuit, or the like may be formed.

For example, transistor M3 and the transistor M4 can operate complementarily with the transistor M5 by using an n-channel OS transistor as the transistor M3 and the transistor M4, and a p-channel LTPS transistor as the transistor M5. Thus, the number of wirings needed to control the conduction state of the transistor M3 to the transistor M5 can be reduced. Thus, the definition of a display apparatus using the semiconductor device 100A of one embodiment of the present invention can be increased. Furthermore, the display quality of the display apparatus using the semiconductor device 100A of one embodiment of the present invention can be improved.

In addition, for example, n-channel OS transistors are used as the transistor M7 and the transistor M10, and p-channel LTPS transistors are used as the transistor M8 and the transistor M9, whereby a CMOS logic circuit can be provided inside the pixel circuit 51A. For example, a signal for controlling a conduction state of the transistor M1 may be generated inside the pixel circuit 51A. Thus, a wiring needed to control a conduction state of the transistor M1 can be reduced. Thus, the definition of a display apparatus using the semiconductor device 100A of one embodiment of the present invention can be increased. Furthermore, the display quality of the display apparatus using the semiconductor device 100A of one embodiment of the present invention can be improved.

An OS transistor has extremely low off-state current. Thus, for example, an OS transistor is preferably used as each of the transistor M1 and the transistor M6 functioning as a switch. The LTPS transistor has high field-effect mobility and favorable frequency characteristics. Thus, for example, an LTPS transistor may be used as the transistor M2 that controls current flowing through the light-emitting element 61. In such a manner, the pixel circuit 51A is formed with a combination of an OS transistor and a LTPS transistor as appropriate, whereby the display apparatus with low power consumption and high driving capability can be achieved.

In the case where the pixel circuit 51A includes a plurality of kinds of transistors formed using different semiconductor materials, the transistors may be provided in different layers for each kind of transistor. For example, in the case where the pixel circuit 51A include a Si transistor and an OS transistor, a layer including the Si transistor and a layer including the OS transistor may be provided to overlap with each other. This structure reduces the area occupied by the pixel circuit 51A.

Figure 2A:
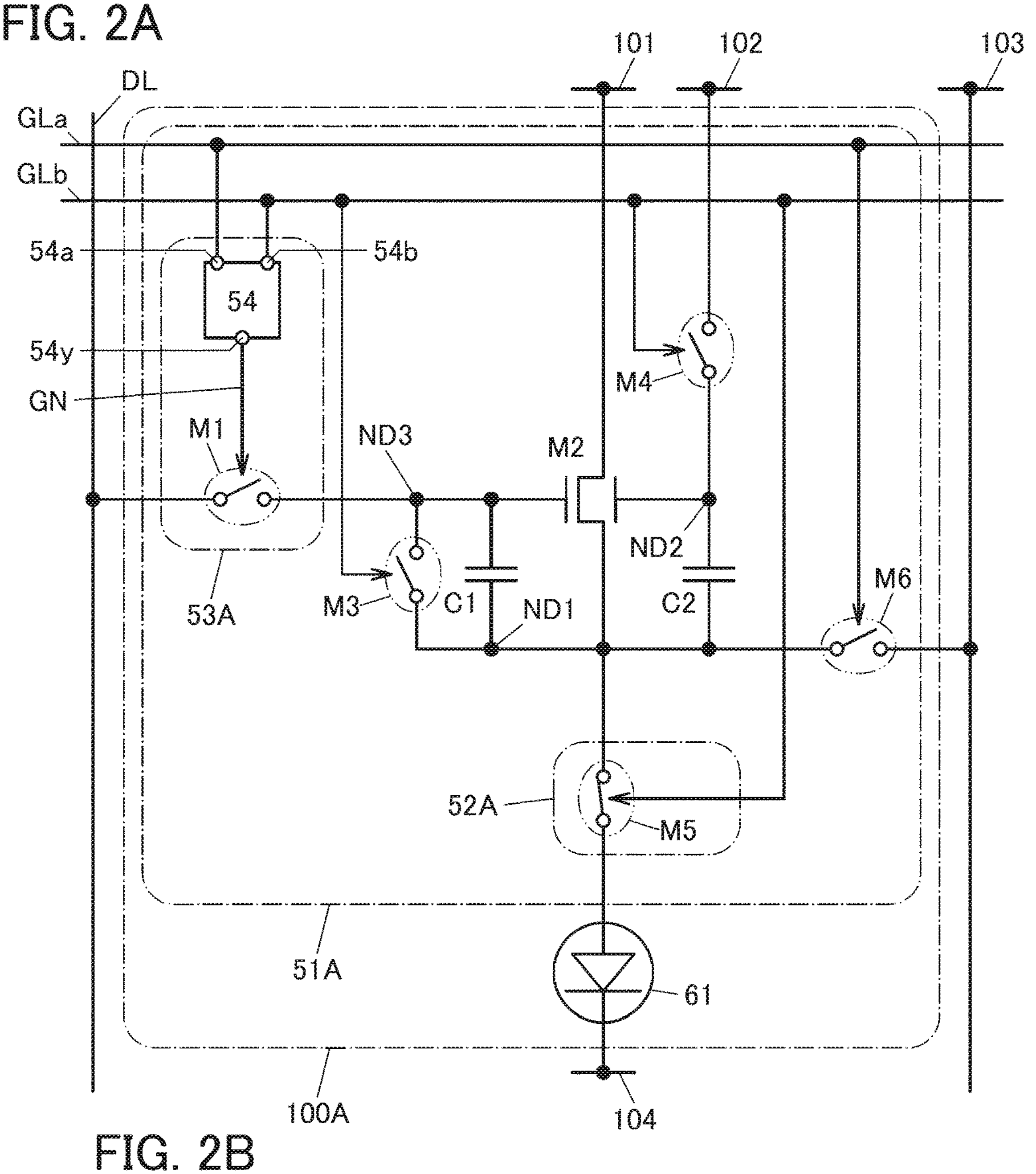
FIG. 2A and FIG. 2B are diagrams illustrating an example of a semiconductor device.
Figure 2B:
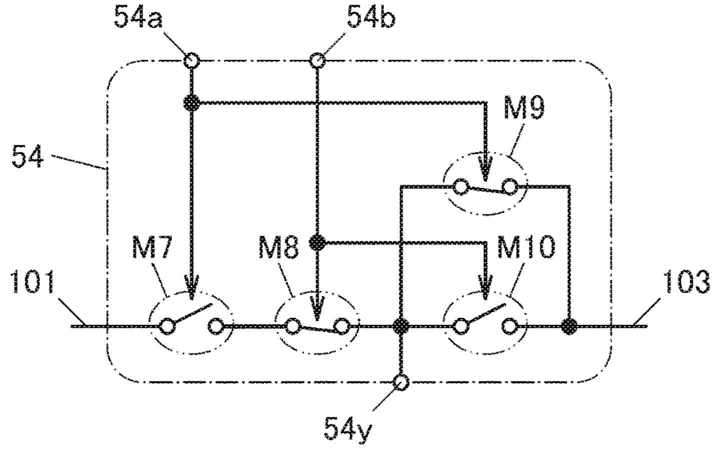

Among the transistors included in the pixel circuit 51A, the transistor M1, the transistor M3 to the transistor M6 function as switches. The transistor M7 to the transistor M10 included in the logic circuit 54 function as switches. For example, an n-channel transistor functions as a switch of the A contact, and a p-channel transistor functions as a switch of the B contact. Hence, the semiconductor device 100A can be illustrated as in FIG. 2A. The logic circuit 54 can be illustrated as in FIG. 2B.

Some or all of the transistors included in the pixel circuit 51A may each be a transistor having a back gate. When the transistor is provided with a back gate, a channel formation region is less likely to be affected by an electric field generated outside. Accordingly, operation of the semiconductor device can be stabilized and the reliability of the semiconductor device can be increased. Furthermore, when the gate and the back gate are supplied with the same potential, the on-state resistance can be reduced. When the potentials of the back gate and the gate of the transistor are controlled independently of each other, the threshold voltage of the transistor can be changed.

Figure 3A:
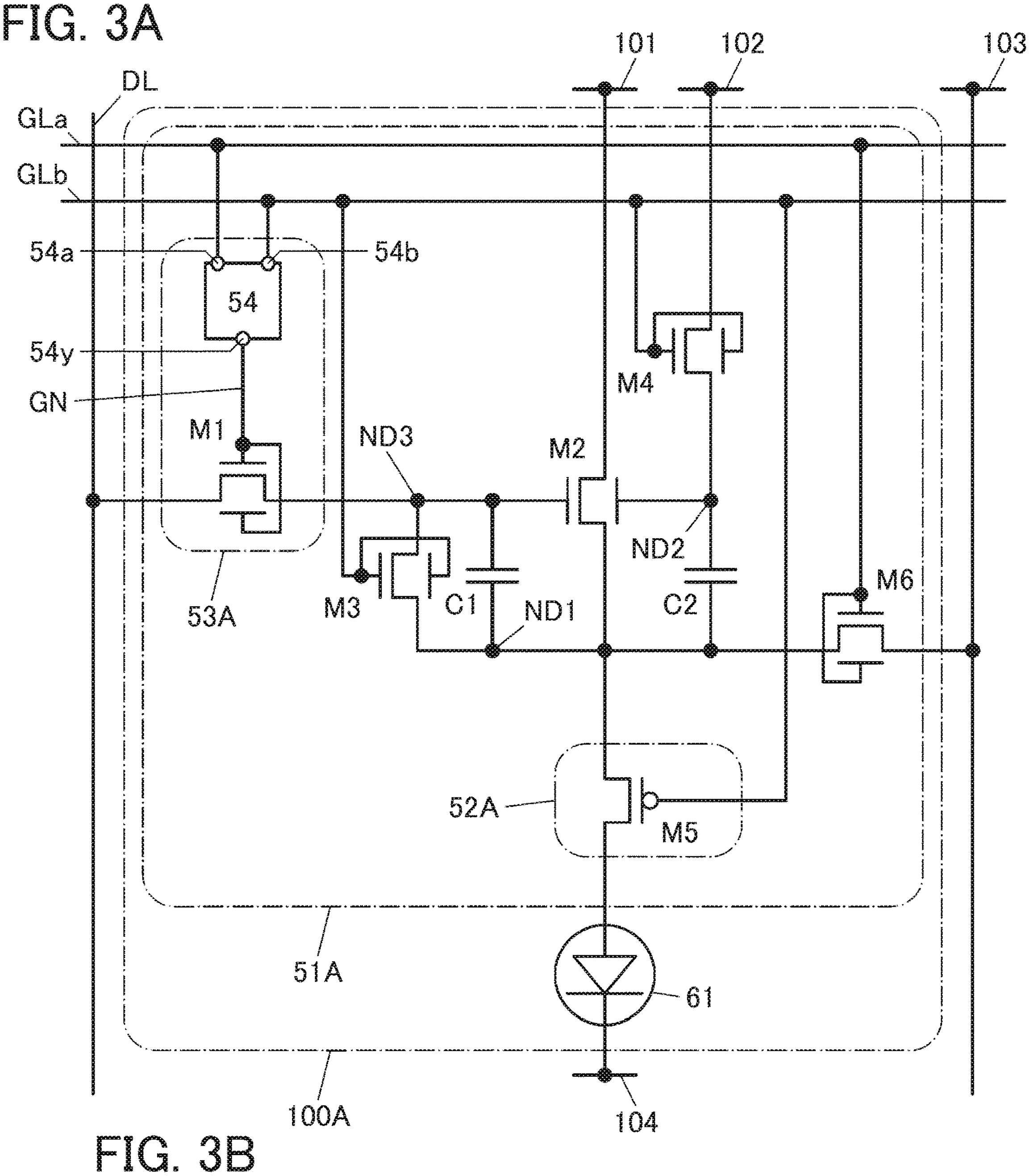
FIG. 3A and FIG. 3B are diagrams illustrating an example of a semiconductor device.
Figure 3B:
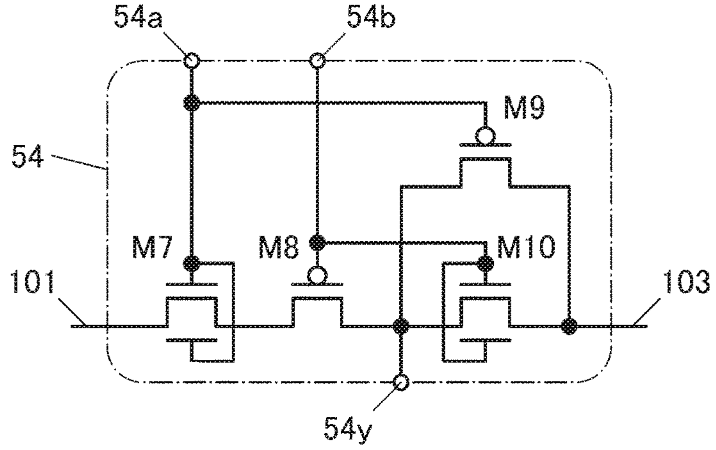

FIG. 3A illustrates a circuit structure example of the semiconductor device 100A in which a transistor having a back gate is used not only as the transistor M2 but also as each of the transistor M1 and the transistor M3, the transistor M4, and the transistor M6. FIG. 3B illustrates a circuit structure example of the logic circuit 54 in which a transistor having a back gate is used as the transistor M7 and the transistor M10. FIG. 3A and FIG. 3B illustrate an example in which the gate and the back gate are electrically connected to each other in each of the transistor M1, the transistor M3, the transistor M4, the transistor M6, the transistor M7, and the transistor M10. Note that not all the transistors included in the semiconductor device necessarily have back gates.

It is not necessary to electrically connect the gate and the back gate, and a given potential may be supplied to the back gate. Note that the potential supplied to the back gate is not limited to a fixed potential. The potentials supplied to the back gates of the transistors included in the semiconductor device may be different from one another or may be the same.

Figure 4A:
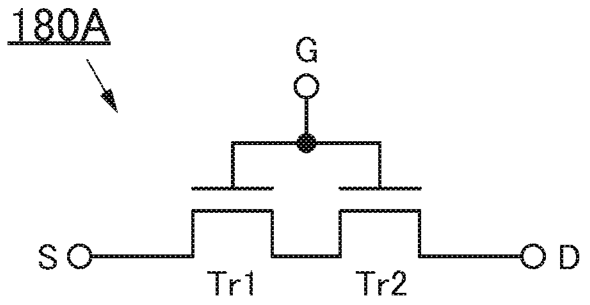
FIG. 4A to FIG. 4C are diagrams illustrating circuit symbols of transistors.

The transistors included in the pixel circuit 51A may each be a single-gate transistor having one gate between a source and a drain, or a double-gate transistor. FIG. 4A illustrates a circuit symbol example of a double-gate transistor 180A.

The transistor 180A has a structure in which a transistor Tr1 and a transistor Tr2 are connected in series. In the transistor 180A illustrated in FIG. 4A, one of a source and a drain of the transistor Tr1 is electrically connected to a terminal S. The other of the source and the drain of the transistor Tr1 is electrically connected to one of a source and a drain of the transistor Tr2. The other of the source and the drain of the transistor Tr2 is electrically connected to a terminal D. In the transistor 180A illustrated in FIG. 4A, gates of the transistor Tr1 and the transistor Tr2 are electrically connected to each other and electrically connected to a terminal G.

The transistor 180A illustrated in FIG. 4A has a function of switching electrical continuity and discontinuity between the terminal S and the terminal D by changing a potential of the terminal G. Thus, the transistor 180A that is a double-gate transistor functions as one transistor including the transistor Tr1 and the transistor Tr2. That is, it can be said that in FIG. 4A, one of a source and a drain of the transistor 180A is electrically connected to the terminal S, the other of the source and the drain of the transistor 180A is electrically connected to the terminal D, and a gate of the transistor 180A is electrically connected to the terminal G.

Figure 4B:
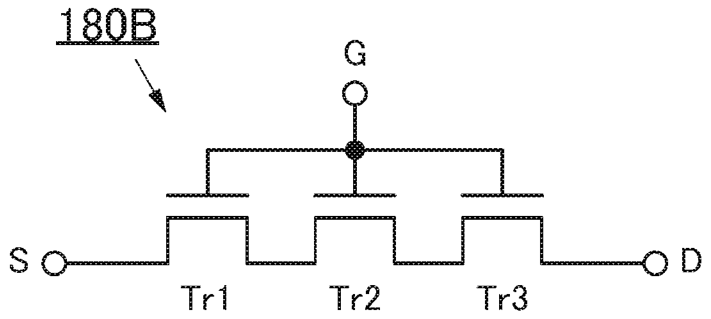

The transistors included in the pixel circuit 51A may each be a triple-gate transistor. FIG. 4B illustrates a circuit symbol example of a triple-gate transistor 180B.

The transistor 180B has a structure in which the transistor Tr1, the transistor Tr2, and a transistor Tr3 are connected in series. In the transistor 180B illustrated in FIG. 4B, the one of the source and the drain of the transistor Tr1 is electrically connected to the terminal S. The other of the source and the drain of the transistor Tr1 is electrically connected to the one of the source and the drain of the transistor Tr2. The other of the source and the drain of the transistor Tr2 is electrically connected to one of a source and a drain of the transistor Tr3. The other of the source and the drain of the transistor Tr3 is electrically connected to the terminal D. In the transistor 180B illustrated in FIG. 4B, the gates of the transistor Tr1, the transistor Tr2, and the transistor Tr3 are electrically connected to each other and electrically connected to the terminal G.

The transistor 180B illustrated in FIG. 4B has a function of switching electrical continuity and discontinuity between the terminal S and the terminal D by changing the potential of the terminal G. Thus, the transistor 180B that is a triple-gate transistor functions as one transistor including the transistor Tr1, the transistor Tr2, and the transistor Tr3. That is, it can be said that in FIG. 4B, one of a source and a drain of the transistor 180B is electrically connected to the terminal S, the other of the source and the drain of the transistor 180B is electrically connected to the terminal D, and a gate of the transistor 180B is electrically connected to the terminal G.

The transistors included in the pixel circuit 51A may each have a structure in which four or more transistors are connected in series. A transistor 180C illustrated in FIG. 4C has a structure in which six transistors (the transistor Tr1 to a transistor Tr6) are connected in series. In the transistor 180C illustrated in FIG. 4C, the gates of the six transistors are electrically connected to each other and are electrically connected to the terminal G.

Figure 4C:
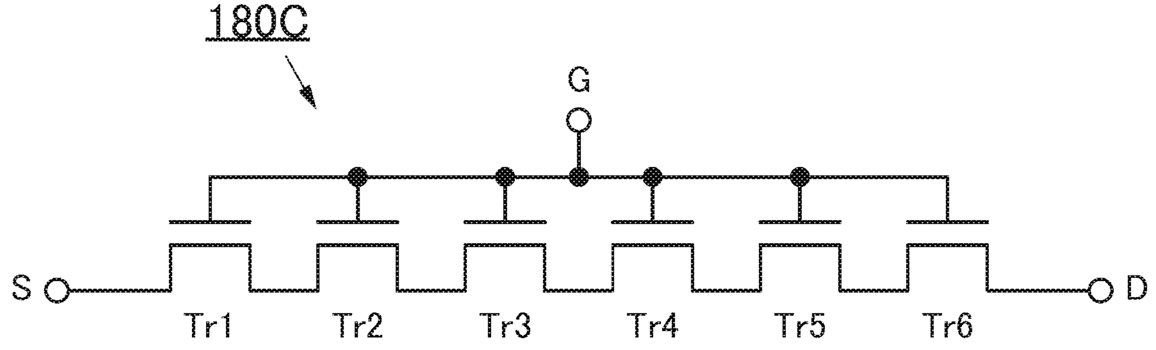

The transistor 180C illustrated in FIG. 4C has a function of switching electrical continuity and discontinuity between the terminal S and the terminal D by changing the potential of the terminal G. Thus, the transistor 180C functions as one transistor including the transistor Tr1 to the transistor Tr6. That is, it can be said that in FIG. 4C, one of a source and a drain of the transistor 180C is electrically connected to the terminal S, the other of the source and the drain of the transistor 180C is electrically connected to the terminal D, and a gate of the transistor 180C is electrically connected to the terminal G.

Like the transistor 180A, the transistor 180B, and the transistor 180C, a transistor having a plurality of gates electrically connected to each other is referred to as a "multi-gate type transistor" or a "multi-gate transistor" in some cases.

In the case where a transistor operates in a saturation region, for example, the channel length of the transistor is sometimes lengthened so that its electrical characteristics in the saturation region can be improved. A multi-gate transistor may be used to achieve a transistor having a long channel length.

Operation Example

Figure 5:
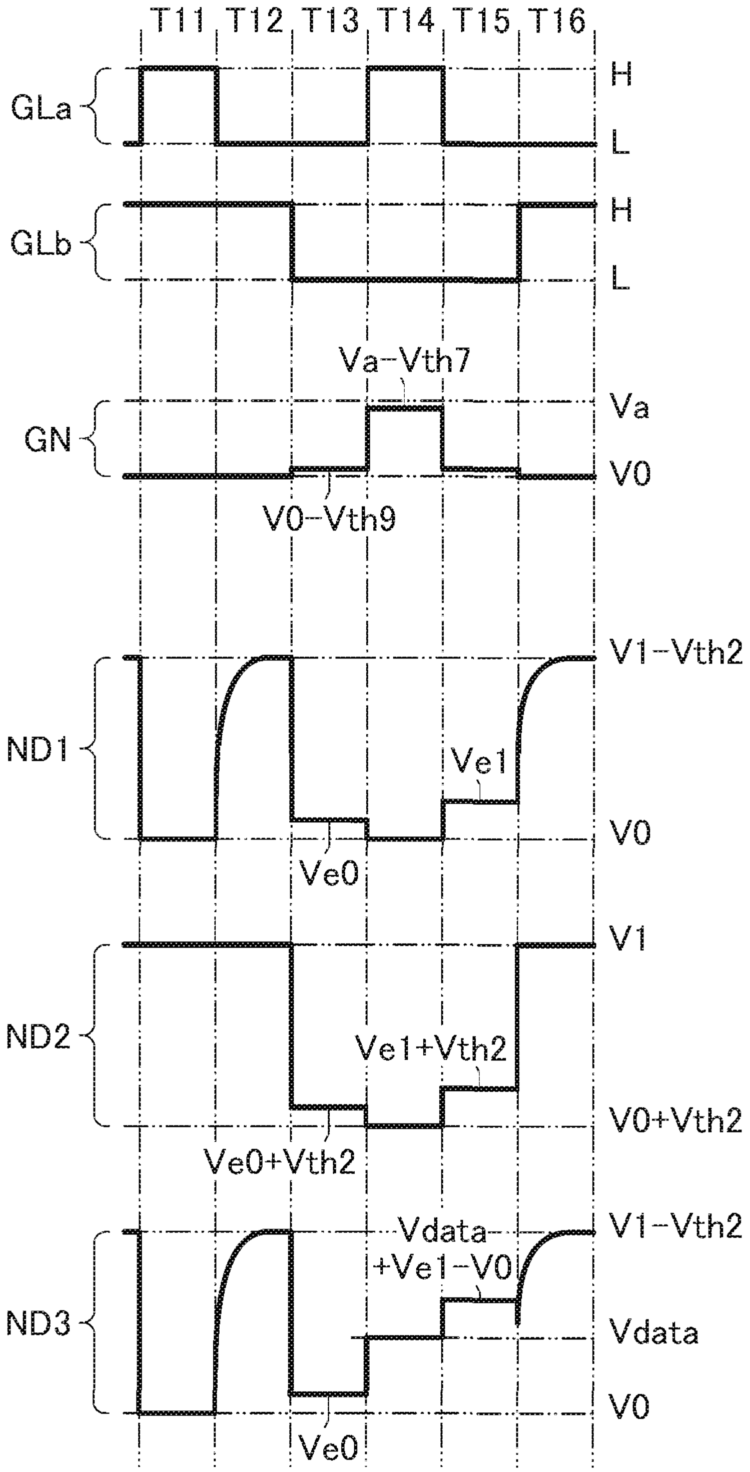
FIG. 5 is a timing chart showing an operation example of a semiconductor device.

Next, an operation example of the semiconductor device 100A will be described with reference to drawings. FIG. 5 is a timing chart showing the operation example of the semiconductor device 100A. FIG. 6 to FIG. 11 are circuit diagrams illustrating the operation example of the semiconductor device 100A.

A video signal Vdata is supplied to the wiring DL. A potential Va is supplied to the wiring 101, a potential V1 is supplied to the wiring 102, a potential V0 is supplied to the wiring 103, and a potential Vc is supplied to the wiring 104. A potential H or a potential L is supplied to each of the wiring GLa or the wiring GLb. The potential H is preferably a potential higher than the potential L. In this specification and the like, the "potential H" is a potential which brings an n-channel transistor into an on state when being supplied to a gate of the transistor and brings a p-channel transistor into an off state when being supplied to a gate of the transistor. Furthermore, the "potential L" is a potential which brings an n-channel transistor into an off state when being supplied to a gate of the transistor and brings a p-channel transistor into an on state when being supplied to a gate of the transistor.

The potential Va is an anode potential and the potential Vc is a cathode potential. The potential V1 is preferably a potential higher than the potential V0. For example, the potential V1 may be a potential which brings the transistor M2 into an on state when being supplied to the back gate of the transistor. Furthermore, the potential V0 may be a potential which brings the transistor M2 into an off state when being supplied to the gate of the transistor. For example, the potential V0 can be 0 V or the potential L. The potential H is preferably a potential higher than the potential V1, and for example, can be the potential Va. In this embodiment or the like, the potential V0 is 0 V and the potential V1 is 5 V. The potential Va is 15 V and the potential Vc is 0 V. The potential L and the potential V0 are the same potential (0 V) and the potential H and the potential Va are the same potential (15 V). The video signal Vdata is within the range from 2 V to 5 V.

Note that in the drawings, a symbol showing a potential (also referred to as a "potential symbol") such as "H", "L", "V0", or "V1" is sometimes illustrated adjacent to a terminal, a wiring, or the like, for example. For easy understanding of changes in potentials of terminals, wirings, or the like, a potential symbol of a terminal, a wiring, or the like whose potential has changed is sometimes enclosed. Furthermore, a symbol "x" sometimes overlaps with an off-state transistor.

In this specification and the like, a series of operations in which a transistor is brought into a conduction or non-conduction state and charge is supplied to a node that is electrically connected to the transistor to change the potential of the node is referred to as "processing" in some cases.

Figure 10A:
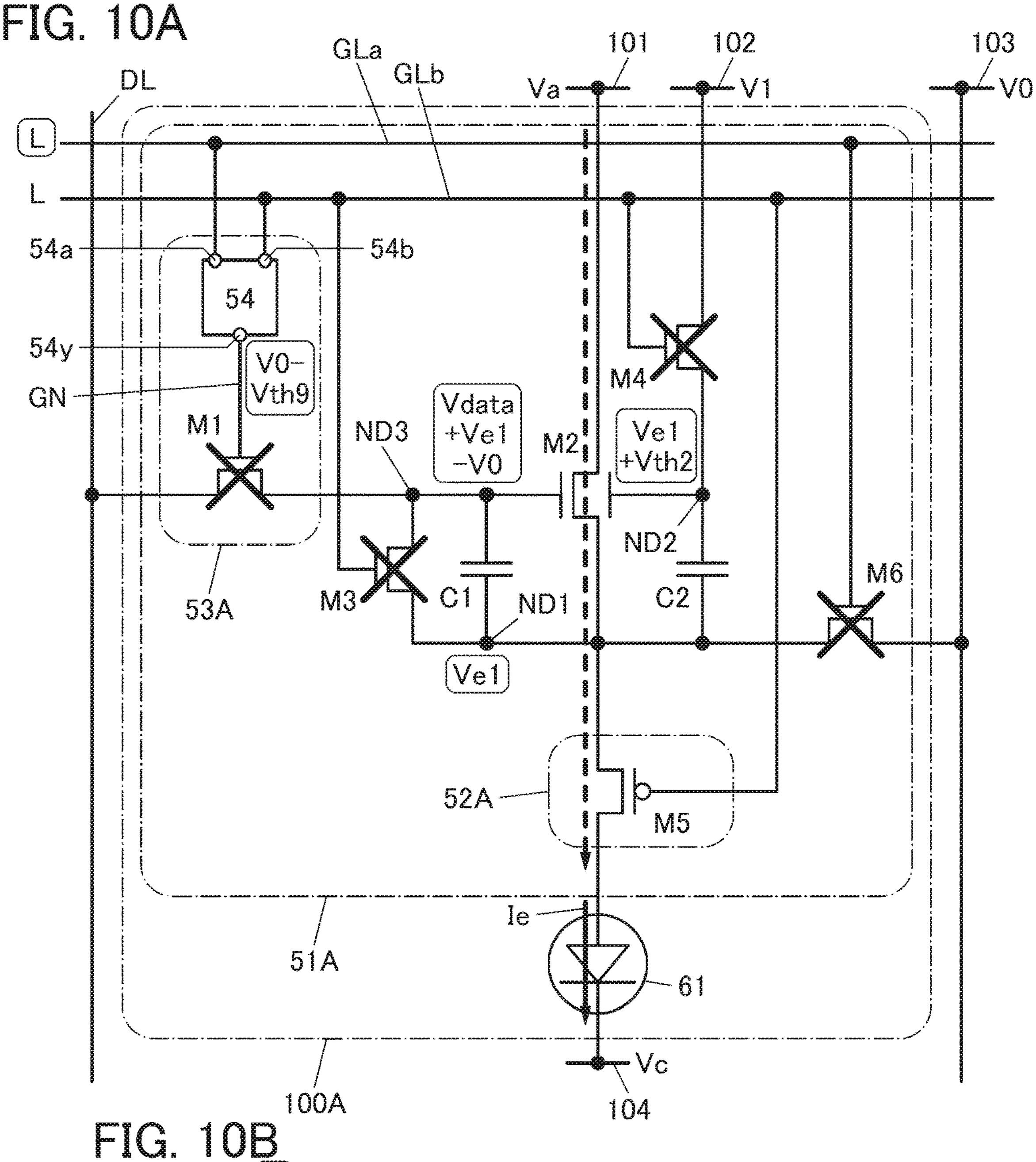
FIG. 10A and FIG. 10B are diagrams illustrating an operation example of a semiconductor device.
Figure 10B:
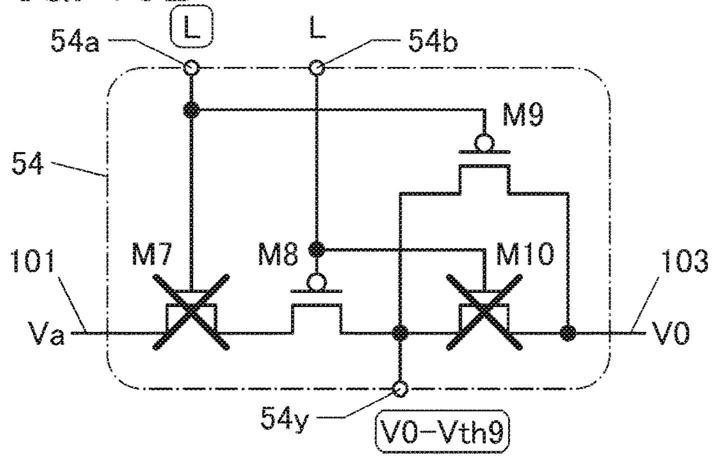

The emission intensity of the light-emitting element 61 included in the semiconductor device 100A is controlled by the amount of current Ie flowing through the light-emitting element 61 (see FIG. 10A). The pixel circuit 51A has a function of controlling the amount of the current Ie in accordance with the video signal Vdata supplied from the wiring DL.

The current Ie flowing through the light-emitting element 61 is determined mainly by the video signal Vdata and Vth of the transistor M2. Thus, even when the same video signal Vdata is supplied to a plurality of pixel circuits, Vth variation between the transistors M2 included in the pixel circuits makes the current Ie different between the pixels. Accordingly, the Vth variation between the transistors M2 is a factor in reducing display quality.

In view of this, Vth of the transistor M2 in each pixel is obtained and a variation in the current Ie can be reduced. Note that an operation of obtaining Vth of the transistor M2 is sometimes referred to as a "Vth correction operation".

[Vth Correction Operation]

First, in Period T11, a reset operation is performed. Specifically, the potential H is supplied to the wiring GLa and the wiring GLb (see FIG. 6A). This brings the transistor M3, the transistor M4, and the transistor M6 into an on state and the transistor M5 into an off state.

Figure 6A:
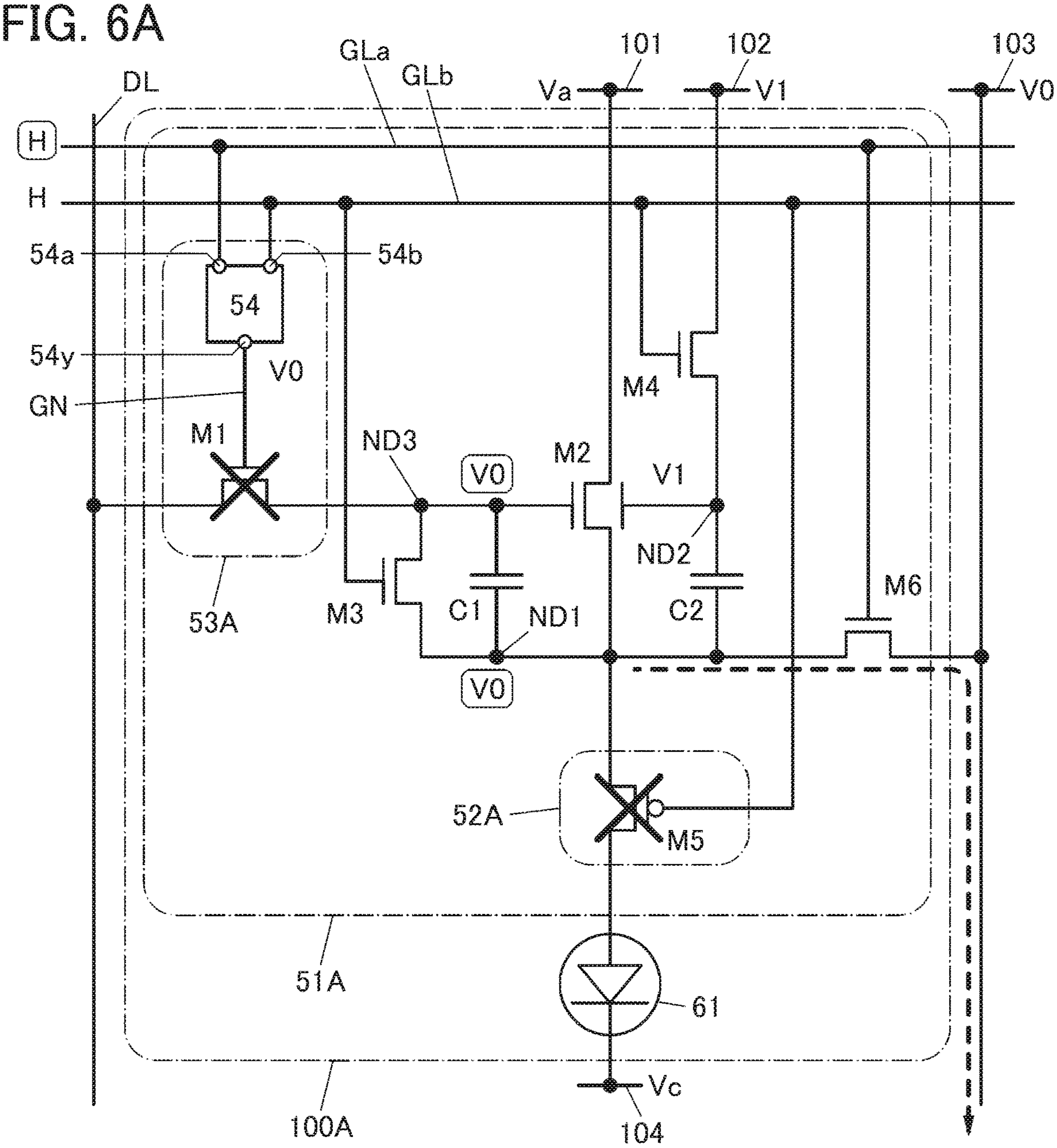
FIG. 6A and FIG. 6B are diagrams illustrating an operation example of a semiconductor device.
Figure 6B:
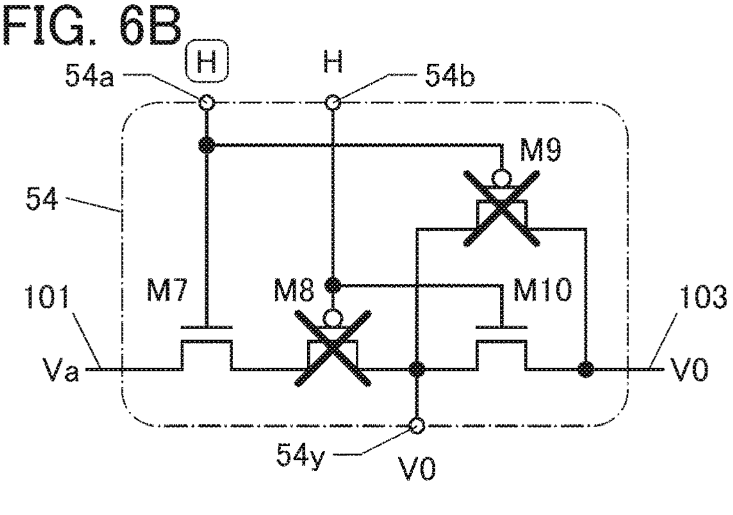

In the logic circuit 54, the potential H is supplied to the input terminal 54*a* and the input terminal 54*b* (see FIG. 6B). This brings the transistor M7 and the transistor M10 into an on state and the transistor M8 and the transistor M9 into an off state. Thus, a potential supplied from the output terminal 54*y* to the node GN is the potential V0. In this embodiment and the like, since the potential V0 and the potential L are the same potential, the transistor M1 is brought into an off state.

The potential V0 is supplied to the node ND1 through the transistor M6. Furthermore, the potential V0 is supplied to the node ND3 through the transistor M6 and the transistor M3. The potential V1 is supplied to the node ND2 through the transistor M4.

Figure 7A:
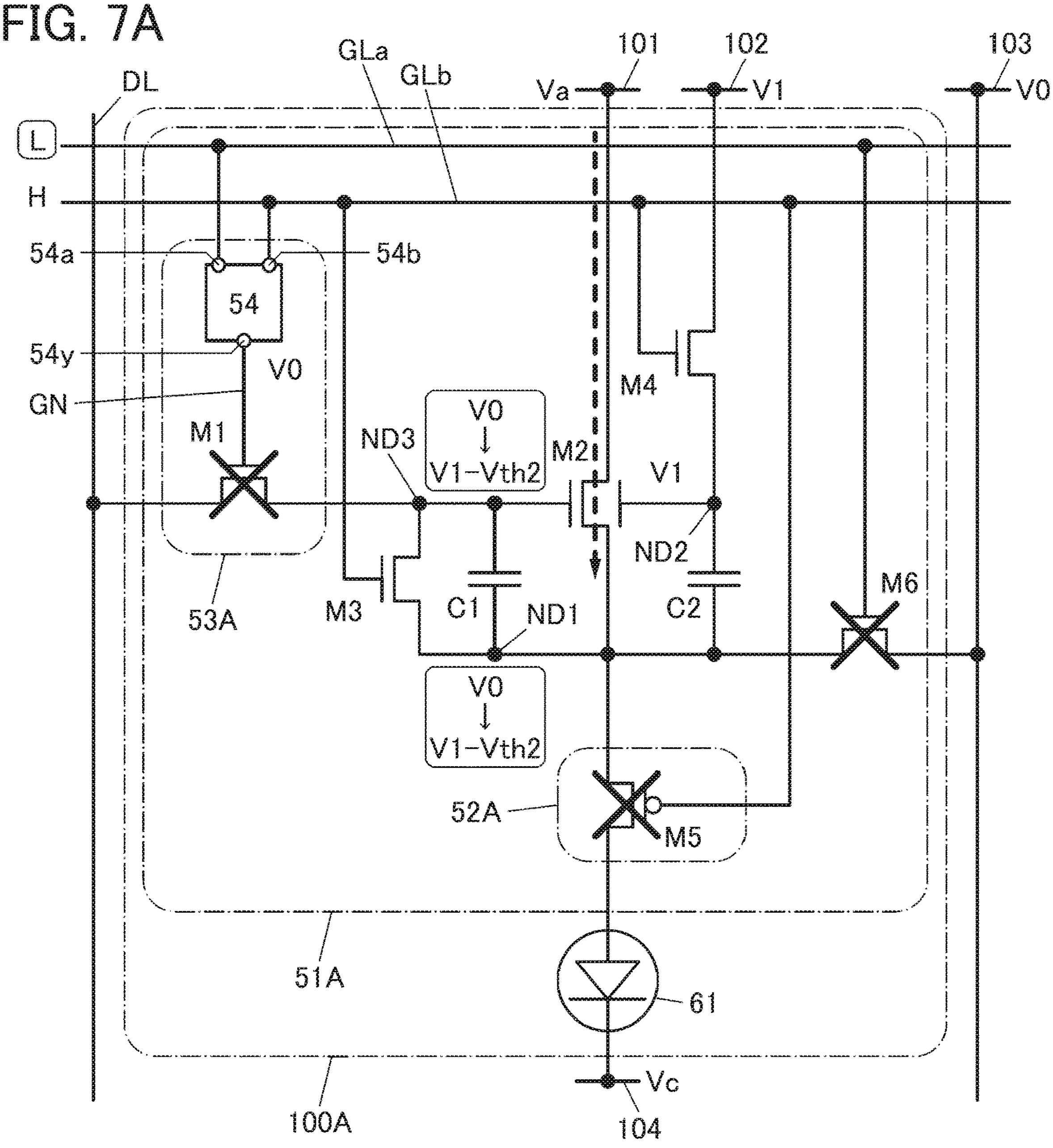
FIG. 7A and FIG. 7B are diagrams illustrating an operation example of a semiconductor device.

Next, in Period T12, the potential L is supplied to the wiring GLa (see FIG. 7A). A potential of the wiring GLb remains the potential H. This brings the transistor M6 into an off state.

Figure 7B:
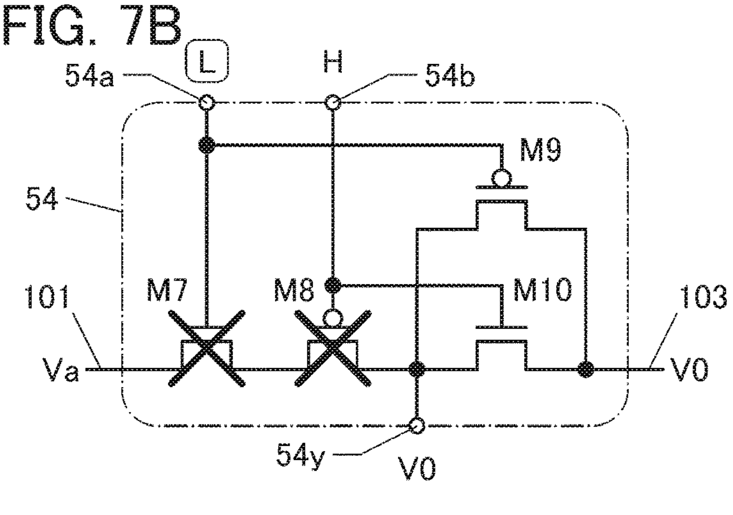

In the logic circuit 54, the potential L is supplied to the input terminal 54*a* and the potential H is supplied to the input terminal 54*b* (see FIG. 7B). This brings transistor M9 and the transistor M10 into an on state and the transistor M7 and the transistor M8 into an off state. Thus, the potential supplied from the output terminal 54*y* to the node GN is the potential V0, and the transistor M1 remains in an off state.

Since the potential of the node ND2 is the potential V1, the transistor M2 is in an on state. Thus, charge is supplied from the wiring 101 to the node ND1 through the transistor M2 and the potential of the node ND1 gradually increases. Since the transistor M3 is also in an on state, the potential of the node ND3 also increases. Specifically, the potentials of the node ND1 and the node ND3 each increase to a value obtained by subtracting Vth of the transistor M2 from the potential V1 (potential V1−Vth2). In other words, Vth2 is applied between the back gate of the transistor M2 and the source of the transistor M2.

Figure 8A:
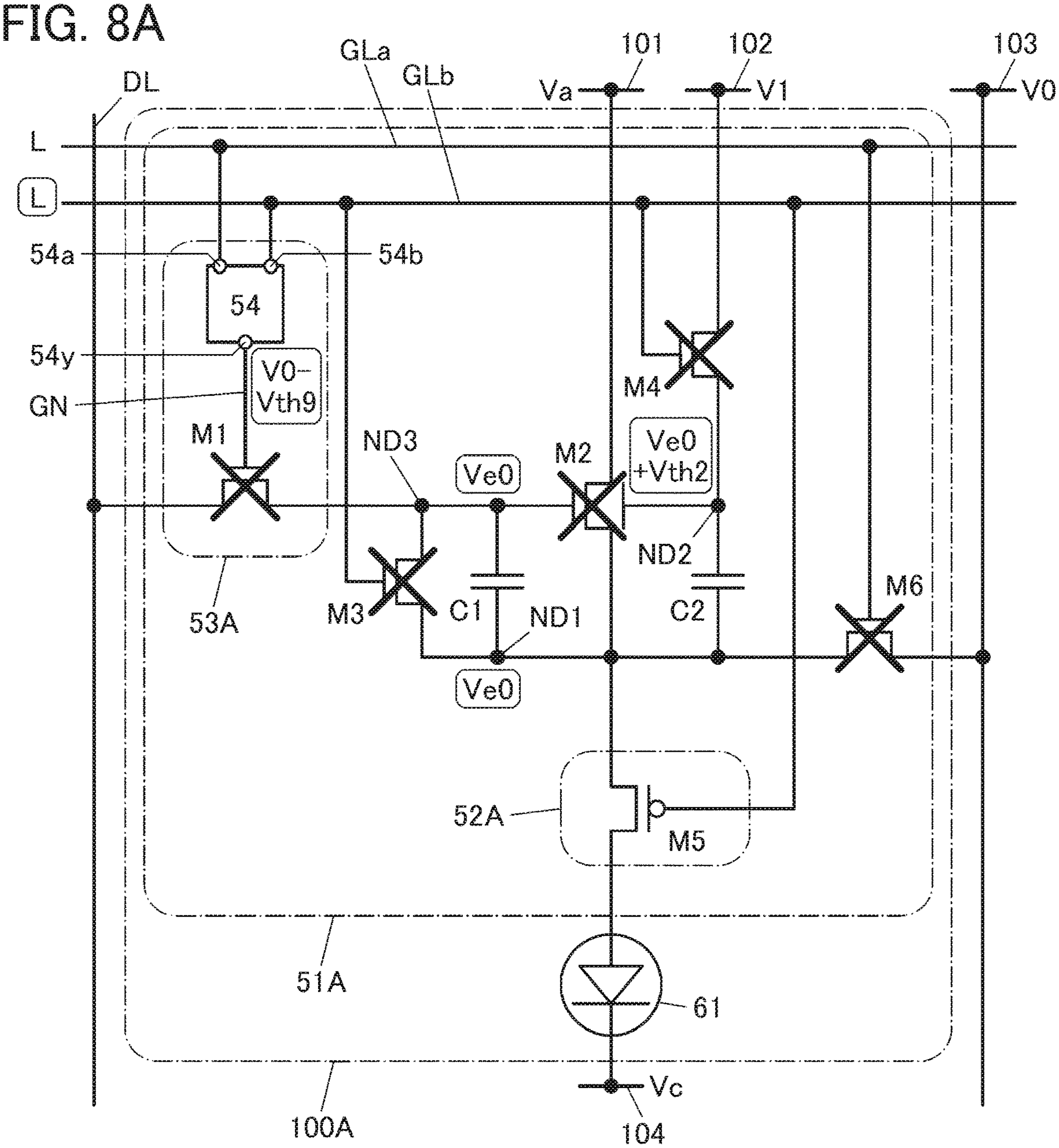
FIG. 8A and FIG. 8B are diagrams illustrating an operation example of a semiconductor device.

Next, in Period T13, the potential L is supplied to the wiring GLb (see FIG. 8A). The potential of the wiring GLa remains the potential L. This brings the transistor M3 and the transistor M4 into an off state and the transistor M5 into an on state.

Figure 8B:
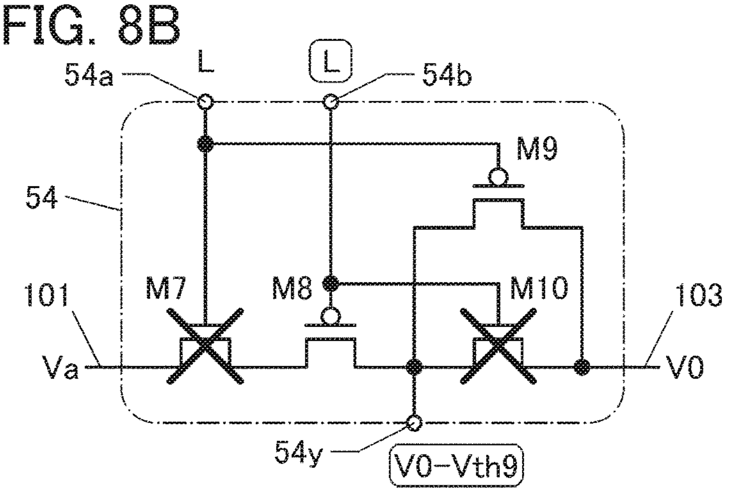

In the logic circuit 54, the potential L is supplied to the input terminal 54*a* and the input terminal 54*b* (see FIG. 8B). This brings the transistor M8 and the transistor M9 into an on state and the transistor M7 and the transistor M10 into an off state. Thus, the potential supplied from the output terminal 54*y* to the node GN is the potential V0−Vth9. In this embodiment and the like, the potential V0 is 0 V, and the video signal Vdata is within the range from 2 V to 5 V. Thus, for example, when Vth9 is −1 V, the potential of the node GN is 1 V and the transistor M1 remains in an off state.

Thus, the potential of the node ND1 becomes a potential Ve0. The potential Ve0 is higher than the potential Vc by a voltage drop in the light-emitting element 61. The node ND2 and the node ND3 are brought into a floating state, and charge supplied to the nodes are retained. Thus, the potential of the node ND2 becomes the potential Ve0+Vth2, and the potential of the node ND3 becomes the potential Ve0. Thus, the state in which Vth2 is applied between the back gate of the transistor M2 and the source of the transistor M2 is maintained.

[Data Writing Operation]

Figure 9A:
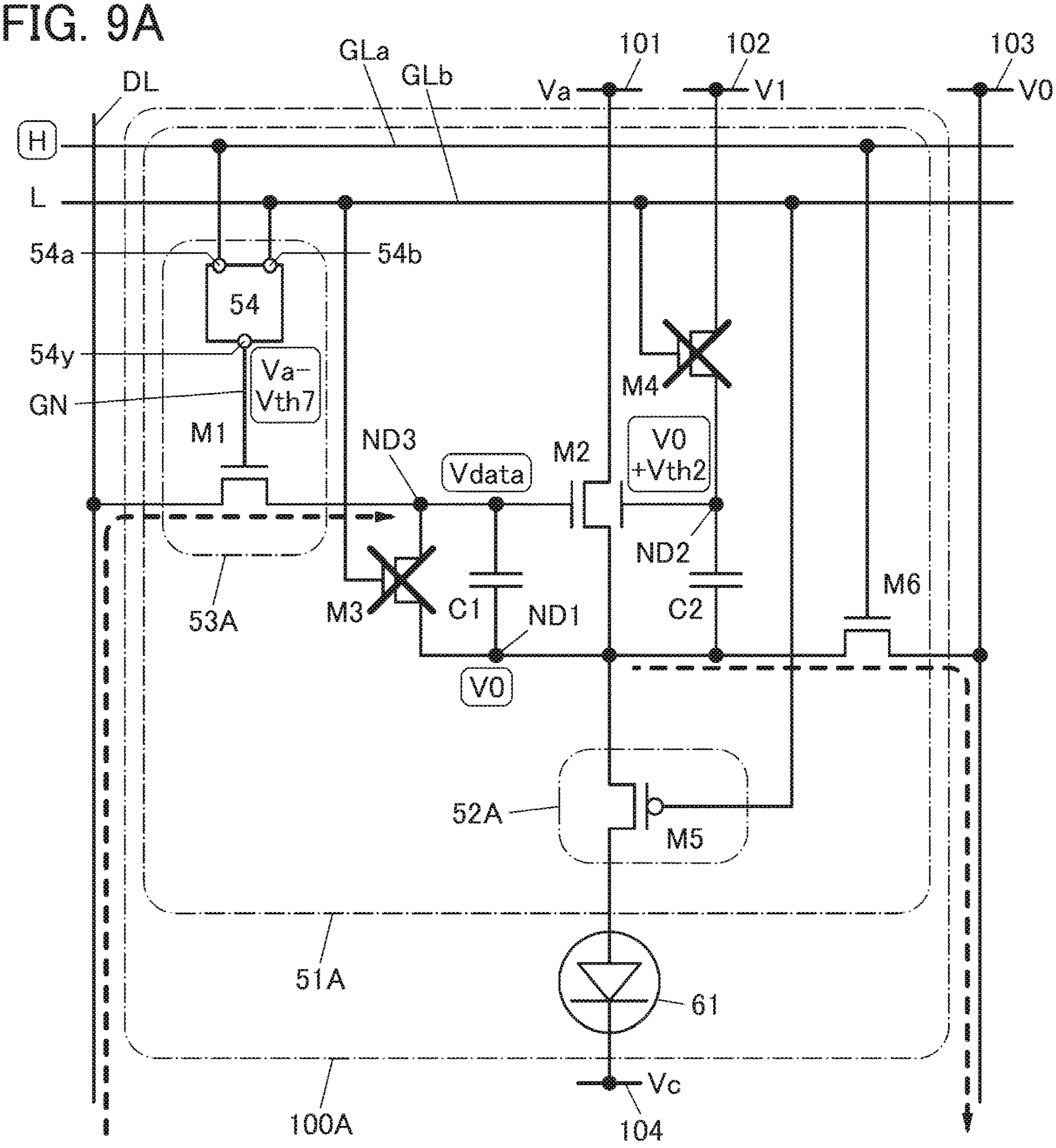
FIG. 9A and FIG. 9B are diagrams illustrating an operation example of a semiconductor device.

In Period T14, the potential H is supplied to the wiring GLa (see FIG. 9A). The potential of the wiring GLb remains the potential L. This brings the transistor M6 into an on state.

Figure 9B:
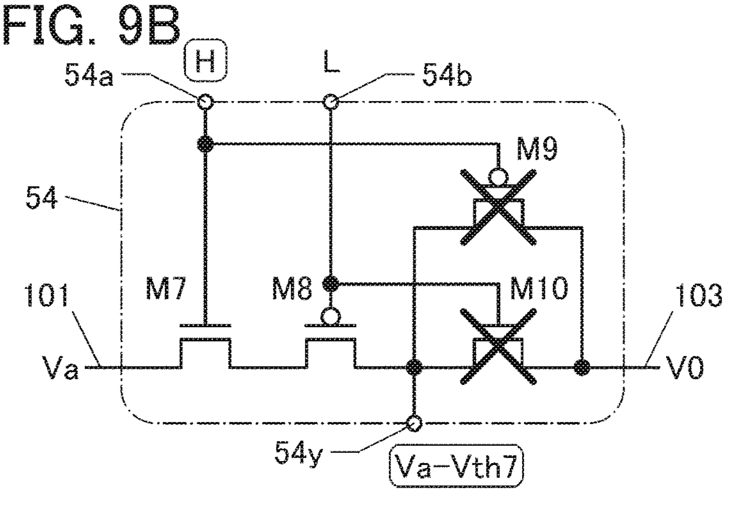

In the logic circuit 54, the potential H is supplied to the input terminal 54*a* and the potential L is supplied to the input terminal 54*b* (see FIG. 9B). This brings the transistor M7 and the transistor M8 into an on state and the transistor M9 and the transistor M10 into an off state. Thus, the potential supplied from the output terminal 54*y* to the node GN is the potential Va−Vth7. In this embodiment and the like, the potential Va is 15 V, and the video signal Vdata is within the range from 2 V to 5 V. Thus, for example, when Vth7 is 1 V, the potential of the node GN is 14 V and the transistor M1 is brought into an on state.

Thus, the video signal Vdata is supplied to the node ND3, and the potential V0 is supplied to the node ND1. Note that since the potential V0 is 0 Vin this embodiment and the like, the potential of the node ND1 is 0 V. Thus, the video signal Vdata is applied between the gate of the transistor M2 and the source of the transistor M2.

The node ND1 and the node ND2 are capacitively coupled through the capacitor C2; thus, when the potential of the node ND1 changes from Ve0 to V0, the potential of the node ND2 also changes from Ve0+Vth2 to V0+Vth2 in a similar manner. Note that since the potential V0 is 0 V in this embodiment and the like, the potential of the node ND1 is 0 V and the potential of the node ND2 is Vth2. Thus, the state in which Vth2 is applied between the back gate of the transistor M2 and the source of the transistor M2 is maintained.

[Light-Emitting Operation]

In Period T15, the potential L is supplied to the wiring GLa (see FIG. 10A). The potential of the wiring GLb remains the potential L. This brings the transistor M6 into an off state.

In the logic circuit 54, the potential L is supplied to the input terminal 54*a* and the input terminal 54*b* (see FIG.

10B). Thus, as in Period T13, the potential of the node GN is 1 V and the transistor M1 is brought into an off state.

Thus, current flows from the wiring 101 to the wiring 104. That is, the current Ie flows through the light-emitting element 61, and the light-emitting element 61 emits light with luminance corresponding to the current Ie. When current flows from the wiring 101 to the wiring 104, the potential of the node ND1 increases from the potential V0 to the potential Ve1 owing to the voltage drop of the light-emitting element 61.

The node ND3 is in a floating state, and the node ND1 and the node ND3 are capacitively coupled through the capacitor C1. Thus, the potential of the node ND3 changes from the video signal Vdata to the video signal Vdata+the potential Ve1−the potential V0 in accordance with a change in the potential of the node ND1. Note that since the potential V0 is 0 V in this embodiment and the like, the potential of the node ND3 is the video signal Vdata+potential Ve1. A potential difference (voltage) between the gate of the transistor M2 and the source of the transistor M2 is maintained at the video signal Vdata.

Similarly, the node ND2 is in a floating state, and the node ND1 and the node ND2 are capacitively coupled through the capacitor C2. Thus, the potential of the node ND2 changes from V0+Vth2 to Ve1+Vth2 in accordance with a change in the potential of the node ND1. Thus, a potential difference (voltage) between the back gate of the transistor M2 and the source of the transistor M2 is maintained at Vth2.

As described above, the amount of the current Ie flowing through the light-emitting element 61 is determined by the video signal Vdata and Vth of the transistor M2. When the Vth correction operation is performed in the semiconductor device 100A of one embodiment of the present invention, the amount of the current Ie flowing through the light-emitting element 61 can be controlled by the video signal Vdata.

[Quenching Operation]

Figure 11A:
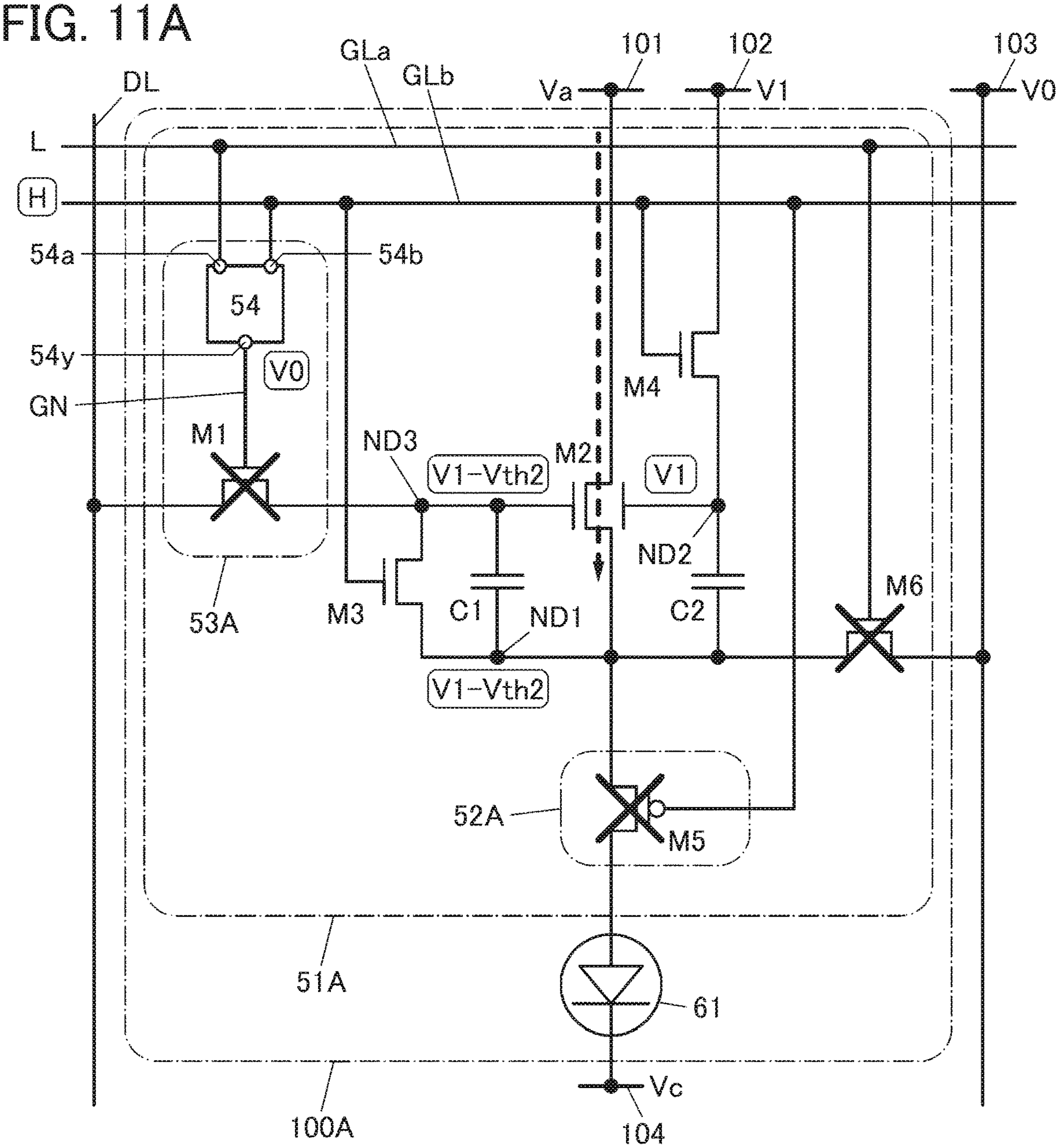
FIG. 11A and FIG. 11B are diagrams illustrating an operation example of a semiconductor device.

Next, in Period T16, the potential H is supplied to the wiring GLb (see FIG. 11A). The potential of the wiring GLa remains the potential L. This brings the transistor M3 and the transistor M4 into an on state and the transistor M5 into an off state.

Figure 11B:
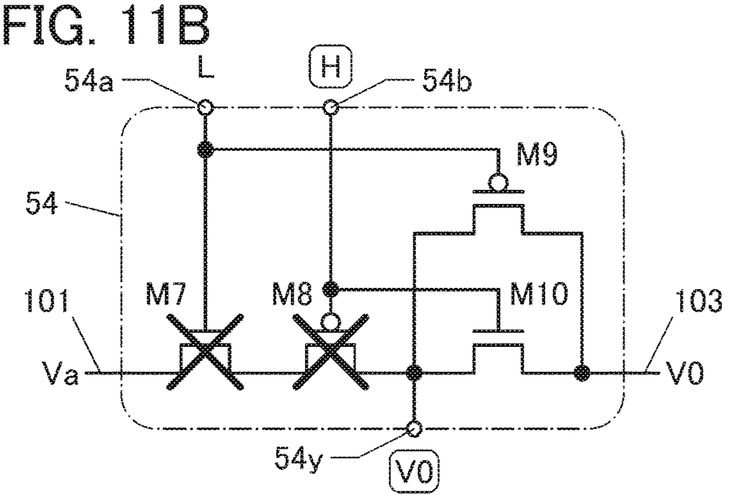

In the logic circuit 54, the potential L is supplied to the input terminal 54*a* and the potential H is supplied to the input terminal 54*b* (see FIG. 11B). Thus, as in Period T12, the potential of the node GN is 0 V and the transistor M1 remains in an off state.

When the transistor M5 is brought into an off state, current stops flowing through the light-emitting element 61; thus, light emission from the light-emitting element 61 is stopped (quenching).

In a display apparatus using a light-emitting element such as an EL element, for example, as a display element, the light-emitting element can continuously emit light during one frame period. Such a driving method is also referred to as a "hold type" or "hold-type driving". When the hold-type driving is used as a driving method of a display apparatus, a flicker phenomenon or the like on a display screen can be reduced, for example. However, the hold-type driving is likely to cause, for example, an afterimage, an image blur, and the like in moving image display. The resolution that is perceived by a person in displaying moving images is also referred to as "moving image resolution". That is, the hold-type driving is likely to decrease the moving image resolution.

In addition, "black insertion driving" is known as a technique that reduces, for example, an afterimage, an image blur, and the like in moving image display. The "black insertion driving" is also referred to as a "pseudo impulsive type" or "pseudo impulsive driving". The black insertion driving refers to a driving method in which black display is performed in every other frame or a driving method in which black display is performed for a certain period in one frame.

The semiconductor device 100A of one embodiment of the present invention easily achieves the black insertion driving by the quenching operation. A display apparatus using the semiconductor device 100A of one embodiment of the present invention can achieve high-quality moving image display whose moving image resolution is unlikely to decrease.

Note that in Period T16, the transistor M3 and the transistor M4 are in an on state, and the behavior of the node ND1 to the node ND3 are the same as those in the above-described Period T12. Thus, Vth correction operation may be performed concurrently with the quenching operation. For example, in the case of performing the black insertion driving, Vth correction can be performed in a period during which black display is performed in one frame (a period during which a quenching operation is performed). Therefore, a period where Vth correction operation is performed is not necessarily provided separately. Thus, the execution frequency of the data writing operation can be increased. Thus, the display quality of the display apparatus can be improved.

Modification Example

Figure 12A:
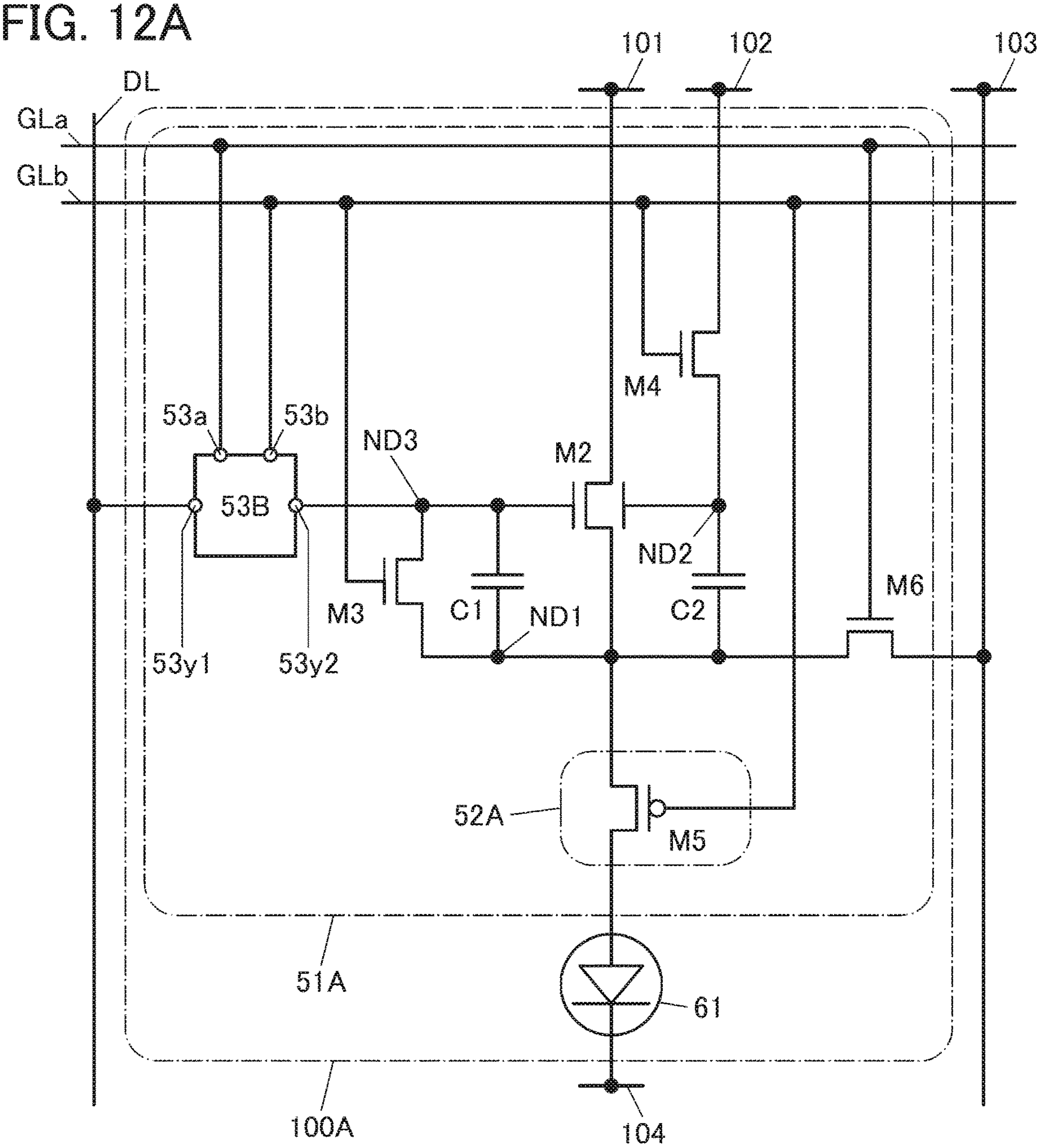
FIG. 12A and FIG. 12B are diagrams illustrating an example of a semiconductor device.

The semiconductor device 100A of one embodiment of the present invention is not limited to the circuit structure illustrated in FIG. 1A. The circuit 53A illustrated in FIG. 1A can be regarded as a circuit having a function of establishing or breaking electrical continuity between the wiring DL and the node ND3 on the basis of the result of a logic operation of the signal supplied to the wiring GLa and the signal supplied to the wiring GLb. Hence, the semiconductor device 100A can be illustrated as in FIG. 12A. FIG. 12A is different from FIG. 1A in that the circuit 53A is replaced with the circuit 53B.

The circuit 53B includes a terminal 53*a*, a terminal 53*b*, a terminal 53*y*1, and a terminal 53*y*2. The terminal 53*a* is electrically connected to the wiring GLa, and the terminal 53*b* is electrically connected to the wiring GLb. The terminal 53*y*1 is electrically connected to the wiring DL, and the terminal 53*y*2 is electrically connected to the node ND3. The circuit 53B has a function of establishing or breaking electrical continuity between the terminal 53*y*1 and the terminal 53*y*2 on the basis of the result of a logic operation of a signal input to the terminal 53*a* and a signal input to the terminal 53*b*.

In this embodiment and the like, for example, the circuit 53B can establish a conduction state between the terminal 53*y*1 and the terminal 53*y*2 in the case where the result of the logical conjunction of the signal input to the terminal 53*a* and the negation of the signal input to the terminal 53*b* is true, or can establish a non-conduction state between the terminal 53*y*1 and the terminal 53*y*2 in the case where the result of the logical conjunction is false. That is, only when a potential input to the terminal 53*a* is the potential H, and a potential input to the terminal 53*b* is the potential L, a conduction state is established between the terminal 53*y*1 and the terminal 53*y*2.

Figure 12B:
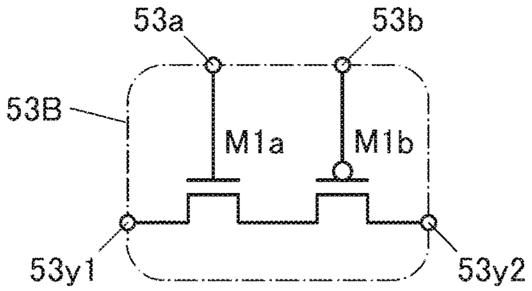

In order to achieve the function of the circuit 53B, a variety of circuit structures can be used. FIG. 12B illustrates a circuit structure example of the circuit 53B. The circuit 53B includes a transistor M1*a* and a transistor M1*b*. In this embodiment and the like, the transistor M1*a* is an n-channel field-effect transistor. For example, an n-channel OS transistor may be used for the transistor M1*a*. The transistor M1*b* is a p-channel field-effect transistor. For example, a p-channel LTPS transistor may be used for the transistor M1*b*.

A gate of the transistor M1*a* is electrically connected to the terminal 53*a*. A gate of the transistor M1*b* is electrically connected to the terminal 53*b*. One of a source and a drain of the transistor M1*a* is electrically connected to one of a source and a drain of the transistor M1*b*. The other of the source and the drain of the transistor M1*a* is electrically connected to the terminal 53*y*1. The other of the source and the drain of the transistor M1*b* is electrically connected to the terminal 53*y*2.

Note that the circuit structure of the circuit 53B is not limited to the structure in FIG. 12B. For example, the other of the source and the drain of the transistor M1*b* may be electrically connected to the terminal 53*y*1 and the other of the source and the drain of the transistor M1*a* may be electrically connected to the terminal 53*y*2.

With the use of the circuit structure of the circuit 53B illustrated in FIG. 12A and FIG. 12B, the number of transistors can be smaller than that of the circuit structure of the circuit 53A illustrated in FIG. 1A and FIG. 1B. Thus, the definition of a display apparatus using the semiconductor device 100A of one embodiment of the present invention can be increased. Furthermore, the display quality of the display apparatus using the semiconductor device 100A of one embodiment of the present invention can be improved.

The structure described in this embodiment can be used in appropriate combination with any of the other structures described in the other embodiments.

Embodiment 2

In this embodiment, a semiconductor device 100B of one embodiment of the present invention will be described. The semiconductor device 100B is a modification example of the semiconductor device 100A. Therefore, in order to reduce repeated description, differences of the semiconductor device 100B from the semiconductor device 100A are mainly described.

Structure Example

Figure 13A:
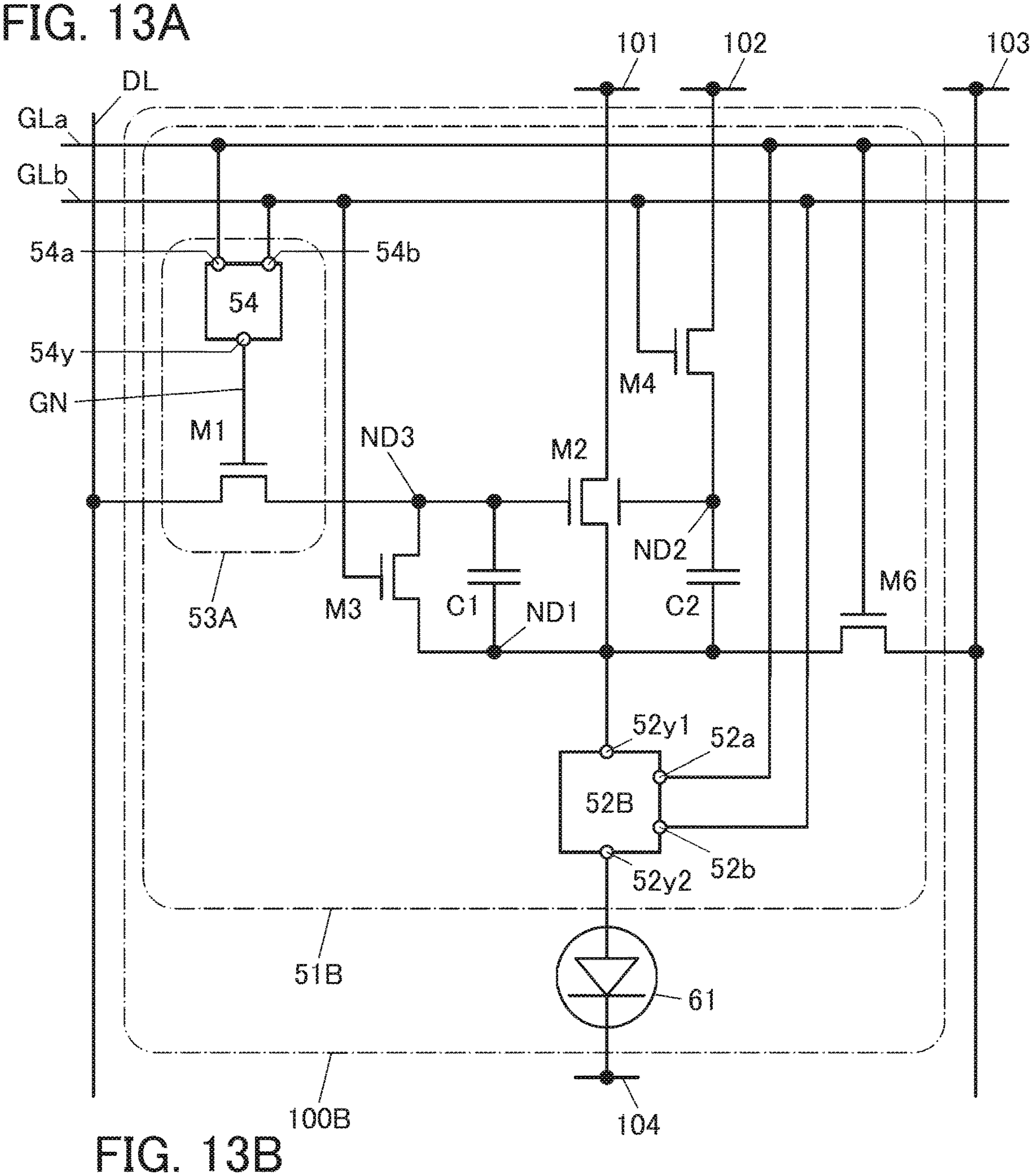
FIG. 13A and FIG. 13B are diagrams illustrating an example of a semiconductor device.

FIG. 13A illustrates a circuit structure example of the semiconductor device 100B. The semiconductor device 100B includes a pixel circuit 51B and the light-emitting element 61. The pixel circuit 51B can be regarded as having a structure in which the circuit 52A included in the pixel circuit 51A is replaced with the circuit 52B. The circuit 52B includes a terminal 52*a*, a terminal 52*b*, a terminal 52*y*1, and a terminal 52*y*2. The terminal 52*a* is electrically connected to the wiring GLa, and the terminal 52*b* is electrically connected to the wiring GLb. The terminal 52*y*1 is electrically connected to the node ND1, and the terminal 52*y*2 is electrically connected to the one terminal (e.g., an anode terminal) of the light-emitting element 61. The circuit 52B has a function of establishing or breaking electrical continuity between the terminal 52*y*1 and the terminal 52*y*2 on the basis of the result of a logic operation of a signal input to the terminal 52*a* and a signal input to the terminal 52*b*.

In the circuit 52B of this embodiment and the like, for example, when the result of the logical non-disjunction of the signal input to the terminal 52*a* and the signal input to the terminal 52*b* is true, a conduction state can be established between the terminal 52*y*1 and the terminal 52*y*2, or in the case where the result of the logical non-disjunction is false, a non-conduction state can be established between the terminal 52*y*1 and the terminal 52*y*2. That is, only when both a potential input to the terminal 52*a* and a potential input to the terminal 52*b* are each the potential L, a conduction state is established between the terminal 52*y*1 and the terminal 52*y*2.

Figure 13B:
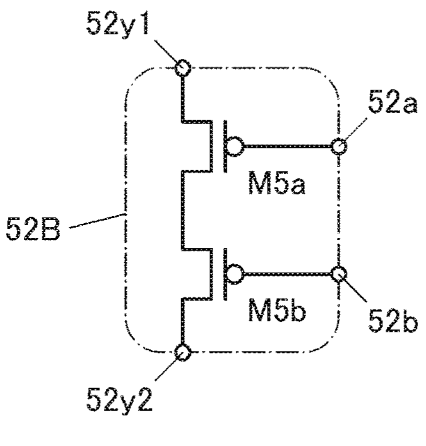

In order to achieve the function of the circuit 52B, a variety of circuit structures can be used. FIG. 13B illustrates a circuit structure example of the circuit 52B. The circuit 52B includes a transistor M5*a* and a transistor M5*b*. In this embodiment and the like, the transistor M5*a* and the transistor M5*b* are p-channel field-effect transistors. For example, p-channel LTPS transistors may be used.

A gate of the transistor M5*a* is electrically connected to the terminal 52*a*. A gate of the transistor M5*b* is electrically connected to the terminal 52*b*. One of a source and a drain of the transistor M5*a* is electrically connected to one of a source and a drain of the transistor M5*b*. The other of the source and the drain of the transistor M5*a* is electrically connected to the terminal 52*y*1. The other of the source and the drain of the transistor M5*b* is electrically connected to the terminal 52*y*2.

Note that the circuit structure of the circuit 52B is not limited to the structure in FIG. 13B. For example, the other of the source and the drain of the transistor M5*b* may be electrically connected to the terminal 52*y*1 and the other of the source and the drain of the transistor M5*a* may be electrically connected to the terminal 52*y*2.

Operation Example

Figure 14:
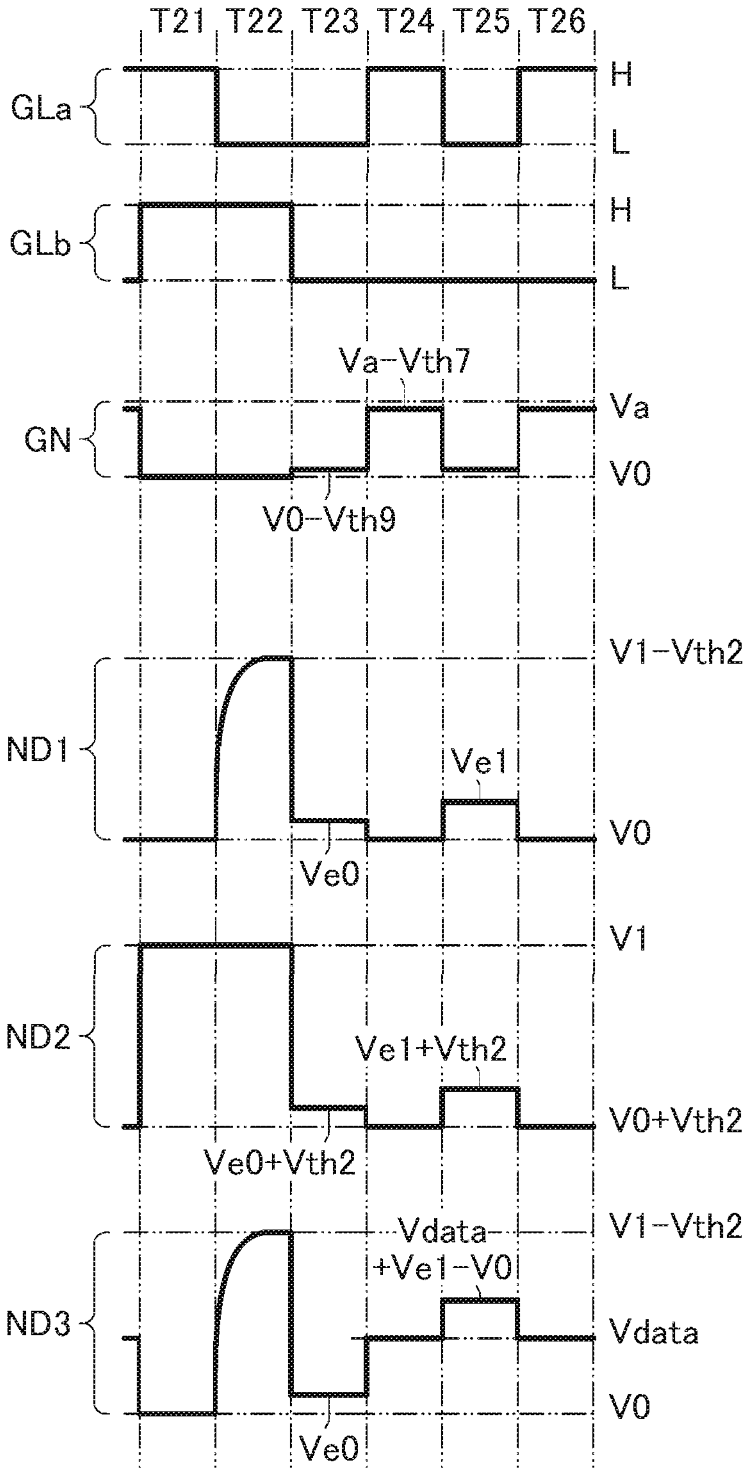
FIG. 14 is a timing chart showing an operation example of a semiconductor device.

Next, an operation example of the semiconductor device 100B is described. FIG. 14 is a timing chart showing the operation example of the semiconductor device 100B.

In the case where both the potential of the wiring GLa and the potential of the wiring GLb are the potentials L in the semiconductor device 100B, a conduction state is established between the node ND1 and the one terminal of the light-emitting element 61. Alternatively, in the case where at least one of the potential of the wiring GLa and the potential of the wiring GLb is the potential H, a non-conduction state is established between the node ND1 and the one terminal of the light-emitting element 61. Therefore, in the Vth correction operation (Period T21 to Period T23) and the light-emitting operation (Period T25) of the semiconductor device 100B, the conduction state or the non-conduction state between the node ND1 and the one terminal of the light-emitting element 61 is similar to that of the Vth correction operation (Period T11 to Period T13) and the light-emitting operation (Period T15) of the semiconductor device 100A. Thus, for Period T21 to Period T23 and Period T25 of the semiconductor device 100B, the operation example in Embodiment 1 can be referred to as appropriate. Here, differences in the data writing operation (Period T24) and the quenching operation (Period T26) from the operation example in Embodiment 1 will be mainly described.

[Data Writing Operation]

Period T24 is different from that in the operation example in Embodiment 1 in that when the potential H is supplied to the wiring GLa and the potential L is supplied to the wiring GLb, a non-conduction state is established between the node ND1 and the one terminal of the light-emitting element 61.

In Period T24, the video signal Vdata is supplied to the node ND3, and the potential V0 is supplied to the node ND1.

At this time, a non-conduction state is established between the node ND1 and the one terminal of the light-emitting element 61. Thus, the potential of the node ND1 can be surely set to the potential V0, whereby data writing can be stabilized. Thus, the display quality of the display apparatus can be improved.

[Quenching Operation]

Period T26 is different from that in the operation example in Embodiment 1 in that the potential H is supplied to the wiring GLa and the potential L is supplied to the wiring GLb.

When the potential H is supplied to the wiring GLa and the potential L is supplied to the wiring GLb, a non-conduction state is established between the node ND1 and the one terminal of the light-emitting element 61. Thus, since current does not flow through the light-emitting element 61, light emission from the light-emitting element 61 is stopped (quenched). At this time, the transistor M3 and the transistor M4 remain in an off state. That is, the node ND2 remains in a floating state. Thus, a potential difference (voltage) between the back gate of the transistor M2 and the source of the transistor M2 is maintained at Vth2 obtained in the Vth correction operation.

In addition, the transistor M1 and the transistor M6 are brought into an on state. Thus, the video signal Vdata is supplied to the node ND3, and the potential V0 is supplied to the node ND1. That is, the behavior of Period T26 is the same as that of Period T24. Thus, data writing operation may be performed in the period for the quenching operation.

In a display apparatus using the semiconductor device 100B of one embodiment of the present invention, for example, adequate period for the correction operation can be ensured by performing the Vth correction operation right after the start-up of the display apparatus. In addition, since Vth2 obtained in the Vth correction operation can also be maintained during the period for the quenching operation, Vth correction operation is not necessarily performed every frame. Thus, the execution frequency of the data writing operation can be increased. Thus, the display quality of the display apparatus can be improved.

The structure described in this embodiment can be used in appropriate combination with any of the other structures described in the other embodiments.

Embodiment 3

Figure 15A:
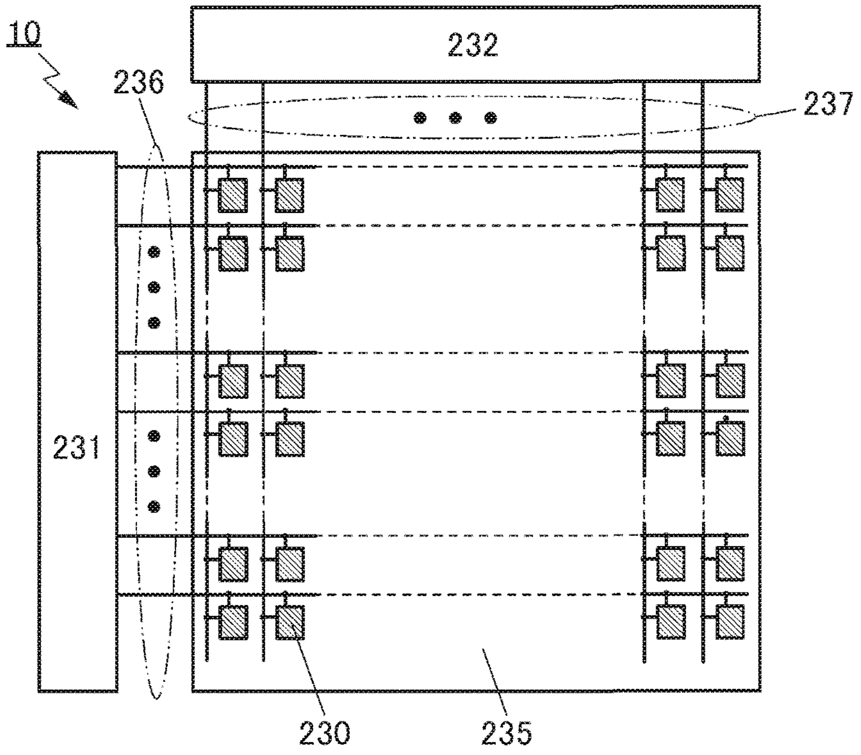
FIG. 15A is a diagram illustrating a structure example of a display apparatus.

In this embodiment, a structure example of a display apparatus 10 including a semiconductor device 100 (the semiconductor device 100A or the semiconductor device 100B) will be described. FIG. 15A is a block diagram illustrating the display apparatus 10. The display apparatus 10 includes a display region 235, a first driver circuit portion 231, and a second driver circuit portion 232. The display region 235 includes a plurality of pixels 230 arranged in a matrix. The semiconductor device 100 of one embodiment of the present invention can be used as each of the pixels 230.

A circuit included in the first driver circuit portion 231 functions as, for example, a scan line driver circuit. A circuit included in the second driver circuit portion 232 functions as, for example, a signal line driver circuit. Note that some sort of circuit may be provided at a position facing the first driver circuit portion 231 with the display region 235 positioned therebetween. Some sort of circuit may be provided at a position facing the second driver circuit portion 232 with the display region 235 positioned therebetween. Note that in this specification and the like, circuits included in the first driver circuit portion 231 and the second driver circuit portion 232 are collectively referred to as a "peripheral driver circuit" in some cases.

Any of various circuits such as a shift register, a level shifter, an inverter, a latch, an analog switch, and a logic circuit can be used as the peripheral driver circuit, for example. In the peripheral driver circuit, a transistor, a capacitor, or the like can be used, for example.

For example, OS transistors may be used as the transistors included in the pixels 230 and Si transistors may be used as the transistors included in the peripheral driver circuit. The off-state current of an OS transistor is low. Thus, power consumption of the pixels 230 using the OS transistors can be reduced. The Si transistor has higher operation speed than the OS transistor. Therefore, the Si transistor is suitably used in the peripheral driver circuit. Depending on the display apparatus, the OS transistors may be used as both the transistors included in the pixels 230 and the transistors included in the peripheral driver circuit. Depending on the display apparatus, the Si transistors may be used as both the transistors included in the pixels 230 and the transistors included in the peripheral driver circuit. Depending on the display apparatus, the Si transistors may be used as the transistors included in the pixels 230 and the OS transistors may be used as the transistors included in the peripheral driver circuit.

Both the Si transistor and the OS transistor may be used as the transistors included in the pixel 230. Both the Si transistor and the OS transistor may be used as the transistors included in the peripheral driver circuit.

The display apparatus 10 includes m wirings 236 which are placed in substantially parallel with each other and whose potentials are controlled by a circuit included in the first driver circuit portion 231. The display apparatus 10 includes n wirings 237 which are placed in substantially parallel with each other and whose potentials are controlled by a circuit included in the second driver circuit portion 232.

Note that FIG. 15A illustrates an example in which the wiring 236 and the wiring 237 are connected to the pixel 230. However, FIG. 15A is an example, and the wirings connected to the pixels 230 are not limited to the wirings 236 and the wirings 237.

Figure 15B:
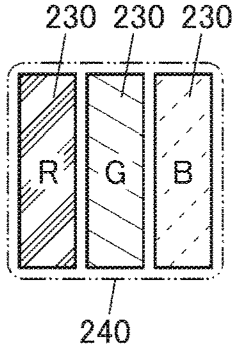
FIG. 15B to FIG. 15H are diagrams illustrating structure examples of a pixel.
Figure 15C:
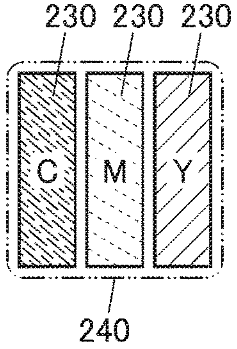

The display apparatus 10 can achieve full-color display by making the pixel 230 that controls red light, the pixel 230 that controls green light, and the pixel 230 that controls blue light collectively function as one pixel 240 and by controlling the amount of light (emission luminance) emitted from each pixel 230. Thus, the three pixels 230 each function as a subpixel. That is, the emission amount or the like of red light, green light, and blue light are controlled by the three subpixels, for example (see FIG. 15B). The light colors controlled by the three subpixels are not limited to a combination of red (R), green (G), and blue (B) and may be cyan (C), magenta (M), and yellow (Y) (see FIG. 15C).

Figure 15D:
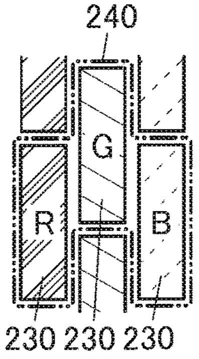

The three pixels 230 constituting one pixel 240 may be arranged in a delta pattern (see FIG. 15D). Specifically, the three pixels 230 constituting one pixel 240 may be arranged such that the lines connecting the center points of the three pixels 230 form a triangle.

Figure 15E:
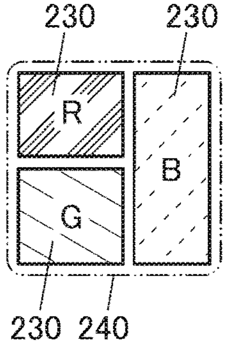

The areas of the three subpixels (the pixels 230) are not necessarily the same as one another. For example, in the case where the emission efficiency, reliability, and the like are different depending on emission colors, the areas of the three subpixels may be different depending on emission colors (see FIG. 15E). Note that the arrangement of the subpixels illustrated in FIG. 15E may be called "S stripe arrangement", for example.

Figure 15F:
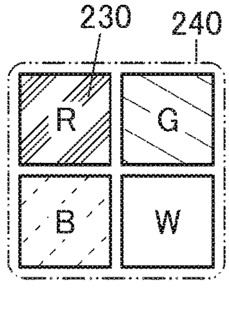
Figure 15G:
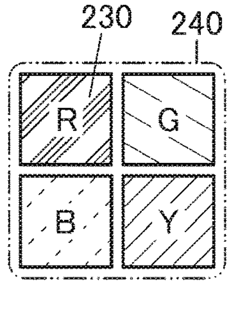
Figure 15H:
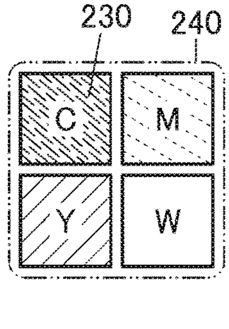

Furthermore, four subpixels may collectively function as one pixel 240. In that case, the color of light controlled by at least one of the four subpixels may be white (W). For example, a subpixel that controls white light may be added to the three subpixels that control red light, green light, and blue light (see FIG. 15F). With addition of the subpixel that controls white light, the display apparatus 10 with the increased luminance of the display region 235 can be achieved. Alternatively, a subpixel that controls yellow light may be added to the three subpixels that control red light, green light, and blue light, for example (see FIG. 15G). Alternatively, a subpixel that controls white light may be added to three subpixels that control cyan light, magenta light, and yellow light, for example (see FIG. 15H).

When the number of subpixels functioning as one pixel is increased and subpixels that control light of red, green, blue, cyan, magenta, yellow, and the like are used in an appropriate combination in the pixel 240, the display apparatus 10 with the increased reproducibility of halftones can be achieved. Consequently, the display apparatus 10 with the increased display quality can be achieved.

The display apparatus 10 of one embodiment of the present invention can reproduce the color gamut of various standards. For example, the display apparatus of one embodiment of the present invention can reproduce the color gamut of the following standards: the PAL (Phase Alternating Line) standard or NTSC (National Television System Committee) standard used for TV broadcasting; the sRGB (standard RGB) standard or Adobe RGB standard used widely for display apparatuses, for example, in electronic devices such as personal computers, digital cameras, and printers; the ITU-R BT.709 (International Telecommunication Union Radiocommunication Sector Broadcasting Service (Television) 709) standard used for HDTV (High Definition Televisions, also referred to Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

For example, by using the pixels 240 arranged in a matrix of 1920×1080, the display apparatus 10 that can perform full-color display with a resolution of what is called full high-vision (also referred to as "2K resolution", "2K1K", "2K", or the like) can be obtained. For example, by using the pixels 240 arranged in a matrix of 3840×2160, the display apparatus 10 that can perform full-color display with a resolution of what is called ultra hivision (also referred to as "4K resolution", "4K2K", "4K", or the like) can be obtained. For example, by using the pixels 240 arranged in a matrix of 7680×4320, the display apparatus 10 that can perform full-color display with a resolution of what is called super hi-vision (also referred to as "8K resolution", "8K4K", "8K", or the like, for example) can be obtained. By increasing the number of pixels 240, the display apparatus 10 that can perform full-color display with 16K or 32K resolution can also be obtained.

The pixel density of the display region 235 is preferably higher than or equal to 100 ppi and lower than or equal to 10000 ppi, and further preferably higher than or equal to 1000 ppi and lower than or equal to 10000 ppi. For example, the pixel density of the display region 235 may be higher than or equal to 2000 ppi and lower than or equal to 6000 ppi, or higher than or equal to 3000 ppi and lower than or equal to 5000 ppi.

Note that there is no particular limitation on the aspect ratio of the display region 235. For example, the display region 235 of the display apparatus 10 is compatible with a variety of aspect ratios such as 1:1 (square), 4:3, 16:9, and 16:10.

The diagonal size of the display region 235 may be greater than or equal to 0.1 inches and less than or equal to 100 inches and may be greater than or equal to 100 inches.

In the case where the display apparatus 10 is used as a display apparatus for virtual reality (VR) or augmented reality (AR), the diagonal size of the display region 235 can be greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the diagonal size of the display region 235 may be 1.5 inches or approximately 1.5 inches. When the display region 235 has a diagonal size of less than or equal to 2.0 inches, preferably, approximately 1.5 inches, the number of times of light exposure treatment performed using a light exposure apparatus (typified by a scanner apparatus) can be one; thus, the productivity of a manufacturing process can be improved.

The structure of transistors used in the display region 235 may be selected as appropriate depending on the diagonal size of the display region 235. In the case where single crystal Si transistors are used in the display region 235, for example, the diagonal size of the display region 235 is preferably greater than or equal to 0.1 inches and less than or equal to 3 inches. In the case where LTPS transistors are used in the display region 235, the diagonal size of the display region 235 is preferably greater than or equal to 0.1 inches and less than or equal to 30 inches, further preferably greater than or equal to 1 inch and less than or equal to 30 inches. In the case where LTPO (a structure in which an LTPS transistor and an OS transistor are combined) is employed in the display region 235, the diagonal size of the display region 235 is preferably greater than or equal to 0.1 inches and less than or equal to 50 inches, further preferably greater than or equal to 1 inch and less than or equal to 50 inches. In the case where OS transistors are used in the display region 235, the diagonal size of the display region 235 is preferably greater than or equal to 0.1 inches and less than or equal to 200 inches, further preferably greater than or equal to 50 inches and less than or equal to 100 inches.

With single crystal Si transistors, increasing the size of a display panel is extremely difficult because of the size of a single crystal Si substrate. Furthermore, since a laser crystallization apparatus is used in the manufacturing process of LTPS transistors, LTPS transistors are unlikely to respond to a size increase of a display panel (typically to a screen diagonal size greater than 30 inches). By contrast, since the manufacturing process of OS transistors, for example, does not necessarily require a laser crystallization apparatus or the like or can be performed at a relatively low process temperature (typically, lower than or equal to 450° C.), the OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

<Structure Example of Peripheral Driver Circuit>

As described above, both a Si transistor and an OS transistor may be used as the transistors included in the peripheral driver circuit included in the display apparatus 10. For example, a structure in which a Si transistor and an OS transistor are combined may be used for a sequential circuit included in the peripheral driver circuit.

Figure 16A:
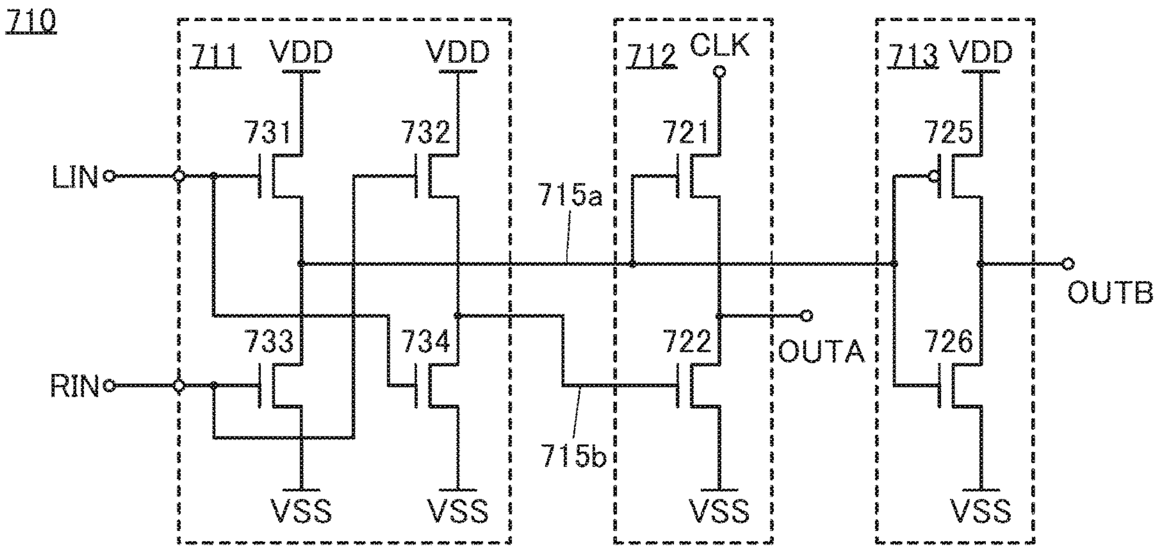
FIG. 16A is a diagram illustrating a structure example of a sequential circuit.

FIG. 16A illustrates a structure example of a sequential circuit 710. The sequential circuit 710 includes a circuit 711, a circuit 712, and a circuit 713. The circuit 711 includes a wiring 715*a* and a wiring 715*b*. The circuit 711 and the circuit 712 are electrically connected to each other through the wiring 715*a* and the wiring 715*b*. The circuit 711 and the circuit 713 are electrically connected to each other through the wiring 715*a*.

The circuit 711 has a function of outputting a first signal to the wiring 715*a* and a second signal to the wiring 715*b* in accordance with potentials of a signal LIN and a signal RIN. That is, the circuit 711 can also be referred to as a control circuit.

The second signal is a signal whose logic is inverted from that of the first signal. That is, in the case where the first signal and the second signal are each a signal having two kinds of potentials, a high potential and a low potential, the circuit 711 outputs a low potential to the wiring 715*b* when outputting a high potential to the wiring 715*a*, and the circuit 711 outputs a high potential to the wiring 715*b* when outputting a low potential to the wiring 715*a*.

The circuit 712 has a function of outputting one of a signal CLK and a potential VSS to an output terminal OUTA on the basis of signals input to the wiring 715*a* and the wiring 715*b*. The circuit 712 outputs the signal CLK when the wiring 715*a* is at a high potential and outputs the potential VSS when the wiring 715*a* is at a low potential. The circuit 712 can be referred to as an amplifier circuit, a buffer circuit, or the like, for example.

As the signal CLK, a clock signal can be used. As the clock signal, a signal with a duty ratio (a percentage of a period of a high-level potential to one cycle of a signal) higher than or equal to 45% and lower than or equal to 55% can be suitably used. As the clock signal, a signal with a duty ratio of 50% is further preferably used. Note that the duty ratio of the clock signal is not limited to the above and can be changed as appropriate in accordance with a driving method.

Note that in this specification and the like, a clock signal refers to a signal in which a high potential and a low potential are alternated and an interval between a potential rise and a next potential rise or an interval between a potential fall and a next potential fall is constant. In this specification and the like, a pulse signal refers to a signal whose potential changes over time. A pulse signal includes a signal whose potential changes periodically. For example, a pulse signal includes signals whose potentials change periodically, such as a rectangular wave, a triangular wave, a sawtooth wave, and a sine wave. Thus, a clock signal can be regarded as one embodiment of a pulse signal.

Here, a potential VDD can be a potential higher than the potential VSS. The signal CLK is a signal in which a high potential and a low potential are alternated. At this time, the low potential of the signal CLK is preferably the same potential as the potential VSS. Instead of the signal CLK, a high potential (e.g., the potential VDD) may be supplied to one of a source and a drain of a transistor 721.

The circuit 713 has a function of outputting one of the potential VDD and the potential VSS to an output terminal OUTB in accordance with the potential of the wiring 715*a*. The circuit 713 outputs the potential VSS, which is a low potential, when the wiring 715*a* is at a high potential and outputs the potential VDD, which is a high potential, when the wiring 715*a* is at a low potential. That is, the circuit 713 can output the signal whose logic is inverted from that of the first signal to the output terminal OUTB. In other words, the circuit 713 can output a signal similar to the second signal to the output terminal OUTB. The circuit 713 can be referred to as an inverter circuit or the like, for example.

The sequential circuit 710 functions as a flip-flop circuit and can be used as part of a shift register circuit. For example, the sequential circuit 710 can be used as part of a driver circuit of the display apparatus. In particular, the sequential circuit 710 can be suitably used as part of a scan line driver circuit (also referred to as a gate driver circuit) of the display apparatus.

In the case where the sequential circuit 710 is used as a scan line driver circuit, a scanning line (also referred to as a gate line) connected to a plurality of pixels of the display apparatus can be connected to at least one or both of the output terminal OUTA and the output terminal OUTB. When a scanning line is connected to each of the output terminal OUTA and the output terminal OUTB, a pixel can be driven with two kinds of scanning line signals, so that a pixel can have more functions.

The circuit 711 includes a transistor 731 to a transistor 734. N-channel transistors are preferably used as the transistor 731 to the transistor 734.

The conduction state or the non-conduction state of each of the transistor 731 and the transistor 734 is selected in accordance with the potential of the signal LIN. The conduction state or the non-conduction state of each of the transistor 732 and the transistor 733 is selected in accordance with the potential of the signal RIN.

When the signal LIN is a high potential and the signal RIN is a low potential, the transistor 731 is brought into a conduction state and the transistor 733 is brought into a non-conduction state, so that the wiring 715*a* is electrically connected to a wiring to which the potential VDD is supplied. Furthermore, the transistor 734 is brought into a conduction state and the transistor 732 is brought into a non-conduction state, so that the wiring 715*b* is electrically connected to a wiring to which the potential VSS is supplied. Meanwhile, when the signal LIN is a low potential and the signal RIN is a high potential, the conduction state and the non-conduction state of each transistor are reversed from the above, so that the wiring 715*a* is electrically connected to the wiring to which the potential VSS is supplied, and the wiring 715*b* is electrically connected to the wiring to which the potential VDD is supplied.

The circuit 712 includes the transistor 721 and a transistor 722. N-channel transistors are preferably used as the transistor 721 and the transistor 722.

In the circuit 712, a gate of the transistor 721 is electrically connected to the wiring 715*a*, the one of the source and the drain of the transistor 721 is electrically connected to a wiring to which the signal CLK is supplied, and the other of the source and the drain of the transistor 721 is electrically connected to one of a source and a drain of the transistor 722 and the output terminal OUTA. A gate of the transistor 722 is electrically connected to the wiring 715*b*, and the other of the source and the drain of the transistor 722 is electrically connected to the wiring to which the potential VSS is supplied. Note that the output terminal OUTA is a portion to which an output potential from the circuit 712 is supplied and may be part of a wiring or part of an electrode.

In the circuit 712, when the wiring 715*a* is at a high potential and the wiring 715*b* is at a low potential, the signal CLK is output to the output terminal OUTA through the transistor 721. By contrast, when the wiring 715*a* is at a low potential and the wiring 715*b* is at a high potential, the potential VSS is output to the output terminal OUTA through the transistor 722.

The circuit 713 includes a transistor 725 and a transistor 726. The transistor 725 is preferably a p-channel transistor (p-type transistor), and the transistor 726 is preferably an n-channel transistor (n-type transistor).

In the circuit 713, a gate of the transistor 725 is electrically connected to the wiring 715*a*, one of a source and a drain of the transistor 725 is electrically connected to the wiring to which the potential VDD is supplied, and the other of the source and the drain of the transistor 725 is electrically connected to one of a source and a drain of the transistor 726 and the output terminal OUTB. A gate of the transistor 726 is electrically connected to the wiring 715*a*, and the other of the source and the drain of the transistor 726 is electrically connected to the wiring to which the potential VSS is supplied. Note that the output terminal OUTB is a portion to which an output potential from the circuit 713 is supplied and may be part of a wiring or part of an electrode.

In the circuit 713, when the wiring 715*a* is at a high potential, the potential VSS is output to the output terminal OUTB through the transistor 726. By contrast, when the wiring 715*a* is at a low potential, the potential VDD is output to the output terminal OUTB through the transistor 725.

Figure 16B:
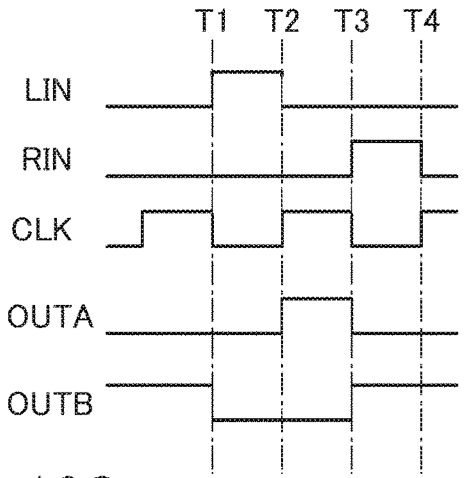
FIG. 16B is a timing chart of the sequential circuit.

FIG. 16B is a timing chart showing an example of a driving method for the sequential circuit 710. FIG. 16B schematically shows potential changes over time in the signal LIN, the signal RIN, the signal CLK, the output terminal OUTA, and the output terminal OUTB.

Before Time T1, both the signal LIN and the signal RIN are low potentials. Before Time T1, a low potential is output to the output terminal OUTA and a high potential is output to the output terminal OUTB regardless of the potential of the signal CLK.

At Time T1, the signal LIN becomes a high potential. In Period T1-T2, the signal CLK is at a low potential. Accordingly, in Period T1T2, the signal CLK (i.e., a low potential) is output to the output terminal OUTA, and a low potential is output to the output terminal OUTB.

Then, at Time T2, the signal LIN becomes a low potential. Thus, all of the four transistors in the circuit 711 are brought into the off state, whereby the potentials of the wiring 715*a* and the wiring 715*b* are retained. At Time T2, the signal CLK changes to a high potential. Accordingly, in Period T2-T3, a high potential is output to the output terminal OUTA, and a low potential is continuously output to the output terminal OUTB.

Then, at Time T3, the signal RIN becomes a high potential. Thus, the wiring 715*a* becomes a low potential, and the wiring 715*b* becomes a high potential. Accordingly, in Period T3-T4, a low potential is supplied to the output terminal OUTA, and a high potential is supplied to the output terminal OUTB.

At Time T4, the signal RIN becomes a low potential. Thus, all of the transistors in the circuit 711 are brought into the off state, and the potentials of the wiring 715*a* and the wiring 715*b* are retained. Accordingly, after Time T4, a low potential is output to the output terminal OUTA, and a high potential is output to the output terminal OUTB.

Before Time T1 and after Time T4 can be referred to as periods in which the sequential circuit 710 is in a standby state (also referred to as a non-operative state or a non-selected state) since both the signal LIN and the signal RIN are low potentials. In the periods, a low potential is output to the output terminal OUTA, and a high potential is output to the output terminal OUTB.

As shown in FIG. 16B, the signal output to the output terminal OUTA is a signal that becomes a high potential only in Period T2-T3 and always becomes a low potential in other periods. That is, the signal output to the output terminal OUTA of the sequential circuit 710 can be referred to as a normally low signal. Meanwhile, the signal output to the output terminal OUTB is a signal that becomes a low potential only in Period T1-T3 and always becomes a high potential in other periods. That is, the signal output to the output terminal OUTB can be referred to as a normally high signal. Accordingly, the sequential circuit 710 can output two kinds of signals, a normally low signal and a normally high signal, so that when the sequential circuit 710 is used as a scan line driver circuit of the display apparatus, for example, a pixel of the display apparatus can be driven by the two kinds of signals. Thus, a multifunctional display apparatus can be achieved.

The above is the description of the operation method example of the sequential circuit 710.

Here, as an n-channel transistor included in the sequential circuit 710, a transistor in which an oxide semiconductor is used in a semiconductor layer where a channel is formed is preferably used. Such a transistor has leakage current flowing between a source and the drain in an off state much lower than that of a transistor including silicon in a semiconductor layer where a channel is formed. When such a transistor is used in the circuit 711, the circuit 712, and the circuit 713, the power consumption of each circuit can be extremely low.

As a p-channel transistor included in the sequential circuit 710, a transistor in which silicon is used in a semiconductor layer where a channel is formed is preferably used. As silicon, for example, single crystal silicon, polycrystalline silicon, amorphous silicon, and the like can be given. In particular, a transistor containing low-temperature polysilicon (LTPS) in its semiconductor layer (hereinafter also referred to as an LTPS transistor) is preferably used. The LTPS transistor has high field-effect mobility and excellent frequency characteristics. Since the LTPS transistor has a large amount of current that can flow in an on state, the time taken for charging and discharging a wiring connected to the output terminal OUTB can be shortened. Thus, in particular, the n-channel transistor 726 and the p-channel transistor 725 are used to form a CMOS (Complementary Metal Oxide Semiconductor) in the circuit 713, whereby the circuit 713 with high driving capability and low power consumption can be achieved.

Figure 16C:
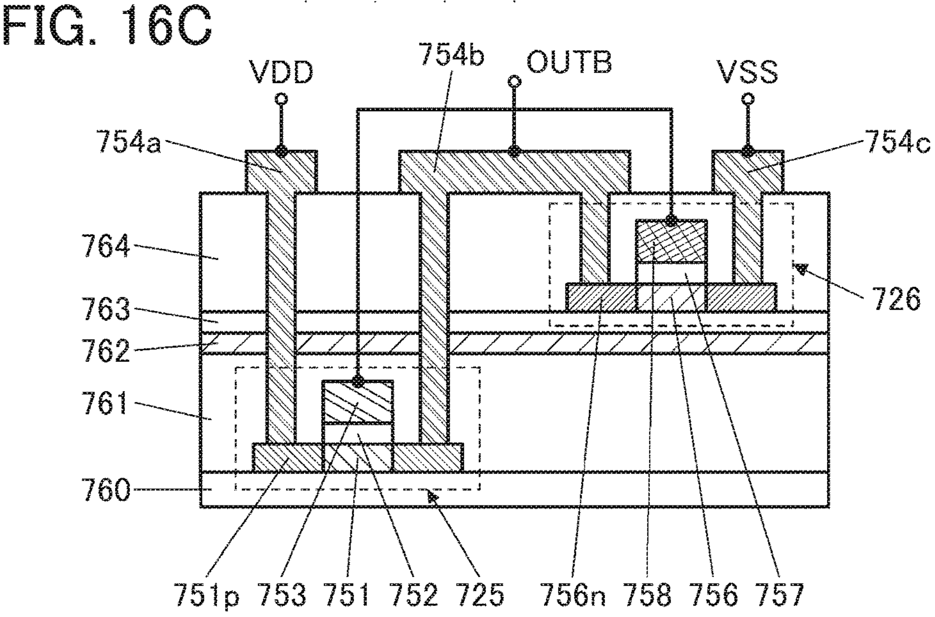
FIG. 16C is a schematic cross-sectional view of the sequential circuit.

A p-channel transistor and an n-channel transistor that can be used in the sequential circuit 710 are preferably formed over the same substrate. A stacked-layer structure of a p-channel transistor and an n-channel transistor in the sequential circuit 710 will be described below. For example, FIG. 16C illustrates a schematic cross-sectional view of the sequential circuit 710 including cross sections of the transistor 725 and the transistor 726 included in the circuit 713 in the channel length direction.

The transistor 725 and the transistor 726 are provided over an insulating layer 760. As the transistor 725 and the transistor 726, FIG. 16C illustrates an example in which each transistor is what is called a top-gate transistor, in which a gate electrode is provided over a semiconductor layer. Note that the structure of the transistors is not limited to this.

The transistor 725 includes a semiconductor layer 751, a gate insulating layer 752, and a gate electrode 753. The semiconductor layer 751 contains polycrystalline silicon. The semiconductor layer 751 includes a pair of low-resistance regions 751*p* exhibiting p-type conductivity with a channel formation region therebetween. The transistor 726 includes a semiconductor layer 756, a gate insulating layer 757, and a gate electrode 758. The semiconductor layer 756 contains a metal oxide. The semiconductor layer 756 includes a pair of low-resistance regions 756*n* exhibiting n-type conductivity with a channel formation region therebetween.

The semiconductor layer 751 of the transistor 725 is provided over the insulating layer 760. An insulating layer 761 is provided to cover the transistor 725, and an insulating layer 762 and an insulating layer 763 are stacked over the insulating layer 761. The semiconductor layer 756 of the transistor 726 is provided in contact with the top surface of the insulating layer 763. An insulating layer 764 is provided to cover the transistor 726.

A conductive layer 754*a*, a conductive layer 754*b*, and a conductive layer 754*c* are provided over the insulating layer 764. Part of the conductive layer 754*a* corresponds to the wiring to which the potential VDD is supplied. Part of the conductive layer 754*c* corresponds to the wiring to which the potential VSS is supplied. Part of the conductive layer 754*b* corresponds to the output terminal OUTB. The gate electrode 753 and the gate electrode 758 are electrically connected to each other in a region not illustrated.

The conductive layer 754*a* and the conductive layer 754*b* are electrically connected to the low-resistance region 751*p* in opening portions provided in the insulating layer 764, the insulating layer 763, the insulating layer 762, and the insulating layer 761. The conductive layer 754*b* and the conductive layer 754*c* are electrically connected to the low-resistance region 756*n* in opening portions provided in the insulating layer 764.

Here, since the polycrystalline silicon improves the reliability by terminating a dangling bond of silicon with a hydrogen atom, so that the semiconductor layer 751 and its vicinity (e.g., the insulating layer 761) can contain a hydrogen atom, hydrogen molecule, or a compound containing hydrogen (e.g., water) contained in the formation process. By contrast, in an oxide semiconductor, since hydrogen is an element that can serve as a carrier supply source, the hydrogen concentrations in the semiconductor layer 756 of the transistor 726 and its vicinity are preferably reduced as much as possible. Furthermore, in the oxide semiconductor, since oxygen vacancy can also be a cause of a carrier supply source, an oxide with reduced hydrogen is preferably provided in contact with the semiconductor layer 756 of the transistor 726.

Thus, it is preferable that the semiconductor layer 751 of the transistor 725 and the semiconductor layer 756 of the transistor 726 be isolated from each other by the insulating layer 762 having a barrier property against hydrogen and water. In addition, the semiconductor layer 756 of the transistor 726 is preferably provided on and in contact with the insulating layer 763 containing oxide. In this case, the insulating layer 762 contains a material having a lower permeability of hydrogen and water (a material through which hydrogen and water do not easily pass) than at least the insulating layer 761 and the insulating layer 763.

More specifically, as the insulating layer 762, an inorganic insulating film containing silicon nitride, silicon nitride oxide, aluminum oxide, or hafnium oxide can be used. An oxide film of silicon oxide, silicon oxynitride, or the like can be used as the insulating layer 763, for example. In that case, the insulating layer 763 is preferably a film from which oxygen is released by heating.

When the two kinds of transistors included in the sequential circuit 710 have a structure described here, a sequential circuit with high driving capability, low power consumption, and high reliability can be obtained.

The above is the description of the stacked-layer structure.

<Structure Example of Light-Emitting Element>

A light-emitting element (also referred to as a light-emitting device) that can be used for a semiconductor device of one embodiment of the present invention will be described.

Figure 17A:
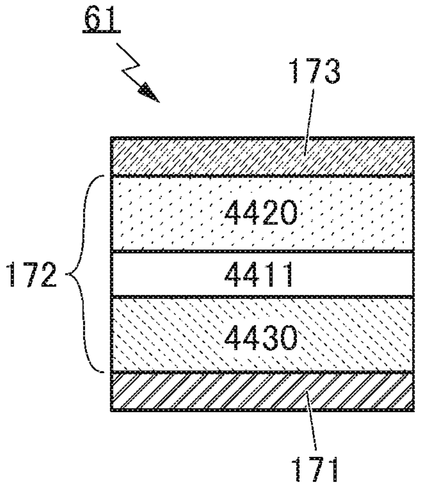
FIG. 17A to FIG. 17D are diagrams illustrating structure examples of a light-emitting element.

As illustrated in FIG. 17A, the light-emitting element 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430, for example. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which are provided between the pair of electrodes, can function as a single light-emitting unit. In this specification and the like, the structure in FIG. 17A is referred to as a single structure.

Figure 17B:
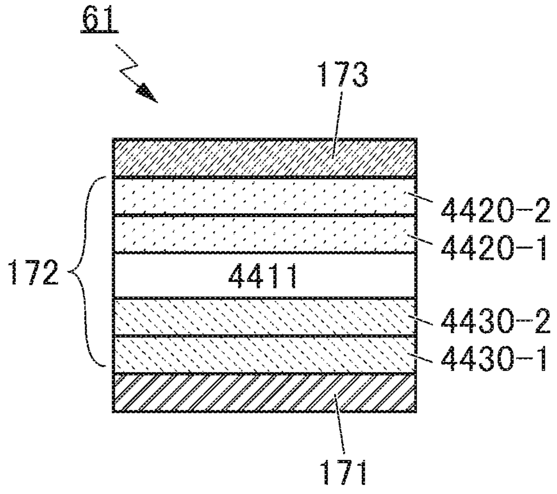

FIG. 17B is a modification example of the EL layer 172 included in the light-emitting element 61 illustrated in FIG. 17A. Specifically, the light-emitting element 61 illustrated in FIG. 17B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. In the case where the conductive layer 171 serves as an anode and the conductive layer 173 serves as a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the conductive layer 171 is a cathode and the conductive layer 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. In the light-emitting element 61 with such a layered structure, carriers can be efficiently injected to the light-emitting layer 4411, and the efficiency of the recombination of carriers in the light-emitting layer 4411 can be enhanced.

Figure 17C:
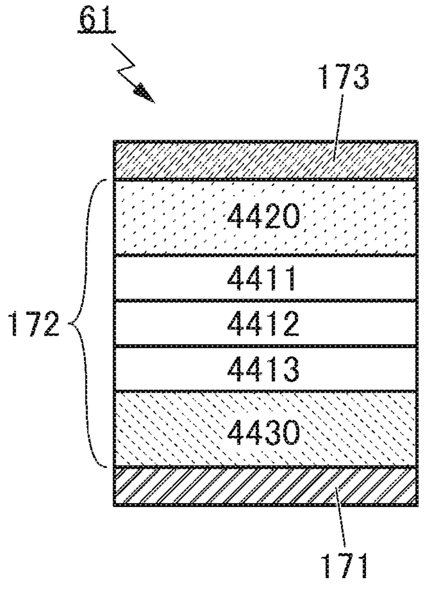

Note that the structure in which a plurality of light-emitting layers (the light-emitting layer 4411, a light-emitting layer 4412, and a light-emitting layer 4413) are provided between the layer 4420 and the layer 4430 as illustrated in FIG. 17C is also an example of the single structure.

Figure 17D:
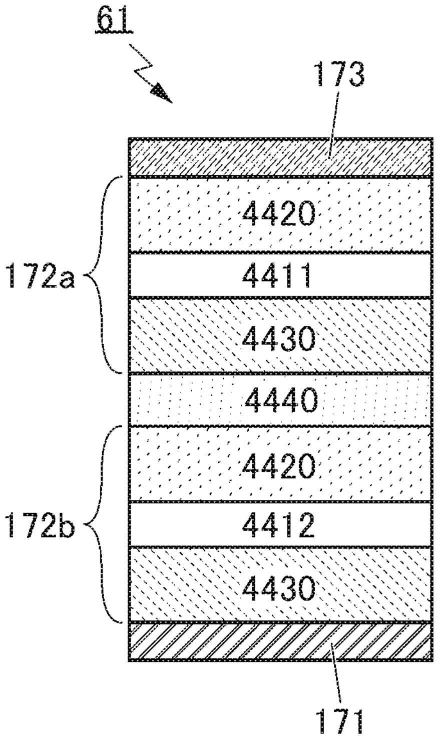

A structure in which a plurality of light-emitting units (an EL layer 172*a* and an EL layer 172*b*) are connected in series with an intermediate layer (charge-generation layer) 4440 therebetween as illustrated in FIG. 17D is referred to as a tandem structure or a stack structure in this specification and the like. Note that the tandem structure enables the light-emitting element 61 capable of high-luminance light emission.

In the case where the light-emitting element 61 has the tandem structure illustrated in FIG. 17D, the EL layer 172*a* and the EL layer 172*b* may emit light of the same color. For example, the EL layer 172*a* and the EL layer 172*b* may both emit green light. Note that in the case where the display region 235 includes three subpixels of R, G, and B and each of the subpixels includes a light-emitting element, the light-emitting element of each subpixels may have the tandem structure. Specifically, the EL layer 172*a* and the EL layer 172*b* in the subpixel of R each contain a material capable of emitting red light. The EL layer 172*a* and the EL layer 172*b* in the subpixel of G each contain a material capable of emitting green light. The EL layer 172*a* and the EL layer 172*b* in the subpixel of B each contain a material capable of emitting blue light. In other words, the light-emitting layer 4411 and the light-emitting layer 4412 may contain the same material. In the light-emitting element 61 having the tandem structure, when the EL layer 172*a* and the EL layer 172*b* emit light of the same color, the current density per unit emission luminance can be reduced. Thus, the reliability of the light-emitting element 61 can be increased.

The emission color of the light-emitting element can be, for example, red, green, blue, cyan, magenta, yellow, white, or the like depending on materials that constitutes the EL layer 172. Furthermore, the color purity can be further increased when the light-emitting element has a microcavity structure.

The light-emitting layer may contain two or more light-emitting substances that emit light of R (red), G (green), B (blue), Y (yellow), or O (orange), for example. The light-emitting element that emits white light preferably contains two or more kinds of light-emitting substances in the light-emitting layer. In the light-emitting element of one embodiment of the present invention, to obtain white light emission with the use of two kinds of light-emitting substances, the two kinds of light-emitting substances may be selected such that their emission colors are complementary colors. For example, in the light-emitting element of one embodiment of the present invention, when an emission color of a first light-emitting substance and an emission color of a second light-emitting substance are complementary colors, it is possible to obtain a light-emitting element which emits white light as a whole. In the light-emitting element of one embodiment of the present invention, to obtain white light emission by using three or more light-emitting substances, the light-emitting element may be configured to emit white light as a whole by combining emission colors of the three or more light-emitting substances.

The light-emitting layer preferably includes two or more light-emitting substances that each emit light containing two or more of spectral components of R, G, and B.

Examples of a light-emitting substance include a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescence (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting element in a high-luminance region can be inhibited.

<Method for Forming Light-Emitting Element>

An example of a method for forming the light-emitting element 61 will be described below.

Figure 18A:
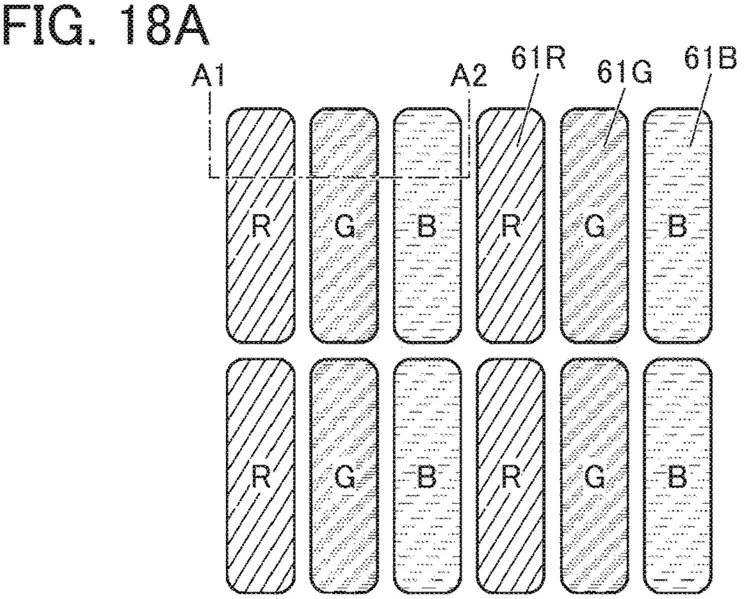
FIG. 18A to FIG. 18D are diagrams illustrating structure examples of a light-emitting element.

FIG. 18A is a schematic top view of the light-emitting element 61. The light-emitting element 61 includes a plurality of light-emitting elements 61R exhibiting red, a plurality of light-emitting elements 61G exhibiting green, and a plurality of light-emitting elements 61B exhibiting blue. In FIG. 18A, light-emitting regions of the light-emitting elements are denoted by R, G, and B to easily differentiate the light-emitting elements. Note that the structure of the light-emitting element 61 illustrated in FIG. 18A may be referred to as an SBS (Side By Side) structure. Although FIG. 18A illustrates the structure where the light-emitting element 61 includes the light-emitting elements exhibiting three colors of red (R), green (G), and blue (B), one embodiment of the present invention is not limited thereto. For example, the light-emitting element 61 may include light-emitting elements exhibiting four or more colors.

The light-emitting elements 61R, the light-emitting elements 61G, and the light-emitting elements 61B are arranged in a matrix. FIG. 18A illustrates what is called a stripe arrangement, in which the light-emitting elements exhibiting light of the same color are arranged in one direction; however, the arrangement of the light-emitting elements is not limited thereto. For example, a delta arrangement, a zigzag arrangement, an S-stripe arrangement, a PenTile arrangement, or the like can be used as the method for arranging light-emitting elements.

As the light-emitting element 61R, the light-emitting element 61G, and the light-emitting element 61B, an organic EL device such as an OLED (Organic Light Emitting Diode) or a QOLED (Quantum-dot Organic Light Emitting Diode) is preferably used, for example. Examples of a light-emitting substance contained in the light-emitting element include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescent (TADF) material).

Figure 18B:
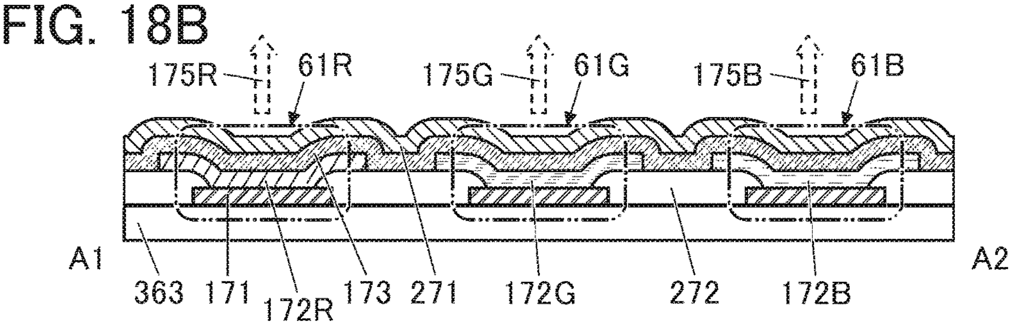

FIG. 18B is a cross-sectional schematic view taken along dashed-dotted line A1-A2 in FIG. 18A. FIG. 18B illustrates cross sections of the light-emitting element 61R, the light-emitting element 61G, and the light-emitting element 61B. The light-emitting element 61R, the light-emitting element 61G, and the light-emitting element 61B are provided over an insulating layer 363. The light-emitting element 61R, the light-emitting element 61G, and the light-emitting element 61B include the conductive layer 171 functioning as a pixel electrode and the conductive layer 173 functioning as a common electrode. As the insulating layer 363, one or both of an inorganic insulating film and an organic insulating film can be used. An inorganic insulating film is preferably used as the insulating layer 363. As the inorganic insulating film, for example, an oxide insulating film or a nitride insulating film such as a silicon oxide film, a silicon oxynitride film, a silicon nitride oxide film, a silicon nitride film, an aluminum oxide film, an aluminum oxynitride film, or a hafnium oxide film can be given.

The light-emitting element 61R includes an EL layer 172R between the conductive layer 171 functioning as a pixel electrode and the conductive layer 173 functioning as a common electrode. The EL layer 172R contains at least a light-emitting organic compound that emits light with intensity in a red wavelength range. An EL layer 172G included in the light-emitting element 61G contains at least a light-emitting organic compound that emits light with intensity in a green wavelength range. An EL layer 172B included in the light-emitting element 61B contains at least a light-emitting organic compound that emits light with intensity in a blue wavelength range.

The EL layer 172R, the EL layer 172G, and the EL layer 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided in each of the light-emitting elements. The conductive layer 173 functioning as a common electrode is provided as a continuous layer shared by the light-emitting elements. A conductive film having a light transmitting property with respect to visible light is used as either the conductive layer 171 functioning as a pixel electrode or the conductive layer 173 functioning as a common electrode, and a reflective conductive film is used as the other. When the conductive layer 171 functioning as a pixel electrode has a light-transmitting property and the conductive layer 173 functioning as a common electrode has a reflective property, a bottom-emission display apparatus can be obtained. Alternatively, when the conductive layer 171 functioning as a pixel electrode has a reflective property and the conductive layer 173 functioning as a common electrode has a light-transmitting property, a top-emission display apparatus can be obtained. Note that when both the conductive layer 171 functioning as a pixel electrode and the conductive layer 173 functioning as a common electrode have a light-transmitting property, a dual-emission display apparatus can be obtained.

For example, in the case where the light-emitting element 61R has a top-emission structure, light 175R is emitted from the light-emitting element 61R to the conductive layer 173 side. In the case where the light-emitting element 61G has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

An insulating layer 272 is provided to cover end portions of the conductive layer 171 functioning as a pixel electrode. An end portion of the insulating layer 272 is preferably tapered. For the insulating layer 272, a material similar to the material that can be used for the insulating layer 363 can be used.

The insulating layer 272 is provided to prevent an unintentional electric short-circuit between adjacent light-emitting elements 61 and unintended light emission. The insulating layer 272 also has a function of preventing the contact of a metal mask with the conductive layer 171 in the case where the metal mask is used to form the EL layer 172.

The EL layer 172R, the EL layer 172G, and the EL layer 172B each include a region in contact with the top surface of the conductive layer 171 functioning as a pixel electrode and a region in contact with a surface of the insulating layer 272. End portions of the EL layer 172R, the EL layer 172G, and the EL layer 172B are positioned over the insulating layer 272.

As illustrated in FIG. 18B, there is a gap between the EL layers of the light-emitting elements that exhibit two different colors. In this manner, the EL layer 172R, the EL layer 172G, and the EL layer 172B are preferably provided so as not to be in contact with each other. This can favorably prevent unintentional light emission (also referred to as crosstalk) from being caused by current flowing through two adjacent EL layers. As a result, the contrast can be increased, enabling the display apparatus to have high display quality.

The EL layer 172R, the EL layer 172G, and the EL layer 172B can be formed separately, for example, by a vacuum evaporation method or the like using a shadow mask, e.g., a metal mask. Alternatively, these layers may be formed separately by a photolithography method. The use of the photolithography method achieves a display apparatus with high definition, which is difficult to obtain in the case of using a metal mask.

In this specification and the like, a device fabricated using a metal mask or an FMM (fine metal mask, or high-definition metal mask) may be referred to as a device having an MM (metal mask) structure. In this specification and the like, a device fabricated without using a metal mask or an FMM may be referred to as a device having an MML (metal maskless) structure. A display apparatus having an MML structure is fabricated without using a metal mask and thus has higher flexibility in designing the pixel arrangement, the pixel shape, and the like than a display apparatus having an MM structure, for example.

A protective layer 271 is provided over the conductive layer 173 functioning as a common electrode so as to cover the light-emitting element 61R, the light-emitting element 61G, and the light-emitting element 61B. The protective layer 271 has a function of preventing diffusion of impurities such as, for example, water into the light-emitting elements from above.

The protective layer 271 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide (IGZO) may be used for the protective layer 271, for example. Note that the protective layer 271 is formed by an ALD method, a CVD method, or a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

In the case where an indium gallium zinc oxide is used as the protective layer 271, the indium gallium zinc oxide can be processed by a wet etching method or a dry etching method. For example, in the case where IGZO is used as the protective layer 271, a chemical solution of e.g., oxalic acid, phosphoric acid, a mixed chemical solution (e.g., a mixed chemical solution of phosphoric acid, acetic acid, nitric acid, and water, which is also referred to as a mixed acid aluminum etchant), or the like can be used for processing. Note that the volume ratio of phosphoric acid, acetic acid, nitric acid, and water mixed in the mixed acid aluminum etchant can be 53.3:6.7:3.3:36.7 or in the neighborhood thereof.

Figure 18C:
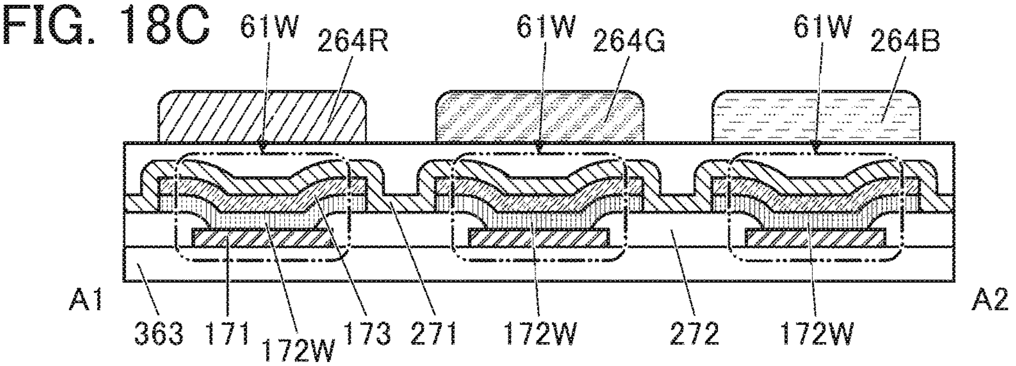

FIG. 18C illustrates an example different from the above example. Specifically, in FIG. 18C, the light-emitting element 61 includes light-emitting elements 61W that exhibits white light. The light-emitting elements 61W each include an EL layer 172W that exhibits white light between the conductive layer 171 functioning as a pixel electrode and the conductive layer 173 functioning as a common electrode.

The EL layer 172W can have, for example, a structure in which two light-emitting layers that are selected so as to emit light of complementary colors are stacked. It is also possible to use a stacked EL layer in which a charge-generation layer is interposed between light-emitting layers.

FIG. 18C illustrates three light-emitting elements 61W arranged side by side. A coloring layer 264R is provided above the light-emitting element 61W on the left. The coloring layer 264R functions as a band path filter that transmits red light. Similarly, a coloring layer 264G that transmits green light is provided above the light-emitting element 61W in the middle, and a coloring layer 264B that transmits blue light is provided above the light-emitting element 61W on the right. Thus, the display apparatus can display color images.

Here, the EL layer 172W and the conductive layer 173 functioning as a common electrode are each separated between two adjacent light-emitting elements 61W. This can prevent unintentional light emission from being caused by current flowing through the EL layers 172W of two adjacent light-emitting elements 61W. Particularly when a stacked EL layer in which a charge-generation layer is provided between two light-emitting layers is used as the EL layer 172W, in the display apparatus including the EL layer, a higher definition, i.e., a smaller distance between adjacent pixels makes the effect of crosstalk more significant, leading to lower contrast. Thus, the above structure can achieve a display apparatus having both high definition and high contrast.

The EL layer 172W and the conductive layer 173 functioning as a common electrode are each preferably separated by a photolithography method. This can decrease the distance between light-emitting elements. Thus, the display apparatus can have a high aperture ratio compared with the case of using a shadow mask, e.g., a metal mask.

Note that in the case of a bottom-emission light-emitting element, a coloring layer may be provided between the conductive layer 171 functioning as a pixel electrode and the insulating layer 363.

Figure 18D:
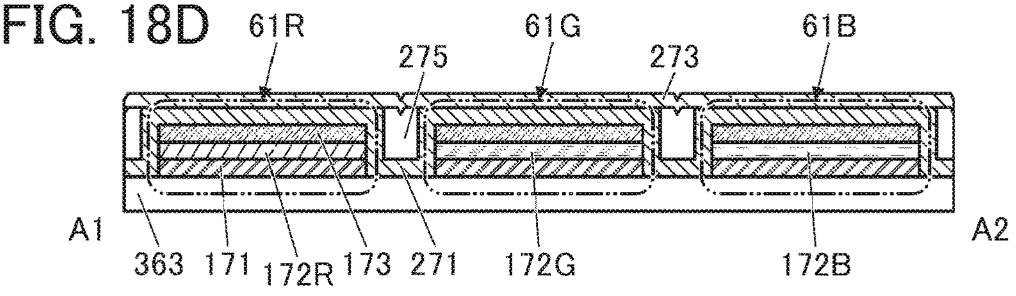

FIG. 18D illustrates an example different from the above example. Specifically, in FIG. 18D, the insulating layers 272 are not provided between the light-emitting element 61R, the light-emitting element 61G, and the light-emitting element 61B. With such a structure, the display apparatus can have a high aperture ratio. When the insulating layer 272 is not provided, unevenness formed by the light-emitting elements 61 can be reduced, thereby the display apparatus can have a wide viewing angle. Specifically, the viewing angle of the display apparatus can be greater than or equal to 150° and less than 180°, preferably greater than or equal to 1600 and less than 180°, further preferably greater than or equal to 1600 and less than 180°.

The protective layer 271 covers side surfaces of the EL layer 172R, the EL layer 172G, and the EL layer 172B. This structure can reduce impurities (e.g., water) that might enter the EL layer 172R, the EL layer 172G, and the EL layer 172B through their side surfaces. Thus, leakage current between adjacent light-emitting elements 61 is reduced. Accordingly, color saturation and contrast ratio of the display apparatus are improved and power consumption is reduced.

In the structure illustrated in FIG. 18D, the top shapes of the conductive layer 171, the EL layer 172R, and the conductive layer 173 are substantially the same. This structure can be formed in the following manner: the conductive layer 171, the EL layer 172R, and the conductive layer 173 are formed and collectively processed using a resist mask or the like, for example. In this process, the EL layer 172R and the conductive layer 173 are processed using the conductive layer 173 as a mask, and thus this process can be called self-alignment patterning. Although the EL layer 172R is described here, the EL layer 172G and the EL layer 172B can each have a similar structure.

In FIG. 18D, a protective layer 273 is further provided over the protective layer 271. For example, the protective layer 271 is formed with an apparatus that can deposit a film with excellent coverage (e.g., an ALD apparatus), and the protective layer 273 is formed with an apparatus that can deposit a film with coverage inferior to that of the protective layer 271 (e.g., a sputtering apparatus). By the formation of the protective layer 271 and the protective layer 273, a region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, one or more of air, nitrogen, oxygen, carbon dioxide, and Group 18 elements (e.g., helium, neon, argon, xenon, krypton, and the like). Furthermore, for example, a gas used during deposition of the protective layer 273 is sometimes included in the region 275. For example, in the case where the protective layer 273 is deposited using a sputtering method, any one or more of the above-described Group 18 elements is sometimes included in the region 275. In the case where a gas is included in the region 275, the gas can be identified with a gas chromatography method or the like. Alternatively, in the case where the protective layer 273 is deposited using a sputtering method, a gas used in the sputtering is sometimes contained in the protective layer 273. In this case, for example, an element such as argon is sometimes detected when the protective layer 273 is analyzed by an energy dispersive X-ray analysis (EDX analysis) or the like, for example.

In the case where the refractive index of the region 275 is lower than the refractive index of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be inhibited from entering an adjacent pixel in some cases. This can inhibit color mixture of light emitted from adjacent pixels and thus can increase the display quality of the display apparatus.

In the case of the structure illustrated in FIG. 18D, a region between the light-emitting element 61R and the light-emitting element 61G or a region between the light-emitting element 61G and the light-emitting element 61B (hereinafter, simply referred to as a distance between the light-emitting elements) can be small. Specifically, the distance between the light-emitting elements can be less than or equal to 1 m, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where a distance between the side surface of the EL layer 172R and the side surface of the EL layer 172G or a distance between the side surface of the EL layer 172G and the side surface of the EL layer 172B is less than or equal to 1 m, preferably less than or equal to 0.5 m (500 nm), further preferably less than or equal to 100 nm.

In the case where the region 275 includes a gas, for example, the light-emitting elements can be separated from each other and color mixture of light, crosstalk, or the like between the light-emitting elements can be inhibited.

Alternatively, the region 275 may be filled with a filler. Examples of the filler include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the filler. The photoresist used as the filler may be a positive photoresist or a negative photoresist.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the manufacturing process of the white-light-emitting device is simpler than that of a light-emitting device having an SBS structure. Thus, the manufacturing cost can be reduced or the manufacturing yield can be increased.

Figure 19A:
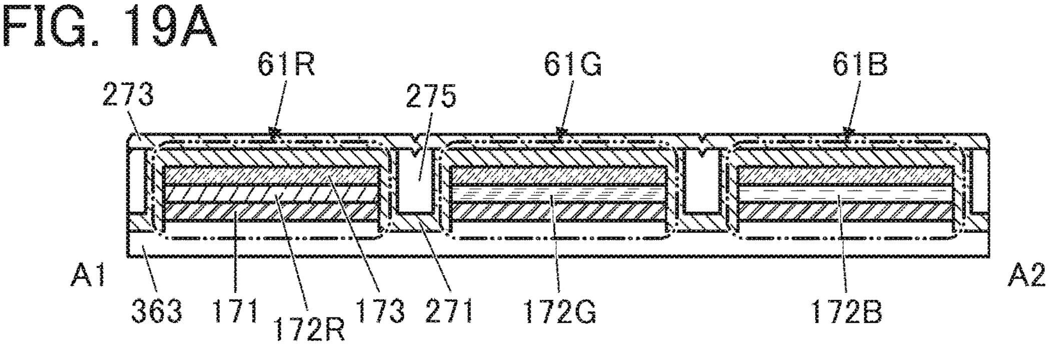
FIG. 19A to FIG. 19D are diagrams illustrating structure examples of a light-emitting element.

FIG. 19A illustrates an example different from the above example. Specifically, the structure illustrated in FIG. 19A is different from the structure illustrated in FIG. 18D in the structure of the insulating layer 363. The insulating layer 363 has a depression portion in its top surface that is formed by being partially etched when the light-emitting element 61R, the light-emitting element 61G, and the light-emitting element 61B are processed. In addition, the protective layer 271 is formed in the depressed portion. In other words, in the cross-sectional view, there is a region in which the bottom surface of the protective layer 271 is positioned below the bottom surface of the conductive layer 171. With the region, impurities (e.g., water) can be suitably inhibited from entering the light-emitting element 61R, the light-emitting element 61G, and the light-emitting element 61B from the bottom. It is likely that the depression portion can be formed when impurities (also referred to as residue) that could be attached to side surfaces of the light-emitting element 61R, the light-emitting element 61G, and the light-emitting element 61B in processing of the light-emitting elements are removed by wet etching or the like, for example. After the residue is removed, the side surfaces of the light-emitting elements are covered with the protective layer 271, whereby the display apparatus can have high reliability.

Figure 19B:
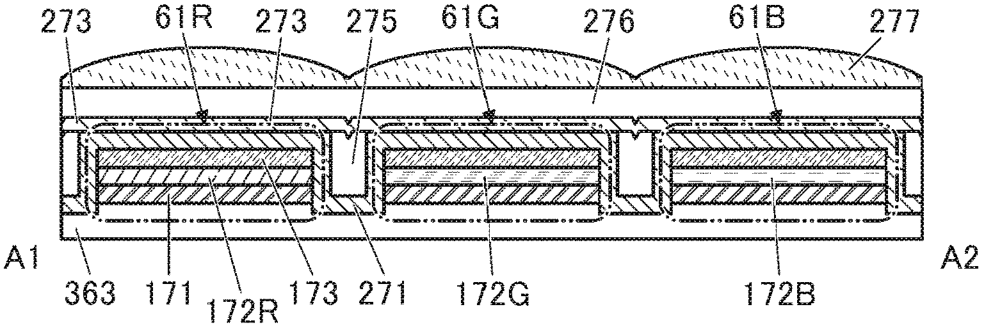

FIG. 19B illustrates an example different from the above example. Specifically, the structure illustrated in FIG. 19B includes an insulating layer 276 and a microlens array 277 in addition to the structure illustrated in FIG. 19A. The insulating layer 276 has a function of an adhesive layer. Note that when the refractive index of the insulating layer 276 is lower than the refractive index of the microlens array 277, the microlens array 277 can condense light emitted from the light-emitting element 61R, the light-emitting element 61G, and the light-emitting element 61B. This can increase the light extraction efficiency of the display apparatus. In particular, this is suitable, because a user can see bright images when the user sees the display surface from the front of the display surface of the display apparatus. As the insulating layer 276, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable, for example. A two-liquid-mixture-type resin may be used. An adhesive sheet may be used, for example.

Figure 19C:
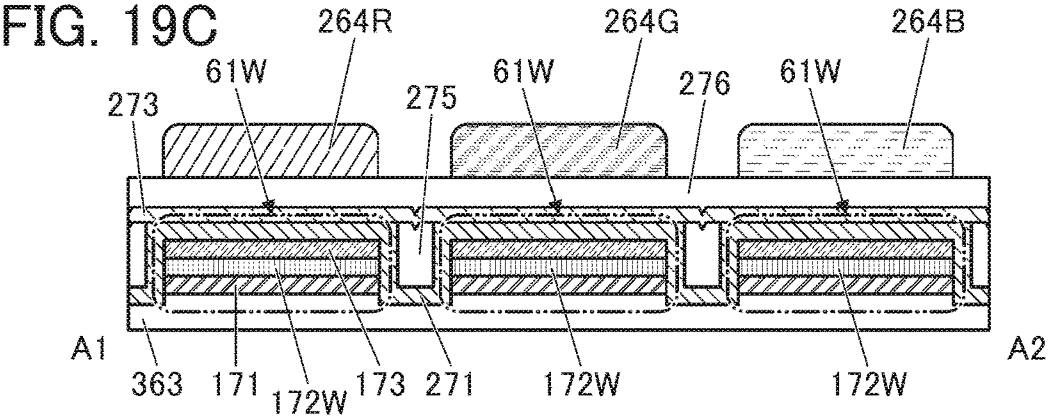

FIG. 19C illustrates an example different from the above example. Specifically, the structure illustrated in FIG. 19C includes three light-emitting elements 61W instead of the light-emitting element 61R, the light-emitting element 61G, and the light-emitting element 61B in the structure illustrated in FIG. 19A. In addition, the structure includes the insulating layer 276 over the three light-emitting elements 61W. The structure also includes the coloring layer 264R, the coloring layer 264G, and the coloring layer 264B over the insulating layer 276. Specifically, the coloring layer 264R that transmits red light is provided at a position overlapping with the light-emitting element 61W on the left, the coloring layer 264G that transmits green light is provided at a position overlapping with the light-emitting element 61W in the middle, and the coloring layer 264B that transmits blue light is provided at a position overlapping with the light-emitting element 61W on the right. In this manner, the display apparatus can display color images. The structure illustrated in FIG. 19C is also a modification example of the structure illustrated in FIG. 18C.

Figure 19D:
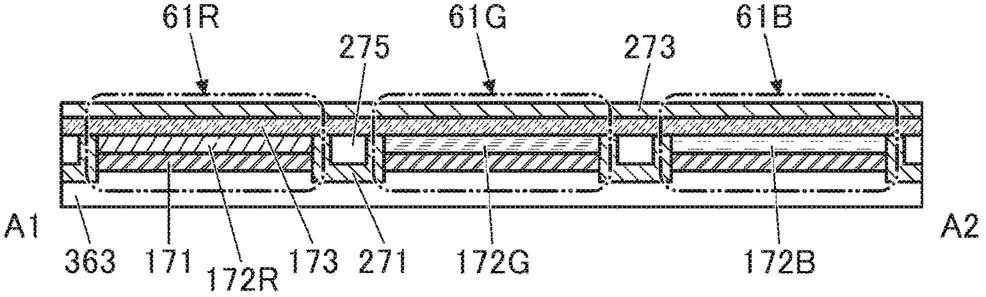

FIG. 19D illustrates an example different from the above example. Specifically, in the structure illustrated in FIG. 19D, the protective layer 271 is provided adjacent to side surfaces of the conductive layer 171 and the EL layer 172. The conductive layer 173 is provided as a continuous layer shared by the light-emitting elements. In the structure illustrated in FIG. 19D, the region 275 is preferably filled with a filler.

A color purity of the emission color can be increased when the light-emitting element 61 has a micro-optical resonator (microcavity) structure. In the case where the light-emitting element 61 has a microcavity structure, the light-emitting element 61 may be configured in such a manner that a product of a distance d between the conductive layer 171 and the conductive layer 173 and a refractive index n of the EL layer 172 (optical distance) is set to m times as large as ½ of a wavelength λ (m is an integer greater than or equal to 1). The distance d can be obtained by Formula 1.

$$d=m\times\lambda(2\times n) \quad \text{(Formula 1)}$$

According to Formula 1, in the light-emitting element 61 having the microcavity structure, the distance d is determined in accordance with the wavelength (emission color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G, in some cases.

Note that to be exact, the distance d is a distance from a reflection region in the conductive layer 171 functioning as a reflective electrode to a reflection region in the conductive layer 173 functioning as a transflective electrode. For example, in the case where the conductive layer 171 is a stack of silver and ITO that is a transparent conductive film and the ITO is positioned on the EL layer 172 side, the distance d suitable for the emission color can be set by adjusting the thickness of the ITO. That is, even when the EL layer 172R, the EL layer 172G, and the EL layer 172B have the same thickness, the distance d suitable for the emission color can be obtained by adjusting the thickness of the ITO.

However, it is sometimes difficult to determine the exact position of the reflection region in each of the conductive layer 171 and the conductive layer 173. In that case, the light-emitting element 61 can obtain a sufficient effect of the microcavity, supposed that a certain position in each of the conductive layer 171 and the conductive layer 173 serves as the reflective region.

The light-emitting element 61 includes a hole-injection layer, a hole-transport layer, a light-emitting layer, an electron-transport layer, an electron-injection layer, and the like, for example. Note that a specific structure example of the light-emitting element 61 will be described in another embodiment. In order to increase the light extraction efficiency in the microcavity structure, the optical path length from the conductive layer 171 functioning as a reflective electrode to the light-emitting layer is preferably set to an odd multiple of $\lambda/4$. In order to achieve this optical path length, the thicknesses of the layers included in the light-emitting element 61 are preferably adjusted as appropriate.

In the case where light is emitted from the conductive layer 173 side, the light reflectance of the conductive layer 173 is preferably higher than the light transmittance thereof. The light transmittance of the conductive layer 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductive layer 173 is set low (the light reflectance is set high), the effect of the microcavity can be enhanced.

Figure 20A:
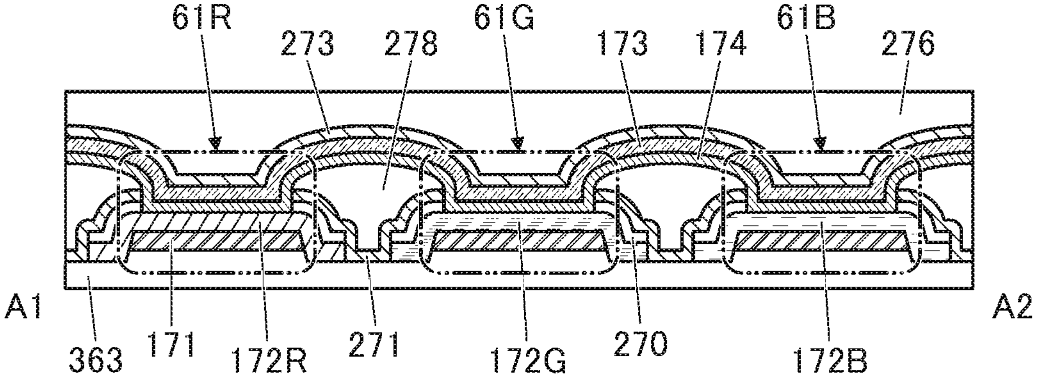
FIG. 20A and FIG. 20B are diagrams illustrating structure examples of a light-emitting element.

FIG. 20A illustrates an example different from the above example. Specifically, in the structure illustrated in FIG. 20A, the EL layer 172 extends beyond the end portions of the conductive layer 171 in each of the light-emitting element 61R, the light-emitting element 61G, and the light-emitting element 61B. For example, in the light-emitting element 61R, the EL layer 172R extends beyond the end portions of the conductive layer 171. In the light-emitting element 61G, the EL layer 172G extends beyond the end portions of the conductive layer 171. In the light-emitting element 61B, the EL layer 172B extends beyond the end portions of the conductive layer 171.

The light-emitting element 61R, the light-emitting element 61G, and the light-emitting element 61B each include a region where the EL layer 172 overlaps with the protective layer 271 with an insulating layer 270 therebetween. In a region between adjacent light-emitting elements 61, an insulating layer 278 is provided over the protective layer 271.

Examples of the insulating layer 278 include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the insulating layer 278. The photoresist used as the insulating layer 278 may be a positive photoresist or a negative photoresist.

A common layer 174 is provided over the light-emitting element 61R, the light-emitting element 61G, the light-emitting element 61B, and the insulating layer 278, and the conductive layer 173 is provided over the common layer 174. The common layer 174 includes a region in contact with the EL layer 172R, a region in contact with the EL layer 172G, and a region in contact with the EL layer 172B. The common layer 174 is shared by the light-emitting element 61R, the light-emitting element 61G, and the light-emitting element 61B.

As the common layer 174, one or more of a hole-injection layer, a hole-transport layer, a hole-blocking layer, an electron-blocking layer, an electron-transport layer, and an electron-injection layer can be used. For example, the common layer 174 may be a carrier-injection layer (a hole-injection layer or an electron-injection layer). The common layer 174 can also be regarded as part of the EL layer 172. Note that the common layer 174 is provided as necessary. In the case where the common layer 174 is provided, a layer having the same function as the common layer 174 among the layers included in the EL layer 172 is not necessarily provided.

The protective layer 273 is provided over the conductive layer 173, and the insulating layer 276 is provided over the protective layer 273.

Figure 20B:
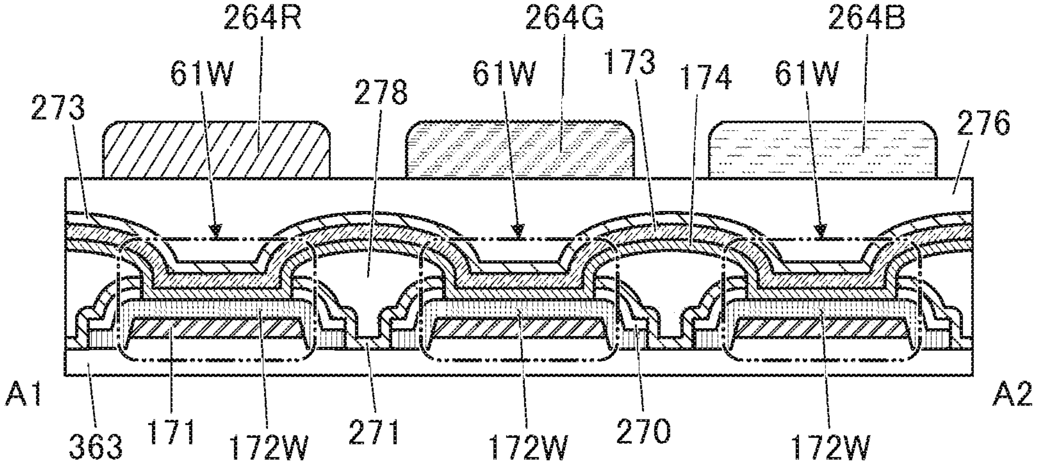

FIG. 20B illustrates an example different from the above example. Specifically, the structure illustrated in FIG. 20B includes three light-emitting elements 61W instead of the light-emitting element 61R, the light-emitting element 61G, and the light-emitting element 61B in the structure illustrated in FIG. 20A. In addition, the structure includes the insulating layer 276 over the three light-emitting elements 61W. The structure also includes the coloring layer 264R, the coloring layer 264G, and the coloring layer 264B over the insulating layer 276. Specifically, the coloring layer 264R that transmits red light is provided at a position overlapping with the light-emitting element 61W on the left, the coloring layer 264G that transmits green light is provided at a position overlapping with the light-emitting element 61W in the middle, and the coloring layer 264B that transmits blue light is provided at a position overlapping with the light-emitting element 61W on the right. This enables the semiconductor device to display color images. The structure illustrated in FIG. 20B is also a modification example of the structure illustrated in FIG. 19C.

Figure 21A:
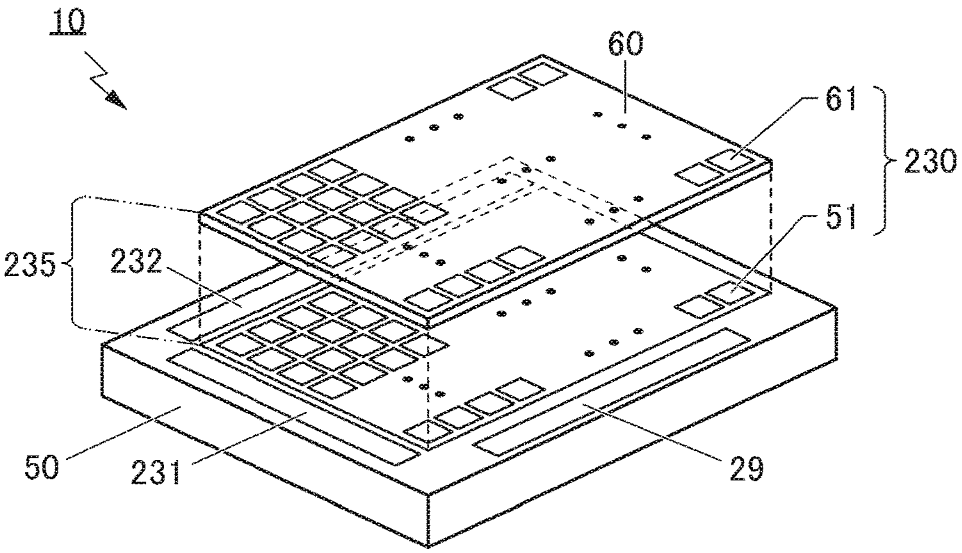
FIG. 21A and FIG. 21B are perspective views illustrating examples of a display apparatus.

FIG. 21A illustrates a perspective view of the display apparatus 10. The display apparatus 10 illustrated in FIG. 21A includes a layer 60 overlapping with a layer 50. The layer 50 includes a plurality of pixel circuits 51 arranged in a matrix, the first driver circuit portion 231, the second driver circuit portion 232, and an input/output terminal portion 29. The layer 60 includes the plurality of light-emitting elements 61 arranged in a matrix.

One pixel circuit 51 and one light-emitting element 61 are electrically connected to each other and function as one pixel 230. Thus, a region where the plurality of pixel circuits 51 included in the layer 50 and the plurality of light-emitting elements 61 included in the layer 60 overlap with each other functions as the display region 235.

For example, power, a signal, and the like necessary for the operation of the display apparatus 10 are supplied to the display apparatus 10 through the input/output terminal portion 29. In the display apparatus 10 illustrated in FIG. 21A, the transistors included in the peripheral driver circuit can be formed in the same steps as the transistors included in the pixels 230.

Figure 21B:
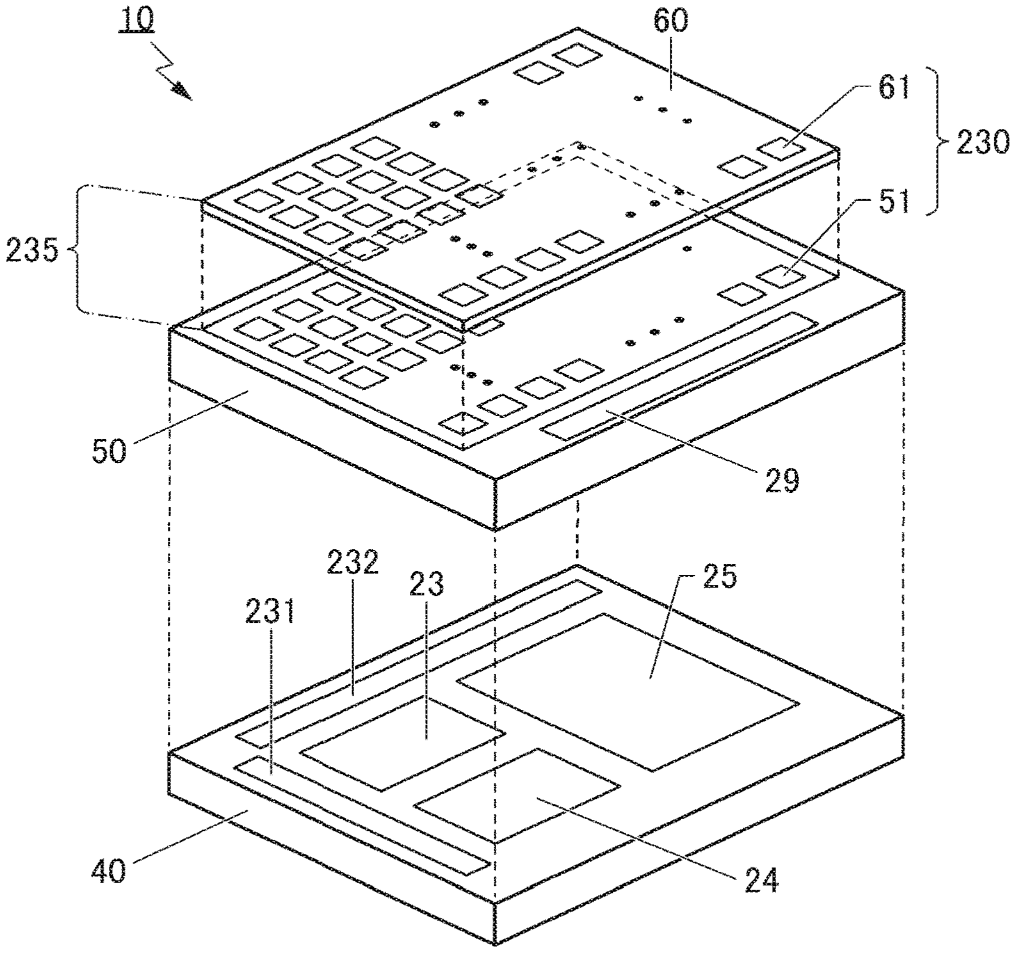

The display apparatus 10 may have a structure illustrated in FIG. 21B in which a layer 40, the layer 50, and the layer 60 are provided to overlap with one another. In the display apparatus 10 in FIG. 21B, the plurality of pixel circuits 51 arranged in a matrix are provided in the layer 50, and the first driver circuit portion 231 and the second driver circuit portion 232 are provided in the layer 40. By providing the first driver circuit portion 231 and the second driver circuit portion 232 in a layer different from that of the pixel circuit 51 in the display apparatus 10 illustrated in FIG. 21B, the bezel width around the display region 235 can be small; thus, the area occupied by the display region 235 can be increased.

With the increase in the occupied area of the display region 235, the display apparatus 10 can have increased resolution. Under a fixed resolution of the display region 235 in the display apparatus 10, the occupied area per pixel can be increased; thus, the emission luminance can be increased. In addition, the proportion of the light-emitting area to the area occupied by one pixel (also referred to as "aperture ratio") can be increased by enlarging the area occupied by one pixel. For example, the pixel aperture ratio can be higher than or equal to 40% and lower than 100%, preferably higher than or equal to 50% and lower than or equal to 95%, further preferably higher than or equal to 60% and lower than or equal to 95%. An increase in the occupied area per pixel can lower the density of current supplied to the light-emitting elements 61. Thus, a load applied to the light-emitting element 61 is reduced. Thus, the reliability of the semiconductor device 100 can be increased. Thus, the reliability of the display apparatus 10 including the semiconductor device 100 can be increased.

Stacking the display region 235 and, for example, the peripheral driver circuit can shorten a wiring electrically connecting them, for example. Thus, wiring resistance and parasitic capacitance are reduced. Moreover, the semiconductor device 100 can have a higher operation speed. The semiconductor device 100 is reduced in power consumption.

The layer 40 may include a CPU 23 (Central Processing Unit), a GPU 24 (Graphics Processing Unit), and a memory circuit portion 25, in addition to the peripheral driver circuit. In this embodiment and the like, a peripheral driver circuit, the CPU 23, the GPU 24, and the memory circuit portion 25 are collectively referred to as a "functional circuit" in some cases.

For example, the CPU 23 has a function of controlling the operations of the GPU 24 and the circuits provided in the layer 40 in accordance with a program stored in the memory circuit portion 25. The GPU 24 has a function of performing arithmetic processing for generating image data. Furthermore, the GPU 24 can perform a large number of matrix operations (product-sum operations) in parallel and thus can perform arithmetic processing using a neural network at high speed, for example. The GPU 24 has a function of correcting image data using correction data stored in the memory circuit portion 25, for example. The GPU 24 has a function of generating image data in which brightness, hue, contrast, or the like is corrected, for example.

Upconversion or downconversion of image data may be performed using the GPU 24 in the display apparatus 10. A super-resolution circuit may be provided in the layer 40 in the display apparatus 10. The super-resolution circuit has a function of determining a potential of any pixel included in the display region 235 by product-sum operation of weights and potentials of pixels placed in the periphery of the pixel. The super-resolution circuit has a function of upconverting image data with a resolution lower than that of the display region 235. The super-resolution circuit has a function of downconverting image data with a resolution higher than that of the display region 235.

Providing the super-resolution circuit can reduce the load on the GPU 24 in the display apparatus 10. For example, the GPU 24 executes processing up to 2K resolution (or 4K resolution) and the super-resolution circuit performs upconversion to 4K resolution (or 8K resolution), whereby the load on the GPU 24 can be reduced. Downconversion may be performed in a similar manner.

Note that the functional circuit included in the layer 40 does not necessarily include all of these components, and may include another component. For example, a potential generation circuit that generates a plurality of different potentials, a power management circuit that controls supply and stop of power for each circuit included in the display apparatus 10, or the like may be provided.

The supply or stop of power may be performed per circuit included in the CPU 23. For example, power consumption of the CPU 23 can be reduced by stopping power supply to a circuit, which is determined not to be used for a while, of the circuits included in the CPU 23 and restarting power supply to the circuit as needed. Data necessary for restarting power supply is stored in, for example, a memory circuit in the CPU 23, the memory circuit portion 25, or the like before the circuit is stopped. Data necessary for recovery of the circuit is stored in, for example, the memory circuit in the CPU 23, the memory circuit portion 25, or the like, whereby high-speed recovery of the circuit stopped can be achieved. Note that supply of a clock signal may be stopped in the CPU 23 to stop the circuit operation.

As the functional circuit, a DSP circuit, a sensor circuit, a communication circuit, an FPGA (Field Programmable Gate Array), and the like may be included, for example.

Some of the transistors included in the functional circuit included in the layer 40 may be provided in the layer 50. Some of the transistors included in the pixel circuit 51 included in the layer 50 may be provided in the layer 40. Thus, the functional circuit may include a Si transistor and an OS transistor. The pixel circuit 51 may include a Si transistor and an OS transistor.

Figure 22:
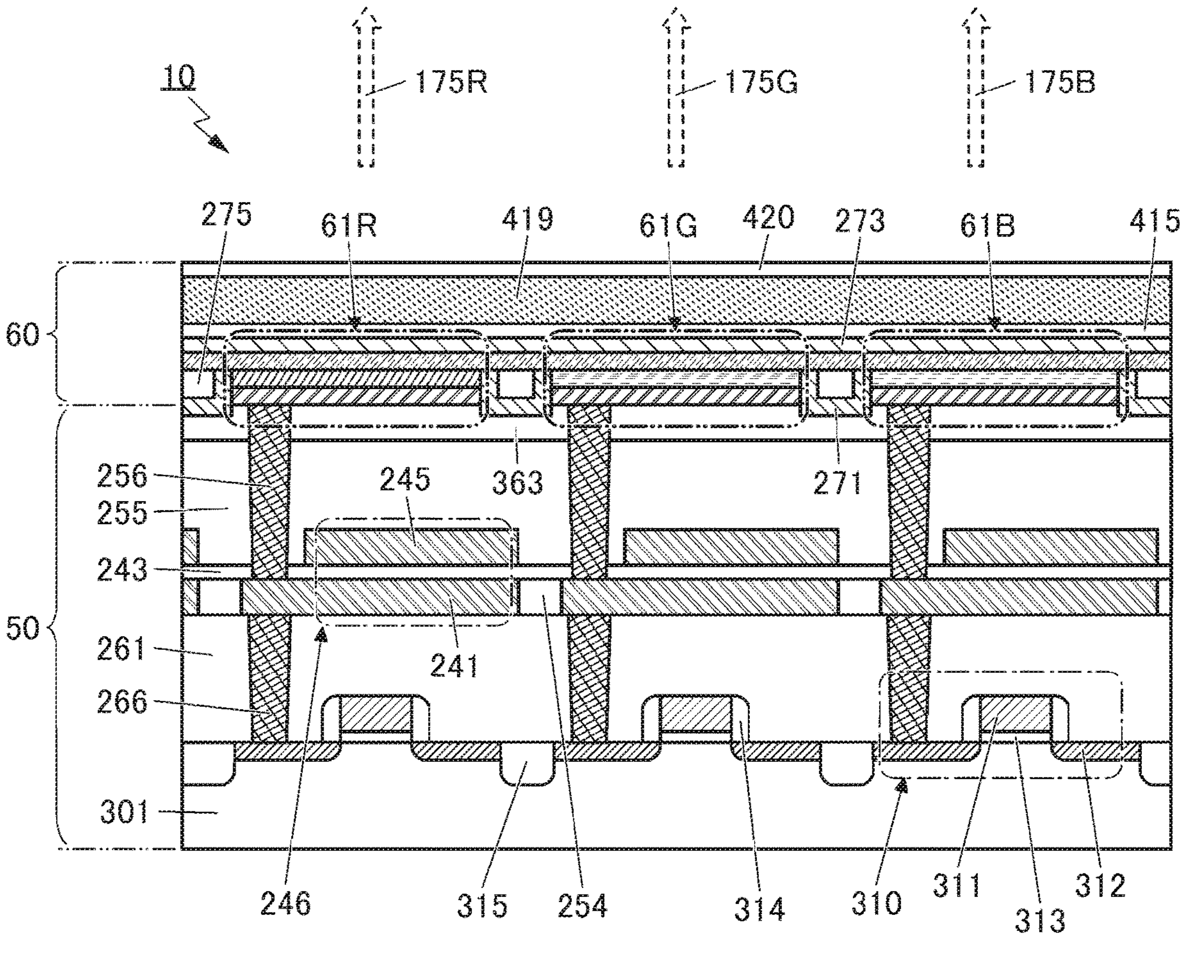
FIG. 22 is a cross-sectional view illustrating an example of a display apparatus.

FIG. 22 illustrates a cross-sectional structure example of part of the display apparatus 10 illustrated in FIG. 21A. The display apparatus 10 illustrated in FIG. 22 includes the layer 50 including a substrate 301, a capacitor 246, and a transistor 310 and the layer 60 including the light-emitting element 61R, the light-emitting element 61G, and the light-emitting element 61B. The layer 60 is provided over the insulating layer 363 included in the layer 50.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover side surface of the conductive layer 311 and functions as an insulating layer.

In addition, an element isolation layer 315 is provided between two adjacent transistors 310 to be embedded in the substrate 301.

An insulating layer 261 is provided to cover the transistor 310, and the capacitor 246 is provided over the insulating layer 261.

The capacitor 246 includes a conductive layer 241, a conductive layer 245, and an insulating layer 243 positioned therebetween. The conductive layer 241 functions as one electrode of the capacitor 246, the conductive layer 245 functions as the other electrode of the capacitor 246, and the insulating layer 243 functions as a dielectric of the capacitor 246.

The conductive layer 241 is provided over the insulating layer 261 and is embedded in an insulating layer 254. The conductive layer 241 is electrically connected to one of a source and a drain of the transistor 310 through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246, the insulating layer 363 is provided over the insulating layer 255, and the light-emitting element 61R, the light-emitting element 61G, and the light-emitting element 61B are provided over the insulating layer 363. A protective layer 415 is provided over the light-emitting element 61R, the light-emitting element 61G, and the light-emitting element 61B, and a substrate 420 is provided over the top surface of the protective layer 415 with a resin layer 419 therebetween.

The pixel electrode of the light-emitting element is electrically connected to the one of the source and the drain of the transistor 310 through a plug 256 embedded in the insulating layer 243, the insulating layer 255, and the insulating layer 363, the conductive layer 241 embedded in the insulating layer 254, and the plug 266 embedded in the insulating layer 261.

Figure 23:
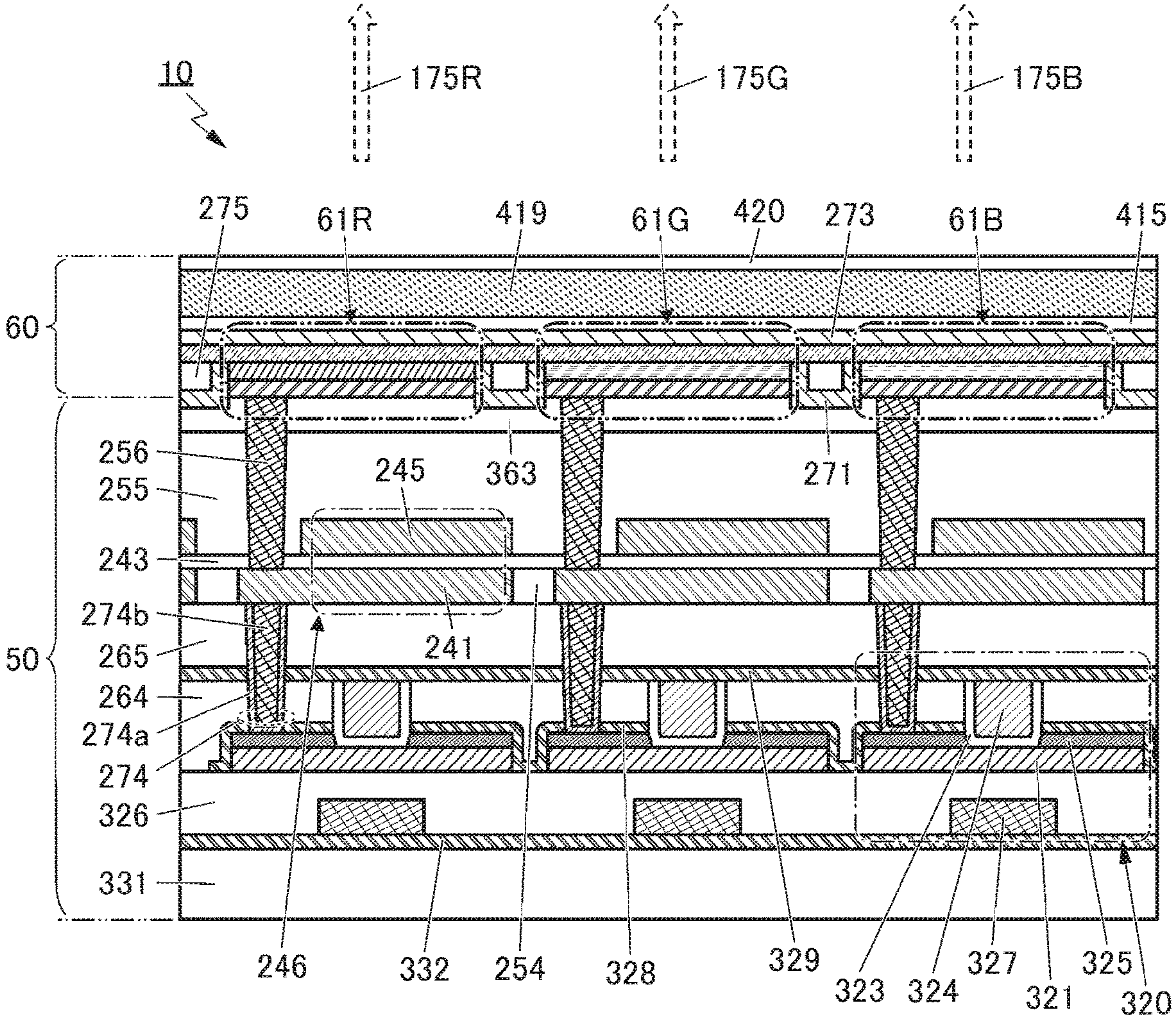
FIG. 23 is a cross-sectional view illustrating an example of a display apparatus.

FIG. 23 illustrates a modification example of the cross-sectional structure example illustrated in FIG. 22. The cross-sectional structure example of the display apparatus 10 illustrated in FIG. 23 is different from the cross-sectional structure example illustrated in FIG. 22 mainly in that a transistor 320 is provided instead of the transistor 310. Note that description of portions similar to those in FIG. 22 is sometimes omitted.

The transistor 320 is a transistor that includes a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

As a substrate 331, an insulating substrate or a semiconductor substrate can be used.

An insulating layer 332 is provided over the substrate 331. The insulating layer 332 functions, for example, as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a second gate electrode of the transistor 320, and part of the insulating layer 326 functions as a second gate insulating layer. An oxide insulating film such as a silicon oxide film is preferably used as at least part of the insulating layer 326 that is in contact with the semiconductor layer 321, for example. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. Materials that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover the top surface and a side surface of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321 and the conductive layer 324 are embedded in the opening. The conductive layer 324 functions as a first gate electrode, and the insulating layer 323 functions as a first gate insulating layer.

The top surface of the conductive layer 324, the top surface of the insulating layer 323, and the top surface of the insulating layer 264 are planarized such that they are substantially level with each other. The insulating layer 329 and the insulating layer 265 are provided to cover these layers.

The insulating layer 264 and the insulating layer 265 each function as an interlayer insulating layer. The insulating layer 329 functions as a barrier layer that prevents diffusion of e.g., impurities such as water and hydrogen from e.g., the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers side surfaces of each opening formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. In that case, a conductive material in which hydrogen and oxygen are less likely to diffuse is preferably used for the conductive layer 274*a*.

Figure 24:
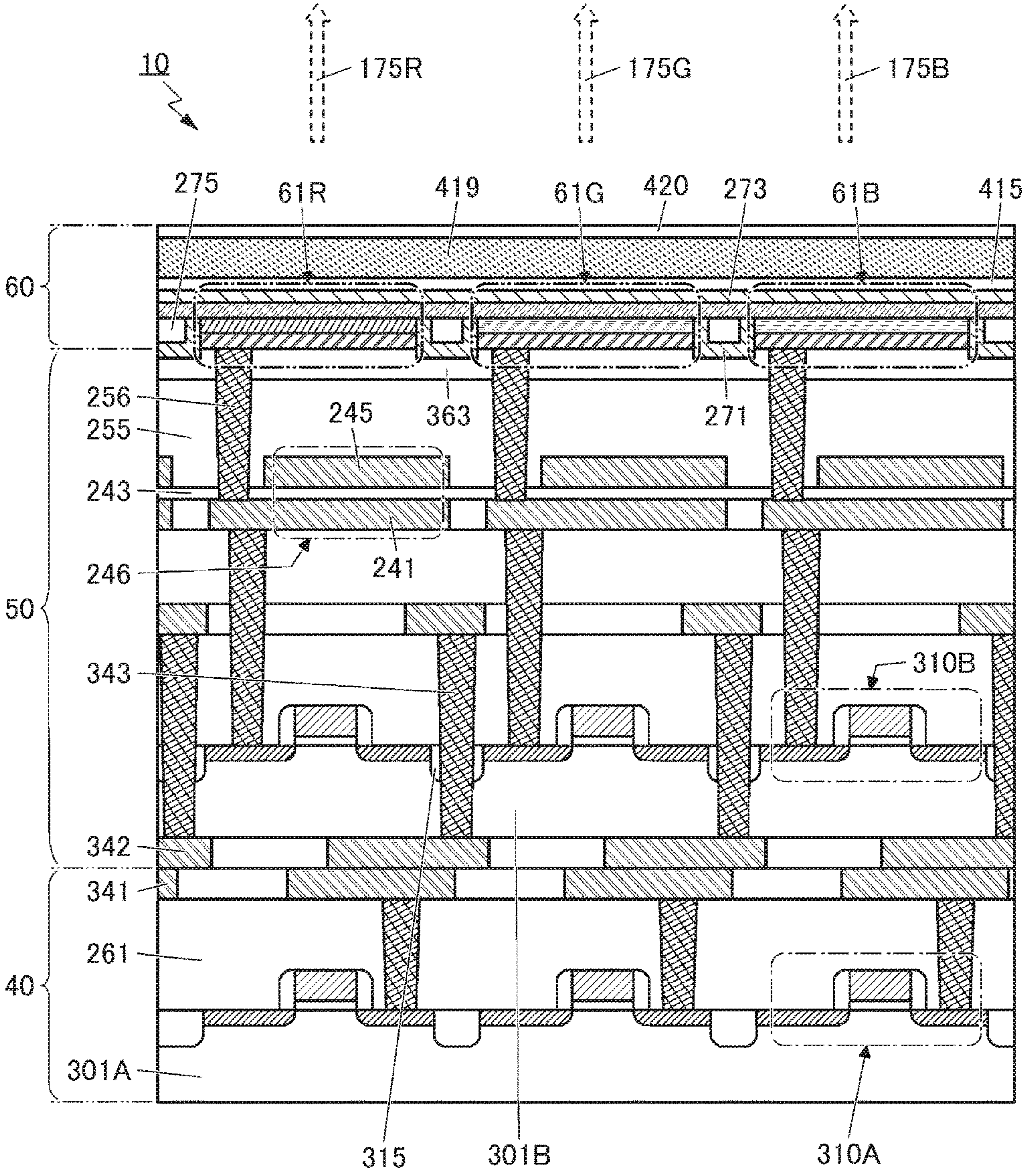
FIG. 24 is a cross-sectional view illustrating an example of a display apparatus.

FIG. 24 illustrates a cross-sectional structure example of part of the display apparatus 10 illustrated in FIG. 21B. The display apparatus 10 illustrated in FIG. 24 has a structure in which a transistor 310A whose channel is formed in a substrate 301A included in the layer 40 and a transistor 310B whose channel is formed in a substrate 301B included in the layer 50 are stacked. A material similar to that of the substrate 301 can be used for the substrate 301A.

The display apparatus 10 illustrated in FIG. 24 has a structure in which the layer 50 including the substrate 301B, the transistor 310B, and the capacitor 246 and the layer 40 including the substrate 301A and the transistor 310A are attached to each other and the layer 60 is provided over the insulating layer 363 included in the layer 50.

The substrate 301B is provided with a plug 343 that penetrates the substrate 301B. The plug 343 functions as a Si through electrode (TSV: Through Silicon Via). The plug 343 is electrically connected to a conductive layer 342 provided on the rear surface (the surface that is opposite to the substrate 420 side) of the substrate 301B. Meanwhile, a conductive layer 341 is provided over the insulating layer 261 over the substrate 301A.

The conductive layer 341 and the conductive layer 342 are bonded to each other, whereby the layer 40 and the layer 50 are electrically connected to each other.

The same conductive material is preferably used for the conductive layer 341 and the conductive layer 342. For example, a metal film containing an element selected from Al, Cr, Cu, Ta, Sn, Zn, Au, Ag, Pt, Ti, Mo, and W, a metal nitride film containing the above element as its component (a titanium nitride film, a molybdenum nitride film, or a tungsten nitride film), or the like can be used. Copper is particularly preferably used for the conductive layer 341 and the conductive layer 342. In that case, it is possible to employ Cu—Cu (copper-copper) direct bonding (a technique for achieving electrical continuity by connecting Cu (copper) pads) for bonding between the conductive layer 341 and the conductive layer 342. Note that the conductive layer 341 and the conductive layer 342 may be bonded to each other with a bump therebetween.

Figure 25:
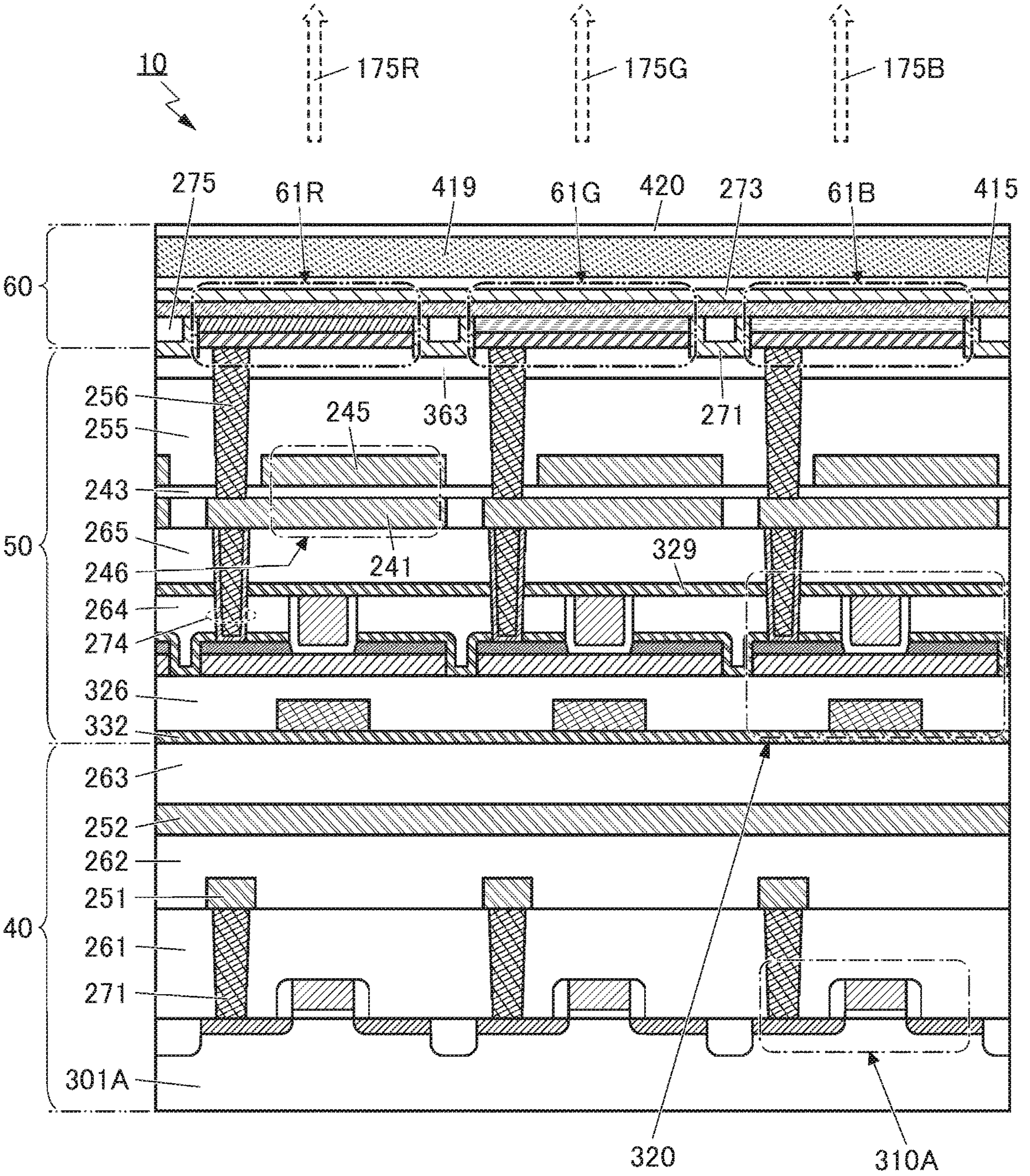
FIG. 25 is a cross-sectional view illustrating an example of a display apparatus.

FIG. 25 illustrates a modification example of the cross-sectional structure example illustrated in FIG. 24. In the cross-sectional structure example of the display apparatus 10 illustrated in FIG. 25, the transistor 310A whose channel is formed in the substrate 301A and the transistor 320 including a metal oxide in the semiconductor layer where the channel is formed are stacked. Note that portions similar to those in FIG. 22 to FIG. 24 are not described in some cases.

The layer 50 illustrated in FIG. 25 has a structure in which the substrate 331 is removed from the layer 50 illustrated in FIG. 23. In the layer 40 illustrated in FIG. 25, the insulating layer 261 is provided to cover the transistor 310A, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 246 is provided over the insulating layer 265. The capacitor 246 and the transistor 320 are electrically connected to each other through the plug 274. The layer 50 is provided to overlap with the insulating layer 263 included in the layer 40.

The transistor 320 can be used as transistors included in the pixel circuits 51. The transistor 310 can be used as the transistors included in the pixel circuits 51 or transistors included in the peripheral driver circuit. The transistor 310 and the transistor 320 can also be used as transistors included in a functional circuit such as an arithmetic circuit or a memory circuit, for example.

With such a structure, not only the pixel circuits 51 but also the peripheral driver circuit or the like can be formed directly under the layer 60 including the light-emitting element 61, for example. Thus, the display apparatus can be downsized as compared with the case where a driver circuit is provided around a display region.

<Structure example of light-emitting element (case of light-emitting diode)>

Note that the light-emitting element that can be used in the semiconductor device of one embodiment of the present invention is not limited to the structure with the EL layer as illustrated in FIG. 17A. As the light-emitting element, any of a variety of display elements such as an EL element (an EL element containing an organic substance and an inorganic substance, an organic EL element, and an inorganic EL element), a light-emitting diode (LED), a micro LED (e.g., an LED with a side of less than 0.1 mm), a QLED (Quantum-dot Light Emitting Diode), and an electron emitter element can be used, for example. For example, a light-emitting diode may be used as the light-emitting element.

Figure 26:
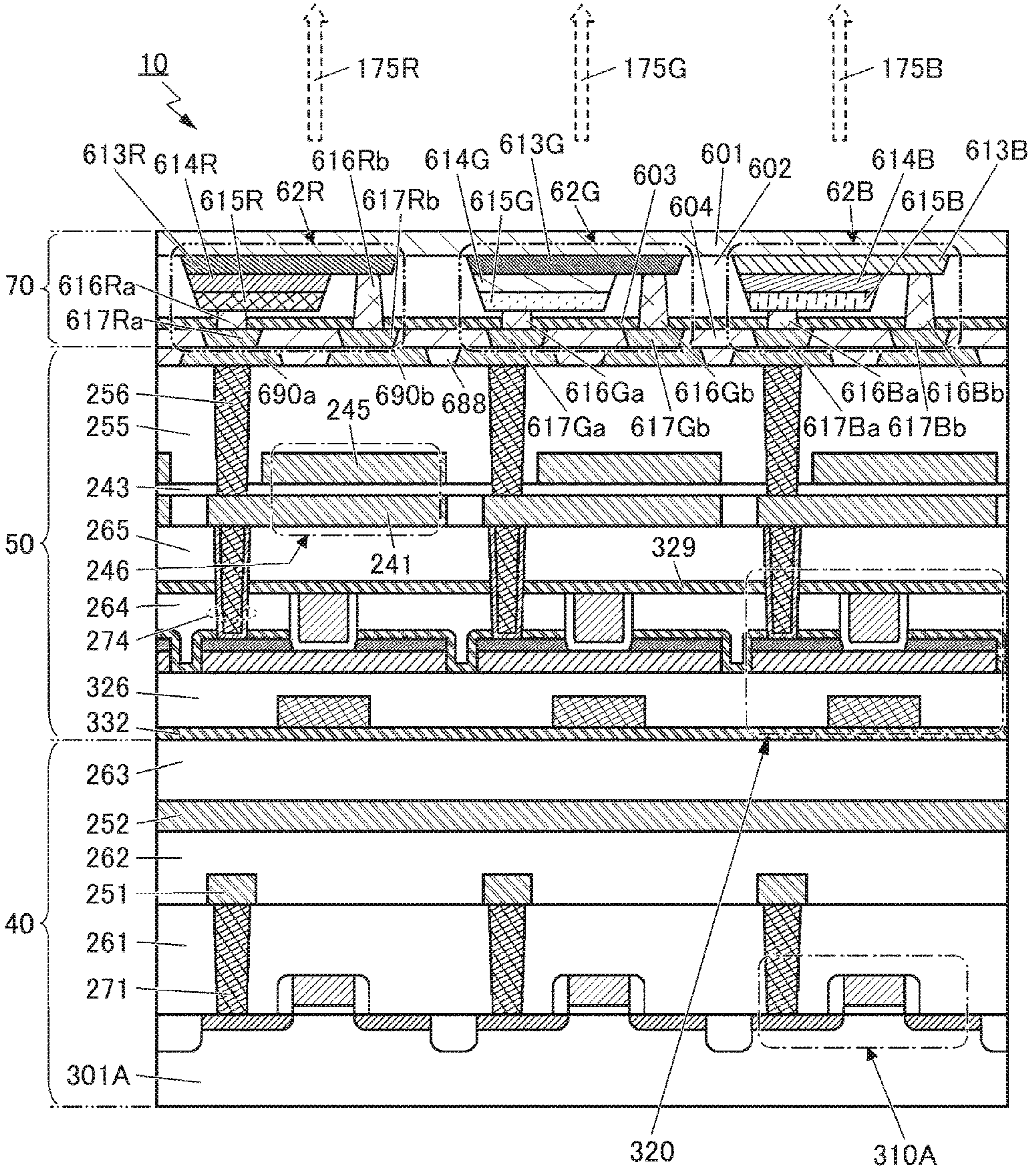
FIG. 26 is a cross-sectional view illustrating an example of a display apparatus.

FIG. 26 illustrates a modification example of the cross-sectional structure example illustrated in FIG. 25. The cross-sectional structure example of the display apparatus 10 illustrated in FIG. 26 has a structure in which a light-emitting diode is used as the light-emitting element. Note that description of portions similar to those in FIG. 25 is sometimes omitted.

The display apparatus 10 illustrated in FIG. 26 has a structure in which the layer 60 illustrated in FIG. 25 is replaced with a layer 70. The layer 70 includes a substrate 601, a light-emitting diode 62R, a light-emitting diode 62G, a light-emitting diode 62B, an insulating layer 602, an insulating layer 603, and an insulating layer 604. The insulating layer 602, the insulating layer 603, and the insulating layer 604 may each have a single-layer structure or a stacked-layer structure.

The light-emitting diode 62R includes a semiconductor layer 613R, a light-emitting layer 614R, a semiconductor layer 615R, a conductive layer 616Ra, a conductive layer 616Rb, an electrode 617Ra, and an electrode 617Rb. The light-emitting diode 62G includes a semiconductor layer 613G, a light-emitting layer 614G, a semiconductor layer 615G, a conductive layer 616Ga, a conductive layer 616Gb, an electrode 617Ga, and an electrode 617Gb. The light-emitting diode 62B includes a semiconductor layer 613B, a light-emitting layer 614B, a semiconductor layer 615B, a conductive layer 616Ba, a conductive layer 616Bb, an electrode 617Ba, and an electrode 617Bb. Each layer included in each of the light-emitting diode 62R, the light-emitting diode 62G, and the light-emitting diode 62B may have a single-layer structure or a stacked-layer structure.

The substrate 601 is provided with the semiconductor layer 613R, the light-emitting layer 614R is provided to overlap with the semiconductor layer 613R, and the semiconductor layer 615R is provided to overlap with the light-emitting layer 614R. The electrode 617Ra is electrically connected to the semiconductor layer 615R through the conductive layer 616Ra. The electrode 617Rb is electrically connected to the semiconductor layer 613R through the conductive layer 616Rb.

The substrate 601 is provided with the semiconductor layer 613G, the light-emitting layer 614G is provided to overlap with the semiconductor layer 613G, and the semiconductor layer 615G is provided to overlap with the light-emitting layer 614G. The electrode 617Ga is electrically connected to the semiconductor layer 615G through the conductive layer 616Ga. The electrode 617Gb is electrically connected to the semiconductor layer 613G through the conductive layer 616Gb.

The substrate 601 is provided with the semiconductor layer 613B, the light-emitting layer 614B is provided to overlap with the semiconductor layer 613B, and the semiconductor layer 615B is provided to overlap with the light-emitting layer 614B. The electrode 617Ba is electrically connected to the semiconductor layer 615B through the conductive layer 616Ba. The electrode 617Bb is electrically connected to the semiconductor layer 613B through the conductive layer 616Bb.

The insulating layer 602 is provided to cover the substrate 601, the semiconductor layer 613R, the semiconductor layer 613G, the semiconductor layer 613B, the light-emitting layer 614R, the light-emitting layer 614G, the light-emitting layer 614B, the semiconductor layer 615R, the semiconductor layer 615G, and the semiconductor layer 615B. The insulating layer 602 preferably has a planarization function. The insulating layer 603 is provided to overlap with the insulating layer 602. The conductive layer 616Ra, the conductive layer 616Rb, the conductive layer 616Ga, the conductive layer 616Gb, the conductive layer 616Ba, and the conductive layer 616Bb are provided to fill openings provided in the insulating layer 602 and the insulating layer 603. It is preferable that the surface of each of the conductive layer 616Ra, the conductive layer 616Rb, the conductive layer 616Ga, the conductive layer 616Gb, the conductive layer 616Ba, and the conductive layer 616Bb on the insulating layer 604 side be substantially level with the surface of the insulating layer 603 on the insulating layer 604 side. The insulating layer 604 is provided to overlap with the insulating layer 603. The electrode 617Ra, the electrode 617Rb, the electrode 617Ga, the electrode 617Gb, the electrode 617Ba, and the electrode 617Bb are provided to fill openings provided in the insulating layer 604. It is preferable that the surface of each of the electrode 617Ra, the electrode 617Rb, the electrode 617Ga, the electrode 617Gb, the electrode 617Ba, and the electrode 617Bb on the insulating layer 688 side be substantially level with the surface of the insulating layer 604 on the insulating layer 688 side.

The insulating layer 602 is preferably formed using an inorganic insulating material such as silicon oxide, silicon oxynitride, silicon nitride oxide, silicon nitride, aluminum oxide, hafnium oxide, or titanium nitride, for example.

As the insulating layer 603, it is possible to use a film through which one or both of hydrogen and oxygen are less likely to diffuse than through a silicon oxide film, such as an aluminum oxide film, a hafnium oxide film, and a silicon nitride film, for example. The insulating layer 603 preferably functions as a barrier layer that prevents diffusion of impurities from the layer 70 into the layer 50.

An oxide insulating film is preferably used as the insulating layer 604. The insulating layer 604 is a layer that is directly bonded to the insulating layer included in the layer 50. The oxide insulating films are directly bonded to each other, whereby the bonding strength (attachment strength) can be increased.

Examples of materials that can be used for the conductive layer 616Ra, the conductive layer 616Rb, the conductive layer 616Ga, the conductive layer 616Gb, the conductive layer 616Ba, and the conductive layer 616Bb include metal such as aluminum (Al), titanium, chromium, nickel, copper (Cu), yttrium, zirconium, tin (Sn), zinc (Zn), silver (Ag), platinum (Pt), gold (Au), molybdenum, tantalum, and tungsten (W), and an alloy containing the metal as its main component (e.g., an alloy of silver, palladium (Pd), and copper (Ag—Pd—Cu (APC))). Alternatively, for example, an oxide such as tin oxide or zinc oxide may be used.

For each of the electrode 617Ra, the electrode 617Rb, the electrode 617Ga, the electrode 617Gb, the electrode 617Ba, and the electrode 617Bb, Cu, Al, Sn, Zn, W, Ag, Pt, Au, or the like can be used, for example. Each of the electrode 617Ra, the electrode 617Rb, the electrode 617Ga, the electrode 617Gb, the electrode 617Ba, and the electrode 617Bb is a layer that is directly bonded to the conductive layer included in the layer 50. Preferably, Cu, Al, W, or Au is used for easy bonding.

The light-emitting layer 614R is positioned between the semiconductor layer 613R and the semiconductor layer 615R. The light-emitting layer 614G is positioned between the semiconductor layer 613G and the semiconductor layer 615G. The light-emitting layer 614B is positioned between the semiconductor layer 613B and the semiconductor layer 615B. In each of the light-emitting layer 614R, the light-emitting layer 614G, and the light-emitting layer 614B, electrons and holes are bonded to each other and emit light. Either the semiconductor layer 613R, the semiconductor layer 613G, and the semiconductor layer 613B or the semiconductor layer 615R, the semiconductor layer 615G, and the semiconductor layer 615B are n-type semiconductor layers, and the others are p-type semiconductor layers.

The stacked-layer structure including the semiconductor layer 613R, the light-emitting layer 614R, and the semiconductor layer 615R, the stacked-layer structure including the semiconductor layer 613G, the light-emitting layer 614G, and the semiconductor layer 615G, and the stacked-layer structure including the semiconductor layer 613B, the light-emitting layer 614B, and the semiconductor layer 615B are each formed to exhibit light of red, yellow, green, blue, white, or the like, for example. The stacked-layer structures may be formed to exhibit ultraviolet light. The three stacked-layer structures preferably exhibit light of different colors. For each of the stacked-layer structures, for example, a compound containing a Group 13 element and a Group 15 element (also referred to as a Group 3-5 compound) can be used. Examples of the Group 13 element include aluminum, gallium, and indium. Examples of the Group 15 element include nitrogen, phosphorus, arsenic, and antimony. For the light-emitting diodes to be formed, a compound of gallium and phosphorus, a compound of gallium and arsenic, a compound of gallium, aluminum, and arsenic, a compound of aluminum, gallium, indium, and phosphorus, gallium nitride (GaN), a compound of indium and gallium nitride, a compound of selenium and zinc, or the like can be used, for example.

For example, the light-emitting diode 62R may be formed to exhibit red light, the light-emitting diode 62G may be formed to exhibit green light, and the light-emitting diode 62B may be formed to exhibit blue light. When the light-emitting diode 62R, the light-emitting diode 62G, and the light-emitting diode 62B are formed to exhibit light of different colors, a step of forming a color conversion layer is not necessary. Consequently, the manufacturing cost of the display apparatus can be reduced.

Alternatively, two or more stacked-layer structures may exhibit light of the same color. In this case, light emitted from the light-emitting layer 614R, the light-emitting layer 614G, and the light-emitting layer 614B may be extracted to the outside of the display apparatus through one or both of a color conversion layer and a coloring layer.

The display apparatus of this embodiment may include a light-emitting diode exhibiting infrared light. The light-emitting diode exhibiting infrared light can be used as a light source of an infrared light sensor, for example.

A compound semiconductor substrate may be used as the substrate 601; for example, a compound semiconductor substrate containing a Group 13 element and a Group 15 element may be used. As the substrate 601, a single crystal substrate such as a sapphire ($Al_2O_3$) substrate, a silicon carbide (SiC) substrate, a silicon (Si) substrate, or a gallium nitride (GaN) substrate can be used, for example.

As illustrated in FIG. 26, the light 175R of the light-emitting diode 62R, the light 175G of the light-emitting diode 62G, and the light 175B of the light-emitting diode 62B are emitted toward the substrate 601 side. For that reason, the substrate 601 preferably has a visible-light-transmitting property. The visible-light-transmitting property of the substrate 601 may be increased by thinning the substrate 601 by polishing or the like, for example.

In the layer 50 illustrated in FIG. 26, the top surface of the plug 256 is substantially level with the top surface of the insulating layer 255. The plug 256 functions as a plug that electrically connects the conductive layer 241 and a conductive layer 690*a*. The insulating layer 688 is provided over the insulating layer 255 and the plug 256. The conductive layer 690*a* and a conductive layer 690*b* are provided to fill openings provided in the insulating layer 688. The top surfaces of the conductive layer 690*a* and the conductive layer 690*b* are preferably substantially level with the top surface of the insulating layer 688.

The insulating layer 688 is a layer that is directly bonded to the insulating layer 604 included in the layer 70. The insulating layer 688 is preferably formed using the same material as the insulating layer 604. An oxide insulating film is preferably used as the insulating layer 688. The oxide insulating films are directly bonded to each other, whereby the bonding strength (attachment strength) can be increased. Note that in the case where one or both of the insulating layer 604 and the insulating layer 688 have a stacked-layer structure, layers (including a surface layer and a bonding surface) that are in contact with each other are preferably formed using the same material.

The conductive layer 690*a* included in the layer 50 is a layer that is directly bonded to the electrode 617Ra included in the layer 70. It is preferable that the main component of the conductive layer 690*a* and the main component of the electrode 617Ra be the same metal element, and further preferable that the conductive layer 690*a* and the electrode 617Ra be formed using the same material. For the conductive layer 690*a*, Cu, Al, Sn, Zn, W, Ag, Pt, Au, or the like can be used, for example. Preferably, Cu, Al, W, or Au is used for easy bonding. Note that in the case where one or both of the conductive layer 690*a* and the electrode 617Ra have a stacked-layer structure, layers (including a surface layer and a bonding surface) that are in contact with each other are preferably formed using the same material.

Note that the layer 50 may include one or both of a reflective layer that reflects light of a light-emitting diode and a light-blocking layer that blocks the light.

As illustrated in FIG. 26, the electrode 617Ra provided in the layer 70 is bonded to be electrically connected to the conductive layer 690*a* provided in the layer 50.

The electrode 617Ra functions as a pixel electrode of the light-emitting diode 62R. The electrode 617Rb and the conductive layer 690*b* are connected to each other. The electrode 617Rb functions as a common electrode of the light-emitting diode 62R.

The electrode 617Ra and the conductive layer 690*a* preferably contain the same metal elements as main components.

Although bonding between the electrode 617Ra and the conductive layer 690*a* is described here, the electrode 617Ga and the electrode 617Ba are also bonded to the conductive layer 690*a* in a similar manner as illustrated in FIG. 26. Note that it is preferable that the conductive layer 690*a* bonded to the electrode 617Ra, the conductive layer 690*a* bonded to the electrode 617Ga, and the conductive layer 690*a* bonded to the electrode 617Ba be not electrically connected to each other.

The insulating layer 604 provided in the layer 70 and the insulating layer 688 provided in the layer 50 are directly bonded to each other. The insulating layer 604 and the insulating layer 688 are preferably formed of the same component or material.

The layers formed using the same material are in contact with each other at the bonding surface between the layer 70 and the layer 50, whereby connection with mechanical strength can be obtained.

For bonding metal layers to each other, for example, it is possible to use a surface activated bonding method in which an oxide film, a layer adsorbing impurities, and the like on the surface are removed by sputtering treatment or the like and the cleaned and activated surfaces are brought into contact to be bonded to each other. Alternatively, a diffusion bonding method in which surfaces are bonded to each other by using temperature and pressure together can be used, for example. Both methods cause bonding at an atomic level, and therefore not only electrically but also mechanically excellent bonding can be obtained.

For bonding insulating layers to each other, for example, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained. In the case of using an oxide insulating film, hydrophilicity treatment is preferably performed, in which case the bonding strength can be further increased. Note that in the case where an oxide insulating film is used, hydrophilicity treatment is not necessarily performed separately.

A combination of two or more of bonding methods may be used for the bonding because both the insulating layer and the metal layer exist at the bonding surface between the layer 70 and the layer 50. For example, a surface activated bonding method and a hydrophilic bonding method can be performed in combination.

For example, it is possible to use a method in which the surfaces are made clean after polishing, the surfaces of the metal layers are subjected to anti-oxidation treatment and then hydrophilicity treatment, and bonding is performed. Furthermore, hydrophilicity treatment may be performed on the surfaces of the metal layers being hardly oxidizable metal such as Au, for example. In the case where hydrophilicity treatment is not performed, antioxidant treatment can be omitted and there is no limitation on the kinds of the materials, so that the manufacturing cost and the number of manufacturing steps can be reduced. Note that a bonding method other than the above methods may be used.

Note that the attachment between the layer 70 and the layer 50 is not necessarily direct bonding over the entire surfaces of the substrates; the substrates may be connected to each other in at least part of the substrates with a conductive paste of silver, carbon, copper, or the like, or a bump of gold, solder, or the like.

The structure described in this embodiment can be used in appropriate combination with any of the other structures described in the other embodiments.

Embodiment 4

In this embodiment, transistors that can be used in the semiconductor device of one embodiment of the present invention will be described.

<Structure Example of Transistor>

Figure 27A:
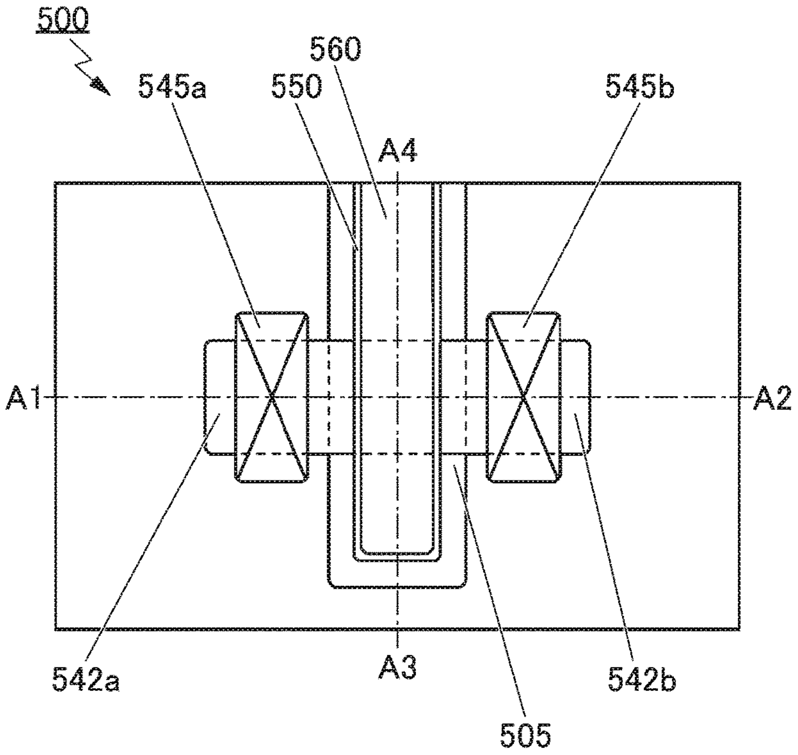
FIG. 27A is a top view illustrating a structure example of a transistor.
Figure 27C:
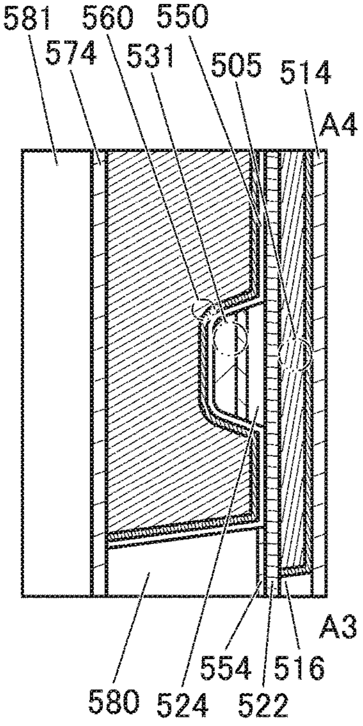
FIG. 27B and FIG. 27C are cross-sectional views illustrating the structure example of the transistor.
Figure 27B:
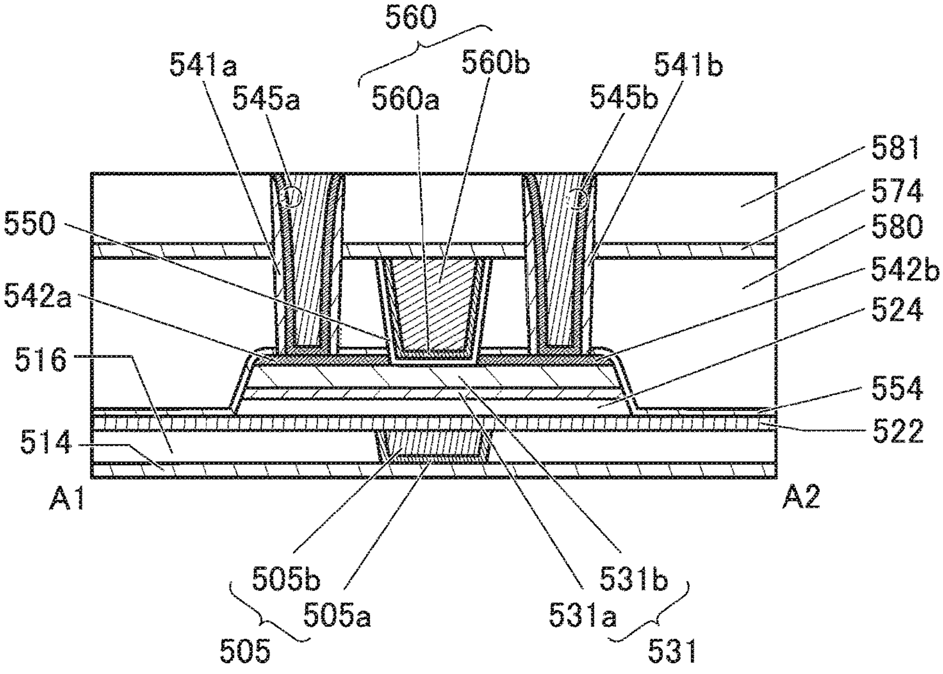

FIG. 27A, FIG. 27B, and FIG. 27C are a top view and cross-sectional views of a transistor 500 that can be used in the semiconductor device of one embodiment of the present invention. The transistor 500 can be used in the semiconductor device of one embodiment of the present invention.

FIG. 27A is the top view of the transistor 500. FIG. 27B and FIG. 27C are the cross-sectional views of the transistor 500. FIG. 27B is a cross-sectional view of a portion indicated by the dashed-dotted line A1-A2 in FIG. 27A and is a cross-sectional view of the transistor 500 in the channel length direction. FIG. 27C is a cross-sectional view of a portion indicated by the dashed-dotted line A3-A4 in FIG. 27A and is a cross-sectional view of the transistor 500 in the channel width direction. Note that some components are omitted in the top view of FIG. 27A for clarity of the drawing.

As illustrated in FIG. 27, the transistor 500 includes a metal oxide 531*a* placed over a substrate (not illustrated); a metal oxide 531*b* placed over the metal oxide 531*a*; a conductor 542*a* and a conductor 542*b* that are placed apart from each other over the metal oxide 531*b*; an insulator 580 that is placed over the conductor 542*a* and the conductor 542*b* and has an opening between the conductor 542*a* and the conductor 542*b*; a conductor 560 placed in the opening; an insulator 550 placed between the conductor 560 and the metal oxide 531*b*, the conductor 542*a*, the conductor 542*b*, and the insulator 580. Here, as illustrated in FIG. 27B and FIG. 27C, preferably, the top surface of the conductor 560 is substantially level with the top surfaces of the insulator 550 and the insulator 580. Hereinafter, the metal oxide 531*a* and the metal oxide 531*b* may be collectively referred to as a metal oxide 531. The conductor 542*a* and the conductor 542*b* may be collectively referred to as a conductor 542.

In the transistor 500 illustrated in FIG. 27, the side surfaces of the conductor 542*a* and the conductor 542*b* on the conductor 560 side are substantially perpendicular. Note that the transistor 500 illustrated in FIG. 27 is not limited thereto, and the angle formed between the side surfaces and bottom surfaces of the conductor 542*a* and the conductor 542*b* may be greater than or equal to 10° and less than or equal to 80°, preferably greater than or equal to 30° and less than or equal to 60°. The side surfaces of the conductor 542*a* and the conductor 542*b* that face each other may have a plurality of surfaces.

In the transistor 500, two layers of the metal oxide 531*a* and the metal oxide 531*b* are stacked in and around a region where a channel is formed (hereinafter, also referred to a channel formation region); however, the present invention is not limited thereto. For example, a single-layer structure of the metal oxide 531*b* or a stacked-layer structure of three or more layers may be employed. Furthermore, each of the metal oxide 531*a* and the metal oxide 531*b* may have a stacked-layer structure of two or more layers.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. Here, the positions of the conductor 560, the conductor 542*a*, and the conductor 542*b* are selected in a self-aligned manner with respect to the opening of the insulator 580. In other words, in the transistor 500, the gate electrode can be placed between the source electrode and the drain electrode in a self-aligned manner. Therefore, the conductor 560 can be formed without an alignment margin, resulting in a reduction in the area occupied by the transistor 500. Accordingly, the display apparatus can have high definition. In addition, the display apparatus can have a narrow bezel.

As illustrated in FIG. 27, the conductor 560 preferably includes a conductor 560*a* provided inside the insulator 550 and a conductor 560*b* provided to be embedded inside the conductor 560*a*. Note that in FIG. 27, although the conductor 560 have a stacked-layer structure of two layers, the present invention is not limited thereto. For example, the conductor 560 may have a single-layer structure or a stacked-layer structure of three or more layers.

The transistor 500 preferably includes an insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. The metal oxide 531*a* is preferably placed over the insulator 524.

As illustrated in FIG. 27, the insulator 554 is preferably placed between the insulator 580 and the insulator 522, the insulator 524, the metal oxide 531*a*, the metal oxide 531*b*, the conductor 542*a*, the conductor 542*b*, and the insulator 550. Here, as illustrated in FIG. 27B and FIG. 27C, the insulator 554 is preferably in contact with a side surface of the insulator 550, the top surface and the side surface of the conductor 542*a*, the top surface and the side surface of the conductor 542*b*, side surfaces of the metal oxide 531*a*, the metal oxide 531*b*, and the insulator 524 and the top surface of the insulator 522.

An insulator 574 and an insulator 581 functioning as interlayer films are preferably placed over the transistor 500. Here, the insulator 574 is preferably placed in contact with the top surfaces of the conductor 560, the insulator 550, and the insulator 580.

The insulator 522, the insulator 554, and the insulator 574 preferably have a function of inhibiting diffusion of hydrogen (e.g., at least one of a hydrogen atom, a hydrogen molecule, and the like). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., at least one of an oxygen atom, an oxygen molecule, and the like). For example, the insulator 522 and the insulator 554 preferably have a lower oxygen permeability than the insulator 524, the insulator 550, and the insulator 580.

A conductor 545 (a conductor 545*a* and a conductor 545*b*) that is electrically connected to the transistor 500 and functions as a plug is preferably provided. Note that an insulator 541 (an insulator 541*a* and an insulator 541*b*) is provided in contact with a side surface of the conductor 545 functioning as a plug. In other words, the insulator 541 is provided in contact with the inner wall of an opening in the insulator 554, the insulator 580, the insulator 574, and the insulator 581. In addition, a structure may be employed in which a first conductor of the conductor 545 is provided in contact with a side surface of the insulator 541 and a second conductor of the conductor 545 is provided on the inner side of the first conductor. Here, the top surface of the conductor 545 and the top surface of the insulator 581 can be substantially level with each other. Although the transistor 500 has a structure in which the first conductor of the conductor 545 and the second conductor of the conductor 545 are stacked, the present invention is not limited thereto. For example, the conductor 545 may have a single-layer structure or a stacked-layer structure of three or more layers. In the case where a component has a stacked-layer structure, layers may be distinguished by ordinal numbers given corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531*a* and the metal oxide 531*b*). For example, it is preferable to use a metal oxide having a band gap of higher than or equal to 2 eV, preferably higher than or equal to 2.5 eV as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). The element M further preferably contains one or both of Ga and Sn.

The metal oxide 531*b* in a region that does not overlap with the conductor 542 sometimes has a smaller thickness than the metal oxide 531*b* in a region that overlaps with the conductor 542. The thin region is formed when part of the top surface of the metal oxide 531*b* is removed at the time of forming the conductor 542*a* and the conductor 542*b*. When a conductive film to be the conductor 542 is deposited, a low-resistance region is sometimes formed on the top surface of the metal oxide 531*b* in the vicinity of the interface with the conductive film. Removing the low-resistance region positioned between the conductor 542*a* and the conductor 542*b* on the top surface of the metal oxide 531*b* in the above manner can prevent formation of the channel in the region.

According to one embodiment of the present invention, a high-definition display apparatus can be provided with a small-size transistor. Alternatively, a high-luminance display apparatus can be provided with a transistor with high on-state current. Alternatively, a display apparatus that operates at high speed can be provided with a transistor operating at high speed. Alternatively, a highly reliable display apparatus can be provided with a transistor having stable electrical characteristics. Alternatively, a display apparatus with low power consumption can be provided with a transistor with a low off-state current.

The structure of the transistor 500 that can be used in the display apparatus of one embodiment of the present invention is described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505*a* and a conductor 505*b*. The conductor 505*a* is provided in contact with the bottom surface and the sidewall of the opening provided in the insulator 516. The conductor 505*b* is provided to be embedded in a depressed portion formed by the conductor 505*a*. Here, the top surface of the conductor 505*b* is substantially level with the top surface of the conductor 505*a* and the top surface of the insulator 516.

For example, the conductor 505*a* is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When the conductor 505*a* is formed using a conductive material having a function of inhibiting diffusion of hydrogen, e.g., impurities such as hydrogen contained in the conductor 505*b* can be inhibited from diffusing into the metal oxide 531 through the insulator 524 and the like. When the conductor 505*a* is formed using a conductive material having a function of inhibiting diffusion of oxygen, the conductivity of the conductor 505*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 505*a* is a single layer or stacked layers of the above conductive materials. For example, titanium nitride is used for the conductor 505*a*.

The conductor 505*b* is preferably formed using a conductive material containing tungsten, copper, or aluminum as its main component. For example, tungsten is used for the conductor 505*b*.

The conductor 560 sometimes functions as a first gate (also referred to as top gate) electrode. The conductor 505 sometimes functions as a second gate (also referred to as bottom gate) electrode. In that case, Vth of the transistor 500 can be controlled by changing a potential applied to the conductor 505 independently of a potential applied to the conductor 560. In particular, by applying a negative potential to the conductor 505, Vth of the transistor 500 can be increased and the off-state current can be made low. Thus, drain current at the time when a potential applied to the conductor 560 is 0 V can be lower in the case where a negative potential is applied to the conductor 505 than in the case where a negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 27C. In other words, the conductor 505 and the conductor 560 preferably overlap with each other with the insulator positioned therebetween, in a region outside the side surface of the metal oxide 531 in the channel width direction.

With the above structure, the channel formation region of the metal oxide 531 can be electrically surrounded by electric fields of the conductor 560 having a function of the first gate electrode and electric fields of the conductor 505 having a function of the second gate electrode.

As illustrated in FIG. 27C, the conductor 505 extends to function as a wiring as well. However, without limitation to this structure, a structure in which a conductor functioning as a wiring is provided below the conductor 505 may be employed.

The insulator 514 preferably functions as a barrier insulating film that inhibits entry of e.g., impurities such as water or hydrogen into the transistor 500 from the substrate side.

Accordingly, it is preferable to use, for the insulator 514, an insulating material having a function of inhibiting diffusion of e.g., impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are unlikely to pass), for example. Alternatively, it is preferable to use an insulating material having a function of inhibiting diffusion of oxygen (e.g., at least one of an oxygen atom, an oxygen molecule, and the like) (an insulating material through which the oxygen is unlikely to pass).

For example, aluminum oxide, silicon nitride, or the like is preferably used for the insulator 514. Accordingly, it is possible to inhibit diffusion of e.g., impurities such as water or hydrogen to the transistor 500 side from the substrate side through the insulator 514. Alternatively, for example, it is possible to inhibit diffusion of oxygen contained in the insulator 524 and the like to the substrate side through the insulator 514.

The permittivity of each of the insulator 516, the insulator 580, and the insulator 581 functioning as an interlayer film is preferably lower than that of the insulator 514. When a material with a low permittivity is used for an interlayer film, the parasitic capacitance generated between wirings can be reduced. For the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 each function as a gate insulator.

Here, the insulator 524 in contact with the metal oxide 531 preferably releases oxygen by heating. In this specification and the like, oxygen that is released by heating is referred to as excess oxygen in some cases. For example, silicon oxide, silicon oxynitride, or the like can be used as appropriate for the insulator 524. When an insulator containing oxygen is provided in contact with the metal oxide 531, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C. or 100° C. to 400° C.

For example, like the insulator 514 and the like, the insulator 522 preferably functions as a barrier insulating film that inhibits entry of e.g., impurities such as water or hydrogen into the transistor 500 from the substrate side. For example, the insulator 522 preferably has a lower hydrogen permeability than the insulator 524. For example, when the insulator 524, the metal oxide 531, the insulator 550, and the like are surrounded by the insulator 522, the insulator 554, and the insulator 574, entry of e.g., impurities such as water or hydrogen into the transistor 500 from the outside can be inhibited.

Furthermore, it is preferable that the insulator 522 have a function of inhibiting diffusion of oxygen (e.g., at least one of an oxygen atom, an oxygen molecule, and the like) (it is preferable that the oxygen be less likely to pass through the insulator 522). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium, for example, aluminum oxide, hafnium oxide, an oxide containing aluminum and hafnium (hafnium aluminate), or the like is preferably used. In the case where the insulator 522 is formed using such a material, the insulator 522 functions as a layer inhibiting release of oxygen from the metal oxide 531 and entry of e.g., impurities such as hydrogen into the metal oxide 531 from the periphery of the transistor 500.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over any of the above insulators.

The insulator 522 may be a single layer or a stacked layer using an insulator containing what is called a high-k material such as aluminum oxide, hafnium oxide, tantalum oxide, zirconium oxide, lead zirconate titanate (PZT), strontium titanate (SrTiO3), or (Ba,Sr)TiO3 (BST), for example. With further miniaturization and higher integration of a transistor, a problem such as generation of leakage current may arise because of a thinned gate insulator, for example. When a high-k material is used for the insulator functioning as a gate insulator, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed for the insulator 522 and the insulator 524. For example, an insulator similar to the insulator 524 may be provided below the insulator 522.

The metal oxide 531 includes the metal oxide 531*a* and the metal oxide 531*b* over the metal oxide 531*a*. When the metal oxide 531 includes the metal oxide 531*a* under the metal oxide 531*b*, it is possible to inhibit diffusion of impurities into the metal oxide 531*b* from the components formed below the metal oxide 531*a*.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably greater than the atomic ratio of the element M to In in the metal oxide 531*b*.

The energy of the conduction band minimum of the metal oxide 531*a* is preferably higher than the energy of the conduction band minimum of the metal oxide 531*b*. In other words, the electron affinity of the metal oxide 531*a* is preferably smaller than the electron affinity of the metal oxide 531*b*.

Here, the energy level of the conduction band minimum gently changes at a junction portion between the metal oxide 531*a* and the metal oxide 531*b*. In other words, at junction portions between the metal oxide 531*a* and the metal oxide 531*b*, the energy level of the conduction band minimum continuously changes or the energy levels are continuously connected. This can be achieved by decreasing the density of defect states in a mixed layer formed at the interface between the metal oxide 531*a* and the metal oxide 531*b*.

Specifically, when the metal oxide 531*a* and the metal oxide 531*b* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 531*a*, in the case where the metal oxide 531*b* is an In—Ga—Zn oxide.

Specifically, as the metal oxide 531*a*, a metal oxide with In:Ga:Zn=1:3:4 [atomic ratio] or 1:1:0.5 [atomic ratio] can be used. As the metal oxide 531*b*, a metal oxide with In:Ga:Zn=1:1:1 [atomic ratio], 4:2:3 [atomic ratio] or 3:1:2 [atomic ratio] can be used.

In this case, the metal oxide 531*b* serves as a main carrier path. When the metal oxide 531*a* has the above structure, the density of defect states at the interface between the metal oxide 531*a* and the metal oxide 531*b* can be made low. Thus, the influence of interface scattering on carrier conduction is small, and the transistor 500 can have high on-state current and high frequency characteristics.

The conductor 542 (the conductor 542*a* and the conductor 542*b*) functioning as the source electrode and the drain electrode is provided over the metal oxide 531*b*. For the conductor 542, for example, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, or an oxide containing lanthanum and nickel is preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier concentration of the region in the metal oxide 531 in the vicinity of the conductor 542 increases, and the region becomes a low-resistance region.

Here, the region between the conductor 542*a* and the conductor 542*b* is formed to overlap with the opening of the insulator 580. Accordingly, the conductor 560 can be placed in a self-aligned manner between the conductor 542*a* and the conductor 542*b*.

The insulator 550 functions as a gate insulator. The insulator 550 is preferably positioned in contact with the top surface of the metal oxide 531*b*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide or silicon oxynitride, which are thermally stable, are preferable.

As in the insulator 524, for example, the concentration of impurities such as water or hydrogen in the insulator 550 is preferably reduced. The thickness of the insulator 550 is preferably greater than or equal to 1 nm and less than or equal to 20 nm.

An insulator may be provided between the insulator 550 and the insulator 580, the insulator 554, the conductor 542, and the metal oxide 531*b*. For the insulator, aluminum oxide or hafnium oxide is preferably used, for example. Providing the insulator can inhibit release of oxygen from the metal oxide 531*b*, excessive supply of oxygen to the metal oxide 531*b*, oxidation of the conductor 542, and the like, for example.

A metal oxide may be provided between the insulator 550 and the conductor 560. The metal oxide preferably inhibits diffusion of oxygen from the insulator 550 to the conductor 560. Accordingly, oxidation of the conductor 560 due to oxygen in the insulator 550 can be inhibited.

The metal oxide functions as part of the gate insulator in some cases. Therefore, when silicon oxide, silicon oxynitride, or the like is used for the insulator 550, for example, a metal oxide that is a high-k material with a high relative permittivity is preferably used as the metal oxide. When the gate insulator has a stacked-layer structure of the insulator 550 and the metal oxide, the stacked-layer structure can be thermally stable and have a high relative permittivity. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, for the insulator 550, for example, a metal oxide containing one kind or two or more kinds selected from hafnium, aluminum, gallium, yttrium, zirconium, tungsten, titanium, tantalum, nickel, germanium, magnesium, and the like can be used, for example. It is particularly preferable to use an insulator containing an oxide of one or both of aluminum and hafnium, e.g., aluminum oxide, hafnium oxide, an oxide containing aluminum and hafnium (hafnium aluminate), or the like.

Although the conductor 560 has a two-layer structure in FIG. 27, the conductor 560 may have a single-layer structure or a stacked-layer structure of three or more layers.

The conductor 560*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560*b* is preferably formed using a conductive material containing tungsten, copper, or aluminum as its main component. The conductor 560 also functions as a wiring and thus is preferably formed using a conductor having high conductivity. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

As illustrated in FIG. 27A and FIG. 27C, the side surface of the metal oxide 531 is covered with the conductor 560 in a region where the metal oxide 531*b* does not overlap with the conductor 542, that is, the channel formation region of the metal oxide 531. Accordingly, the electric field of the conductor 560 functioning as the first gate electrode is likely to act on the side surface of the metal oxide 531. Thus, the on-state current of the transistor 500 can be increased and the frequency characteristics can be improved.

The insulator 554, like the insulator 514 and the like, for example, preferably functions as a barrier insulating film that inhibits entry of e.g., impurities such as water or hydrogen into the transistor 500 from the insulator 580 side. The insulator 554 preferably has a lower hydrogen permeability than the insulator 524, for example. Furthermore, as illustrated in FIG. 27B and FIG. 27C, the insulator 554 is preferably in contact with the side surface of the insulator 550, the top and side surfaces of the conductor 542*a*, the top and side surfaces of the conductor 542*b*, the side surfaces of the metal oxide 531*a*, the metal oxide 531*b*, and the insulator 524. Such a structure can inhibit entry of hydrogen contained in the insulator 580 into the metal oxide 531 through the top surfaces or side surfaces of the conductor 542*a*, the conductor 542*b*, the metal oxide 531*a*, the metal oxide 531*b*, and the insulator 524.

Furthermore, it is preferable that the insulator 554 have a function of inhibiting diffusion of oxygen (e.g., at least one of an oxygen atom, an oxygen molecule, and the like) (it is preferable that the oxygen be unlikely to pass through the insulator 554). For example, the insulator 554 preferably has a lower oxygen permeability than the insulator 580 or the insulator 524.

The insulator 554 is preferably deposited by a sputtering method. When the insulator 554 is deposited by a sputtering method in an oxygen-containing atmosphere, oxygen can be added to the vicinity of a region of the insulator 524 that is in contact with the insulator 554. Thus, oxygen can be supplied from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531. Accordingly, oxygen vacancies in the metal oxide 531 can be reduced, so that the transistor can be prevented from having normally-on characteristics.

As the insulator 554, an insulator containing an oxide of one or both of aluminum and hafnium is preferably deposited, for example. Note that as the insulator containing an oxide of one or both of aluminum and hafnium, aluminum oxide, hafnium oxide, an oxide containing aluminum and hafnium (hafnium aluminate), or the like is preferably used, for example.

The insulator 580 is provided over the insulator 524, the metal oxide 531, and the conductor 542 with the insulator 554 therebetween. The insulator 580 preferably includes silicon oxide, silicon oxynitride, silicon nitride oxide, silicon oxide to which fluorine is added, silicon oxide to which carbon is added, silicon oxide to which carbon and nitrogen are added, porous silicon oxide, or the like, for example. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of e.g., impurities such as water or hydrogen in the insulator 580 is preferably reduced. In addition, the top surface of the insulator 580 may be planarized.

Like the insulator 514 and the like, for example, the insulator 574 preferably functions as a barrier insulating film that inhibits entry of e.g., impurities such as water or hydrogen into the insulator 580 from above. As the insulator 574, for example, the insulator that can be used as the insulator 514, the insulator 554, or the like can be used.

The insulator 581 functioning as an interlayer film is preferably provided over the insulator 574. For example, as in the insulator 524 or the like, the concentration of e.g., impurities such as water or hydrogen in the insulator 581 is preferably reduced.

The conductor 545*a* and the conductor 545*b* are placed in openings formed in the insulator 581, the insulator 574, the insulator 580, and the insulator 554. The conductor 545*a* and the conductor 545*b* are provided to face each other with the conductor 560 therebetween. Note that the top surfaces of the conductor 545*a* and the conductor 545*b* may be on the same plane as the top surface of the insulator 581.

The insulator 541*a* is provided in contact with the inner wall of the opening in the insulator 581, the insulator 574, the insulator 580, and the insulator 554, and the first conductor of the conductor 545*a* is formed in contact with the side surface of the insulator 541*a*. The conductor 542*a* is positioned on at least part of the bottom portion of the opening, and the conductor 545*a* is in contact with the conductor 542*a*. Similarly, the insulator 541*b* is provided in contact with the inner wall of the opening in the insulator 581, the insulator 574, the insulator 580, and the insulator 554, and the first conductor of the conductor 545*b* is formed in contact with the side surface of the insulator 541*b*. The conductor 542*b* is positioned on at least part of the bottom portion of the opening, and the conductor 545*b* is in contact with the conductor 542*b*.

The conductor 545*a* and the conductor 545*b* are preferably formed using a conductive material containing tungsten, copper, or aluminum as its main component. The conductor 545*a* and the conductor 545*b* may have a stacked-layer structure.

In the case where the conductor 545 has a stacked-layer structure, the aforementioned conductor having a function of inhibiting diffusion of e.g., impurities such as water or hydrogen is preferably used as the conductor in contact with the conductor 542, the insulator 554, the insulator 580, the insulator 574, and the insulator 581. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 580 from being absorbed by the conductor 545*a* and the conductor 545*b*. Moreover, impurities such as water or hydrogen, for example, can be inhibited from entering the metal oxide 531 through the conductor 545*a* and the conductor 545*b* from a layer above the insulator 581.

As the insulator 541*a* and the insulator 541*b*, for example, the insulator that can be used as the insulator 554 or the like can be used. Since the insulator 541*a* and the insulator 541*b* are provided in contact with the insulator 554, impurities such as water or hydrogen, for example, in the insulator 580 or the like can be inhibited from entering the metal oxide 531 through the conductor 545*a* and the conductor 545*b*. Furthermore, oxygen contained in the insulator 580 can be inhibited from being absorbed by the conductor 545*a* and the conductor 545*b*.

Although not illustrated, a conductor functioning as a wiring may be placed in contact with the top surface of the conductor 545*a* and the top surface of the conductor 545*b*. For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With miniaturization and high integration of a transistor, for example, a problem such as generation of a leakage current may arise because of a thinner gate insulator. When a high-k material is used for the insulator functioning as a gate insulator, the voltage at the time of the operation of the transistor can be reduced while the physical thickness is maintained. By contrast, when a material with a low relative permittivity is used for the insulator functioning as an interlayer film, the parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of e.g., oxygen and impurities such as hydrogen (e.g., the insulator 514, the insulator 522, the insulator 554, and the insulator 574), the electrical characteristics of the transistor can be stable. An insulator having a function of inhibiting passage of e.g., oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of e.g., oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 531, oxygen vacancies included in the metal oxide 531 can be compensated for.

[Conductor]

For a conductor, for example, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, or an oxide containing lanthanum and nickel is preferable because they are oxidation-resistant conductive materials or materials that maintain their conductivity even after absorbing oxygen. A semiconductor having high electrical conductivity, typified by polycrystalline silicon containing an impurity element, e.g., phosphorus, or silicide such as nickel silicide may be used, for example.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably has a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases, for example.

At least part of this embodiment can be implemented in combination with the other embodiments described in this specification as appropriate.

The structure described in this embodiment can be used in appropriate combination with any of the other structures described in the other embodiments.

Embodiment 5

In this embodiment, a metal oxide (hereinafter also referred to as an oxide semiconductor) that can be used for the OS transistor described in the above embodiment will be described.

The metal oxide used for the OS transistor preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and is further preferably gallium.

For example, the metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) structures, and the like can be given as examples of a crystal structure of an oxide semiconductor.

Note that a crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as “amorphous” unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, the In—Ga—Zn oxide film deposited at room temperature is in an intermediate state, which is neither a single crystal nor polycrystal nor an amorphous state. Therefore, it is difficult to conclude that In—Ga—Zn oxide film is in an amorphous state.

[Structure of Oxide Semiconductor]

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductors include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a plurality of minute crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Note that indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS, for example.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. For example, a pentagonal lattice arrangement, a heptagonal lattice arrangement, and the like are included in the distortion in some cases. Note that it is difficult to observe a clear grain boundary even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure where a clear grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region includes indium oxide, indium zinc oxide, or the like as its main component, for example. The second region includes gallium oxide, gallium zinc oxide, or the like as its main component, for example. That is, the first region can be rephrased as a region containing In as its main component. The second region can be rephrased as a region containing Ga as its main component.

Note that in some cases, it is difficult to observe a clear boundary between the first region and the second region.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure where metal elements are unevenly distributed.

The CAC-OS can be formed by a sputtering method under a condition where a substrate is not heated intentionally, for example. Furthermore, in the case where the CAC-OS is formed by a sputtering method, any one or more selected from an inert gas (typically, argon), an oxygen gas, and a nitrogen gas is used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

Here, the first region is a region having higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region is a region having a higher insulating property than the first region. In other words, when the second regions are distributed in a metal oxide, leakage current can be inhibited.

Thus, in the case where the CAC-OS is used for a transistor, a switching function (on state/off state switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, high on-state current ($I_{on}$), a high field-effect mobility (μ), and favorable switching operation can be achieved.

A transistor using the CAC-OS has high reliability. Thus, the CAC-OS is most suitable for a variety of semiconductor devices such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor with high reliability can be achieved.

It is particularly preferable to use an oxide containing indium (In), gallium (Ga), and zinc (Zn) (also referred to as "IGZO") for the semiconductor layer where a channel is formed. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{3}$. In order to reduce the carrier concentration in an oxide semiconductor, the impurity concentration in the oxide semiconductor is reduced so that the density of defect states in the oxide semiconductor can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the semiconductor layer is set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the concentration of hydrogen in the oxide semiconductor, which is measured by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

The structure described in this embodiment can be used in appropriate combination with any of the other structures described in the other embodiments.

Embodiment 6

In this embodiment, electronic devices in which the semiconductor device of one embodiment of the present invention can be used will be described.

The semiconductor device of one embodiment of the present invention can be used for a display portion of an electronic device. Thus, one embodiment of the present invention can achieve an electronic device having high display quality. Alternatively, one embodiment of the present invention can achieve an electronic device with extremely high definition. Alternatively, one embodiment of the present invention can achieve a highly reliable electronic device.

Examples of electronic devices using the semiconductor device or the like of one embodiment of the present invention include display apparatuses such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and furthermore, it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display portion. When the electronic device includes an antenna and a secondary battery, the antenna may be used for contactless power transmission.

The electronic device of one embodiment of the present invention may include a sensor (e.g., a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, infrared rays, or the like).

The electronic device of one embodiment of the present invention can have a variety of functions. For example, the electronic device can have a function of displaying a variety of information (e.g., a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these. The electronic device of one embodiment of the present invention can have a variety of functions.

The semiconductor device of one embodiment of the present invention can display a high-definition image. Thus, the semiconductor device can be suitably used especially for a portable electronic device, a wearable electronic device (wearable device), an e-book reader, or the like. For example, the semiconductor device can be suitably used for xR devices such as a VR device and an AR device.

Figure 28A:
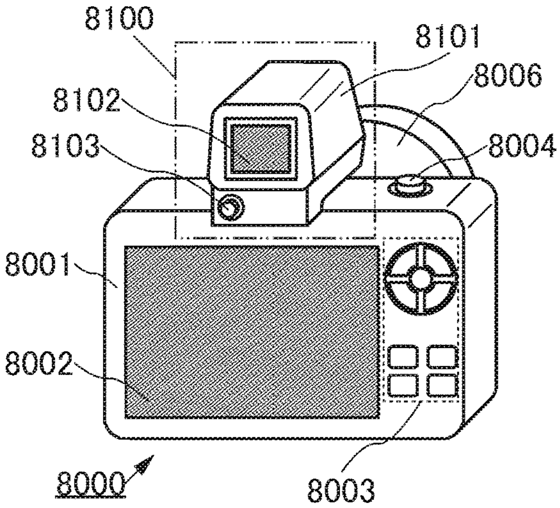
FIG. 28A to FIG. 28F are diagrams illustrating examples of electronic devices.

FIG. 28A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing, for example.

The finder 8100 includes a housing 8101, a display portion 8102, a button 8103, and the like.

The housing 8101 is attached to the camera 8000 by a mount for engagement with the mount of the camera 8000. The finder 8100 can display an image and the like received from the camera 8000 on the display portion 8102, for example.

The button 8103 functions as a power button or the like, for example.

The semiconductor device of one embodiment of the present invention can be used in the display portion 8002 of the camera 8000 and the display portion 8102 of the finder 8100. Note that the finder 8100 may be incorporated in the camera 8000.

Figure 28B:
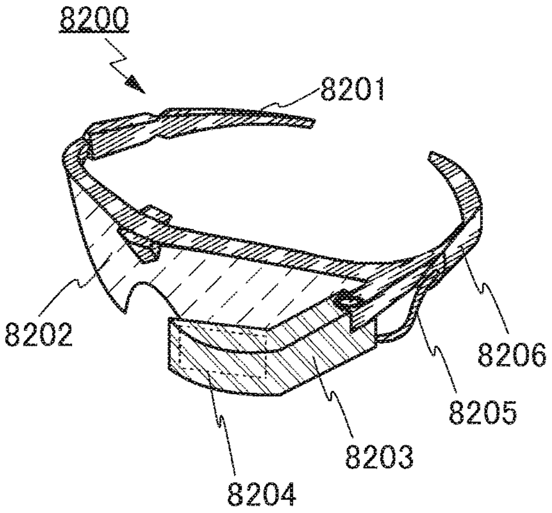

FIG. 28B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 has a function of supplying power from the battery 8206 to the main body 8203. The main body 8203 includes a wireless receiver or the like to receive image information and display it on the display portion 8204, for example. The main body 8203 includes a camera, and information on the movement of the eyeballs or the eyelids of the user can be used as an input means, for example.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor. The head-mounted display 8200 may have a function of displaying the user's biological information on the display portion 8204, a function of changing an image displayed on the display portion 8204 in response to the movement of the user's head, or the like.

The semiconductor device of one embodiment of the present invention can be used in the display portion 8204.

Figure 28C:
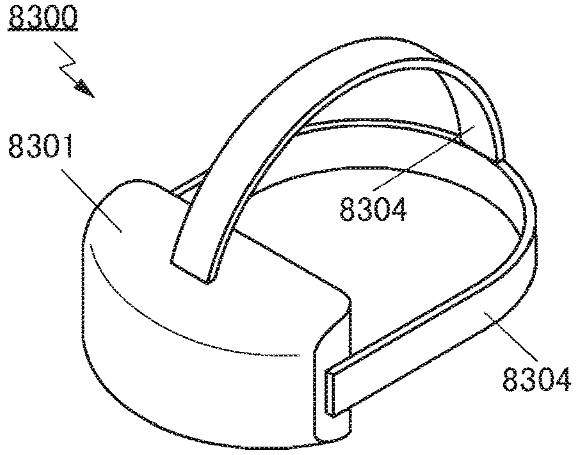
Figure 28D:
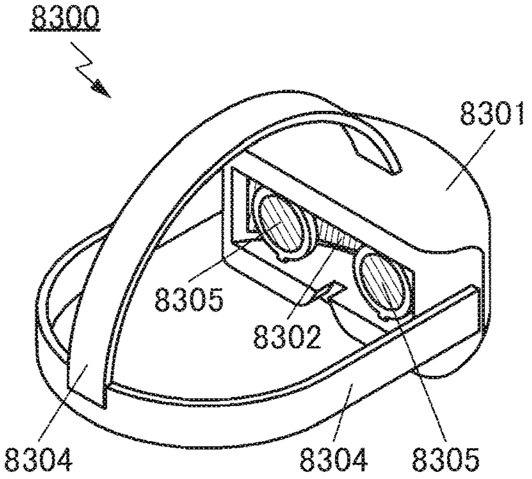
Figure 28E:
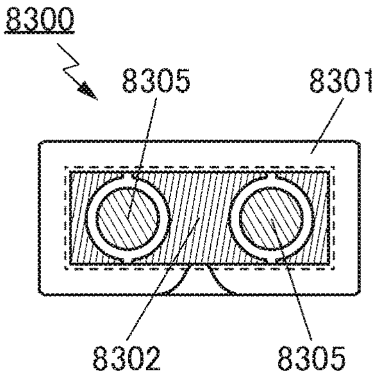

FIG. 28C to FIG. 28E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. In the head-mounted display 8300, the display portion 8302 is preferably curved because the user can feel a high realistic sensation. For example, another image displayed on another region of the display portion 8302 is viewed through the lenses 8305, so that three-dimensional display using parallax or the like can be performed. Note that the number of display portions 8302 is not limited to one; for example, two display portions 8302 may be provided for the user's respective eyes.

The semiconductor device of one embodiment of the present invention can be used for the display portion 8302. The semiconductor device of one embodiment of the present invention can achieve extremely high definition. For example, a pixel is not easily seen by the user even when the user sees display that is magnified by the lenses 8305 as illustrated in FIG. 28E. That is, an image with a strong sense of reality can be seen by the user with the use of the display portion 8302.

Figure 28F:
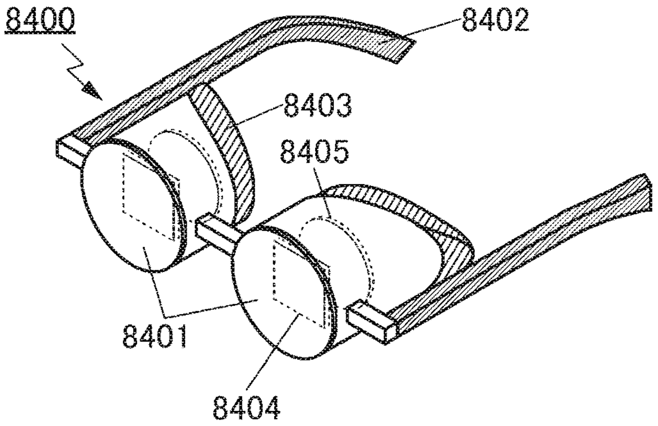

FIG. 28F is an external view of a goggle-type head-mounted display 8400. The head-mounted display 8400 includes a pair of housings 8401, a mounting portion 8402, and a cushion 8403. A display portion 8404 and a lens 8405 are provided in the pair of housings 8401 each. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone, for example. Thus, a separate audio device such as an earphone or a speaker is not needed, and the user can enjoy images and sounds only by wearing the head-mounted display. Note that the housing 8401 may have a function of outputting sound data by wireless communication, for example.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used for example, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Figure 29A:
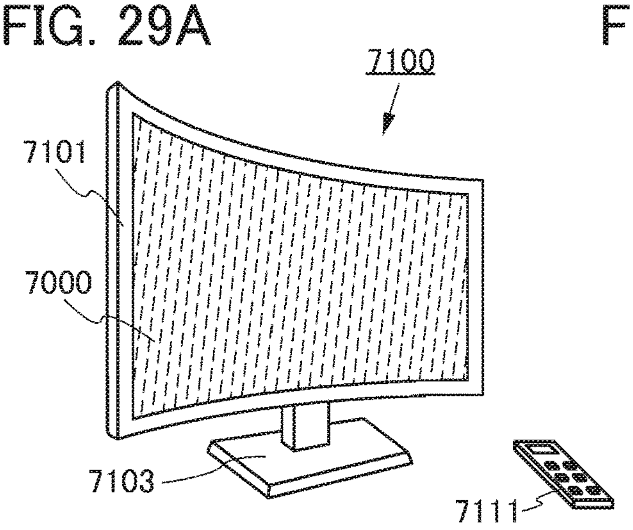
FIG. 29A to FIG. 29F are diagrams illustrating examples of electronic devices.

FIG. 29A illustrates an example of a television device. In a television device 7100, a display portion 7000 is incorporated in a housing 7101. Here, the housing 7101 is supported by a stand 7103.

The semiconductor device of one embodiment of the present invention can be used for the display portion 7000 in FIG. 29A.

Operation of the television device 7100 illustrated in FIG. 29A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated in the television device 7100.

Note that the television device 7100 has a structure in which a receiver, a modem, and the like are provided, for example. A general television broadcast can be received with the receiver. When the television device is connected to a communication network with or without wires via the modem, one-way (e.g., from a transmitter to a receiver) or two-way (between a transmitter and a receiver or between receivers, for example) information communication can be performed.

Figure 29B:
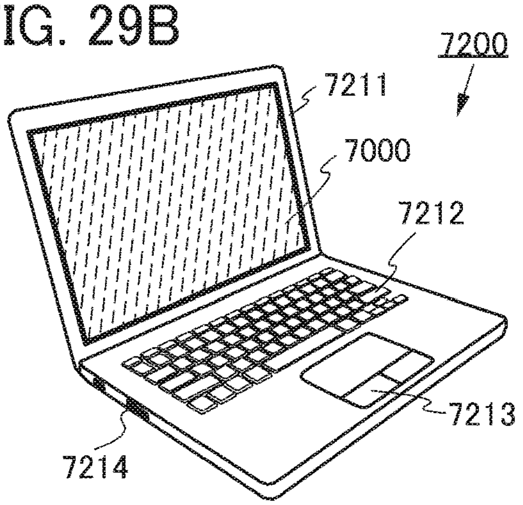

FIG. 29B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000 in FIG. 29B.

Figure 29C:
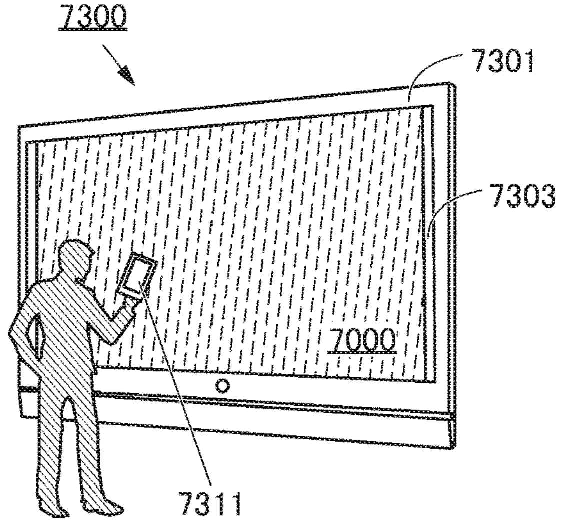
Figure 29D:
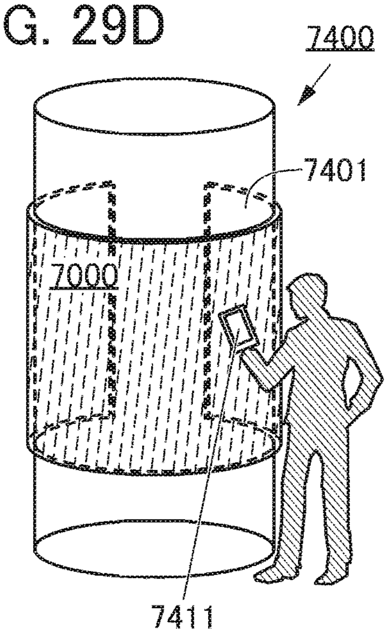

FIG. 29C and FIG. 29D illustrate examples of digital signage.

Digital signage 7300 illustrated in FIG. 29C includes a housing 7301, the display portion 7000, a speaker 7303, and the like. The digital signage 7300 can also include an LED lamp, an operation key (including a power switch or an operation switch), a connection terminal, a variety of sensors, a microphone, or the like.

FIG. 29D illustrates digital signage 7400 attached to a cylindrical pillar. The digital signage 7400 includes the display portion 7000 provided along a curved surface of the pillar 7401.

In FIG. 29C and FIG. 29D, the semiconductor device of one embodiment of the present invention can be used for the display portion 7000.

The digital signage 7300 or the digital signage 7400 including a larger area of the display portion 7000 can increase the amount of information that can be provided at a time. The larger display portion 7000 attracts more attentions, so that the effectiveness of the advertisement can be increased, for example.

The digital signage 7300 or the digital signage 7400 preferably includes a touch panel in the display portion 7000. This enables intuitive operation by a user, in addition to display of a still image or a moving image on the display portion 7000. Moreover, for an application that provides information such as route information or traffic information, usability can be enhanced by intuitive operation.

As illustrated in FIG. 29C and FIG. 29D, it is preferable that the digital signage 7300 or the digital signage 7400 be capable of working with an information terminal 7311 or an information terminal 7411 such as a smartphone a user has through wireless communication, for example. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 29E:
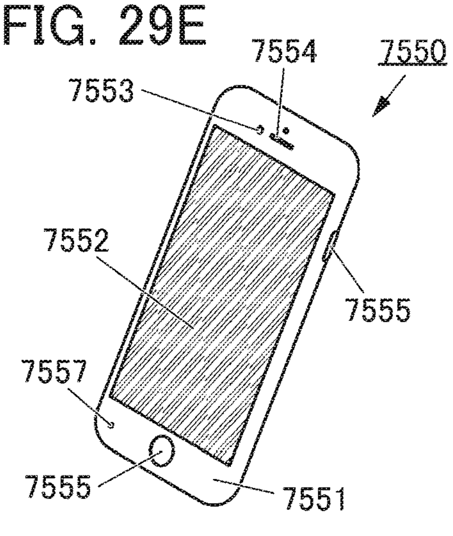

FIG. 29E illustrates an example of an information terminal. An information terminal 7550 includes a housing 7551, a display portion 7552, a microphone 7557, a speaker portion 7554, a camera 7553, operation switches 7555, and the like. The semiconductor device of one embodiment of the present invention can be used for the display portion 7552. The display portion 7552 can have a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

Figure 29F:
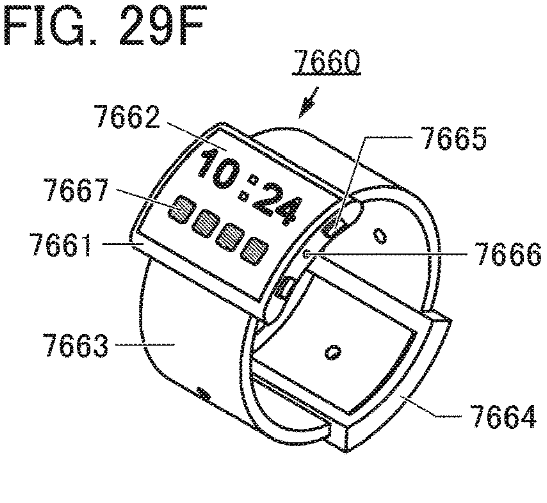

FIG. 29F illustrates an example of a watch-type information terminal. An information terminal 7660 includes a housing 7661, a display portion 7662, a band 7663, a buckle 7664, an operation switch 7665, an input/output terminal 7666, and the like. The information terminal 7660 also includes, for example, an antenna, a battery, and the like inside the housing 7661. The information terminal 7660 is capable of executing a variety of applications such as mobile phone calls, e-mailing, text viewing and editing, music reproduction, Internet communication, and computer games, for example.

The information terminal 7660 includes a touch sensor in the display portion 7662, and can be operated by touching the screen with a finger, a stylus, or the like. For example, by touching an icon 7667 displayed on the display portion 7662, an application can be started. With the operation switch 7665, for example, a variety of functions such as time setting, power on/off, on/off of wireless communication, setting or cancellation of a silent mode, and setting or cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 can perform data transmission and reception with another information terminal through the input/output terminal 7666. Charging through the input/output terminal 7666 is also possible. Note that the charging operation may be performed by wireless power feeding without using the input/output terminal 7666.

Figure 30A:
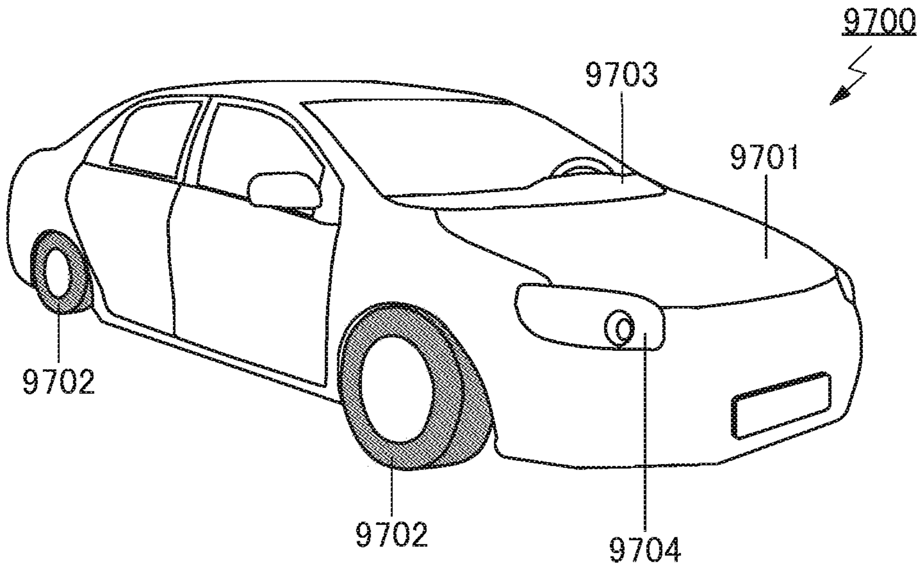
FIG. 30A and FIG. 30B are diagrams illustrating an example of an electronic device.
Figure 30B:
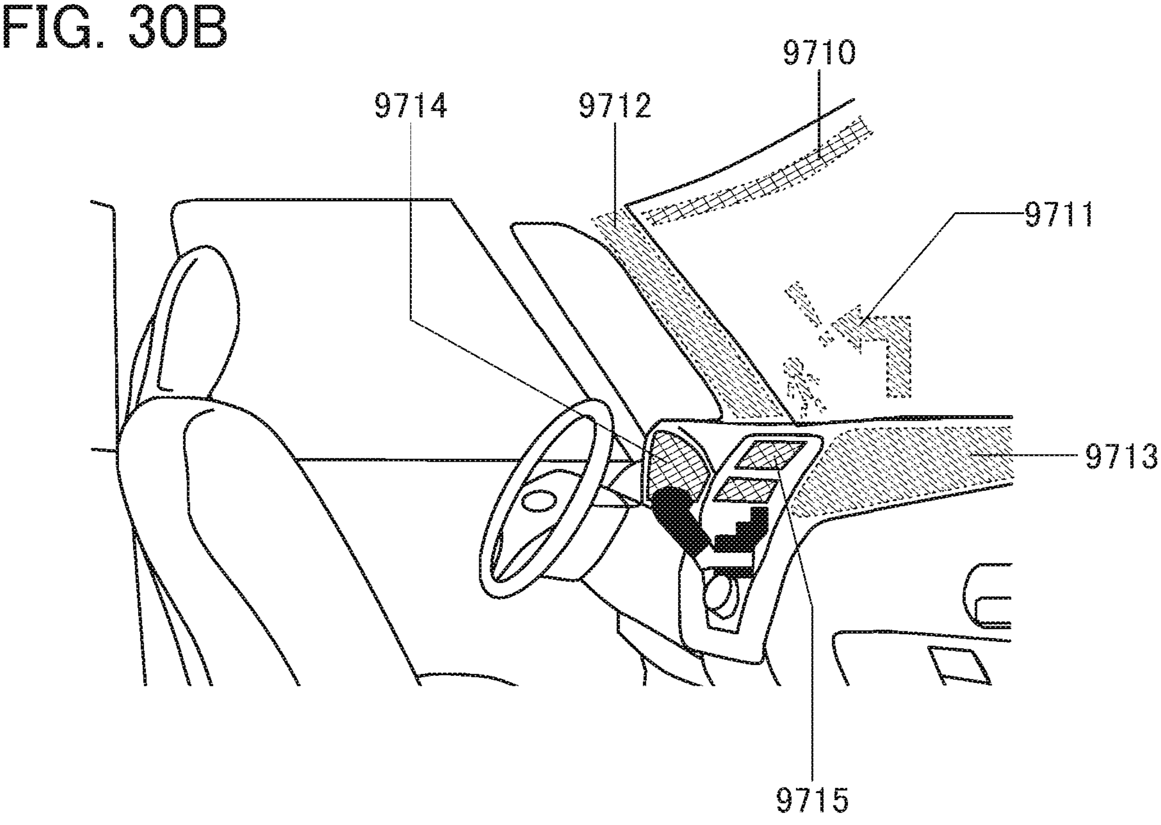

FIG. 30A is an external view of an automobile 9700. FIG. 30B illustrates a driver's seat of the automobile 9700. The automobile 9700 includes a car body 9701, wheels 9702, a dashboard 9703, lights 9704, and the like. The display apparatus of one embodiment of the present invention can be used in a display portion of the automobile 9700 or the like. For example, the display apparatus of one embodiment of the present invention can be provided for a display portion 9710 to a display portion 9715 illustrated in FIG. 30B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Thus, the display apparatus of one embodiment of the present invention can be provided in the windshield of the automobile 9700. Note that in the case where a transistor or the like for driving the display apparatus is provided in the display apparatus, for example, a transistor having a light-transmitting property, such as an organic transistor using an organic semiconductor material or a transistor using an oxide semiconductor, is preferably used as the transistor.

The display portion 9712 is a display apparatus provided on a pillar portion. For example, the display portion 9712 can compensate for the view hindered by the pillar by displaying an image taken by an imaging means provided on the car body 9701. The display portion 9713 is a display apparatus provided on a dashboard 9703. For example, the display portion 9713 can compensate for the view hindered by the dashboard 9703 by displaying an image taken by the imaging means provided on the car body 9701. That is, in the automobile 9700, an image taken by the imaging means provided on the car body 9701 is displayed on the display portion 9712 and the display portion 9713, which can compensate for blind areas and enhance safety. Display of an image that complements for a portion that cannot be seen makes it possible to confirm safety more naturally and comfortably.

Figure 31:
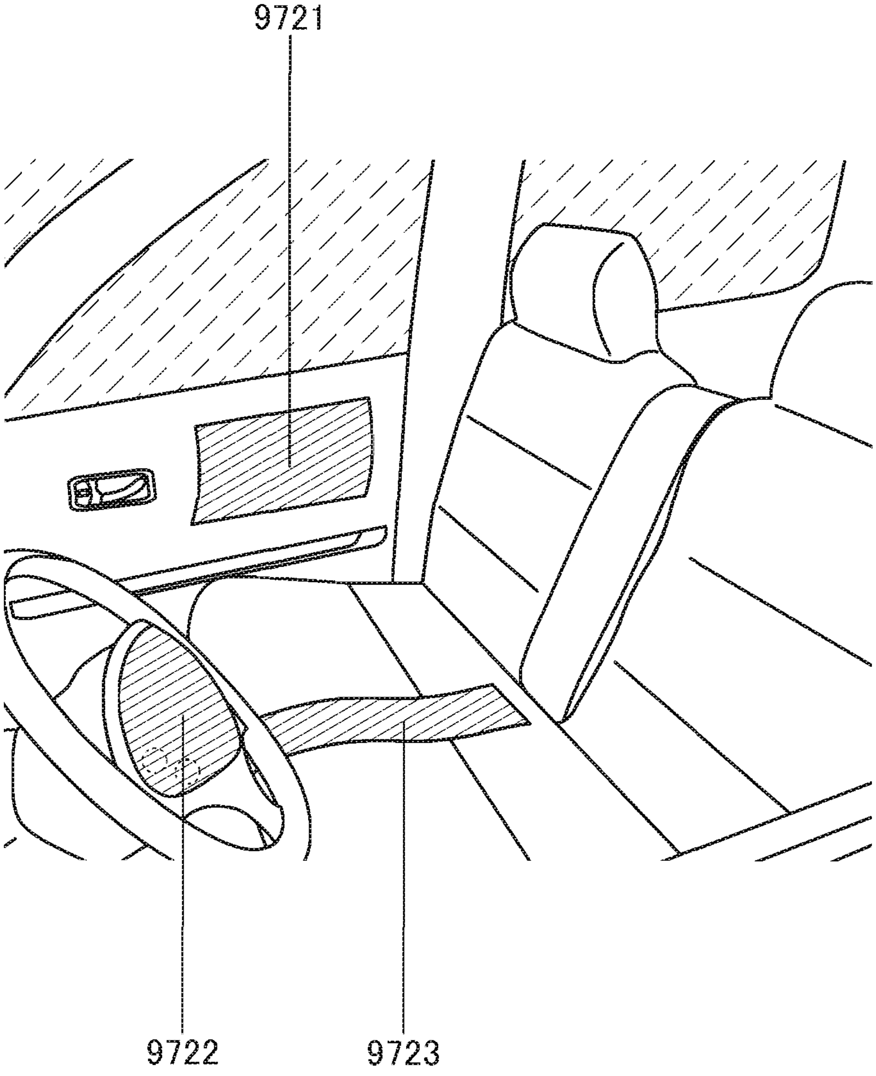
FIG. 31 is a diagram illustrating an example of an electronic device.

FIG. 31 illustrates the inside of an automobile 9700 in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the car body 9701. A display portion 9722 is a display apparatus provided in a steering wheel. A display portion 9723 is a display apparatus provided in the middle of a seating face of the bench seat.

The display portion 9714, the display portion 9715, and the display portion 9722 can provide a variety of kinds of information to a user by displaying navigation information, speed, the number of engine revolutions, a mileage, the remaining amount of fuel, a gearshift state, air-condition setting, or the like. The content, layout, and the like of the display on the display portions can be changed freely by a user as appropriate. The above information can also be displayed on one or more of the display portion 9710 to the display portion 9713, the display portion 9721, and the display portion 9723. One or more of the display portion 9710 to the display portion 9715 and the display portion 9721 to the display portion 9723 can also be used as lighting devices.

The structure described in this embodiment can be used in appropriate combination with any of the other structures described in the other embodiments.

REFERENCE NUMERALS

51A: pixel circuit, 51B: pixel circuit, 52A: circuit, 52B: circuit, 52*a*: terminal, 52*b*: terminal, 52*y*1: terminal, 52*y*2: terminal, 53A: circuit, 53B: circuit, 53*a*: terminal, 53*b*: terminal, 53*y*1: terminal, 53*y*2: terminal, 54: logic circuit, 54*a*: input terminal, 54*b*: input terminal, 54*y*: output terminal, 61: light-emitting element, 100A:

semiconductor device, 100B: semiconductor device, 101: wiring, 102: wiring, 103: wiring, 104: wiring, 180A: transistor, 180B: transistor, 180C: transistor, M1: transistor, M2: transistor, M3: transistor, M4: transistor, M5: transistor, M6: transistor, M7: transistor, M8: transistor, M9: transistor, M10: transistor, M1*a*: transistor, M1*b*: transistor, M5*a*: transistor, M5*b*: transistor, C1: capacitor, C2: capacitor, DL: wiring, GLa: wiring, GLb: wiring, ND1: node, ND2: node, ND3: node, GN: node, V0: potential, V1: potential, Va: potential, Vc: potential, T1*l*: period, T12: period, T13: period, T14: period, T15: period, T16: period, T21: period, T22: period, T23: period, T24: period, T25: period, T26: period

The invention claimed is:

1. A semiconductor device comprising a first transistor, a second transistor, a third transistor, a fourth transistor, a fifth transistor, a sixth transistor, a first capacitor, a second capacitor, a display element, a first wiring, a second wiring, and a logic circuit, wherein the first wiring is electrically connected to a first input terminal of the logic circuit and a gate of the sixth transistor, wherein the second wiring is electrically connected to a second input terminal of the logic circuit, a gate of the third transistor, a gate of the fourth transistor, and a gate of the fifth transistor, wherein a gate of the first transistor is electrically connected to an output terminal of the logic circuit, wherein one of a source and a drain of the first transistor is electrically connected to a gate of the second transistor, one of a source and a drain of the third transistor, and one terminal of the first capacitor, wherein the second transistor comprises a back gate, wherein the back gate is electrically connected to one of a source and a drain of the fourth transistor and one terminal of the second capacitor, wherein one of a source and a drain of the second transistor is electrically connected to the other of the source and the drain of the third transistor, one of a source and a drain of the fifth transistor, one of a source and a drain of the sixth transistor, the other terminal of the first capacitor, and the other terminal of the second capacitor, wherein the other of the source and the drain of the fifth transistor is electrically connected to one terminal of the display element, and wherein the logic circuit is configured to output a signal obtained by a logic operation of a signal input to the first input terminal and a signal input to the second input terminal to the output terminal.

2. The semiconductor device according to claim 1, wherein the logic operation is a logical conjunction of the signal input to the first input terminal and a negation of the signal input to the second input terminal.

3. The semiconductor device according to claim 1, wherein the logic circuit comprises a seventh transistor, an eighth transistor, a ninth transistor, and a tenth transistor, wherein a gate of the seventh transistor and a gate of the ninth transistor are electrically connected to the first input terminal, wherein a gate of the eighth transistor and a gate of the tenth transistor are electrically connected to the second input terminal, wherein one of a source and a drain of the seventh transistor is electrically connected to one of a source and a drain of the eighth transistor, wherein either the other of the source and the drain of the seventh transistor or the other of the source and the drain of the eighth transistor is electrically connected to the output terminal, and wherein one of a source and a drain of the ninth transistor and one of a source and a drain of the tenth transistor are electrically connected to the output terminal.

4. The semiconductor device according to claim 3, wherein the seventh transistor and the tenth transistor are n-channel transistors, and wherein the eighth transistor and the ninth transistor are p-channel transistors.

5. The semiconductor device according to claim 1, wherein the third transistor and the fourth transistor are n-channel transistors, and wherein the fifth transistor is a p-channel transistor.

6. The semiconductor device according to claim 4, wherein the p-channel transistor contains silicon in a semiconductor layer where a channel is formed.

7. The semiconductor device according to claim 4, wherein the n-channel transistor contains a metal oxide in a semiconductor layer where a channel is formed.

8. The semiconductor device according to claim 7, wherein the metal oxide contains at least one of indium and zinc.

9. The semiconductor device according to claim 1, wherein the display element comprises an organic EL element with a tandem structure.

10. The semiconductor device according to claim 2, wherein the third transistor and the fourth transistor are n-channel transistors, and wherein the fifth transistor is a p-channel transistor.

11. The semiconductor device according to claim 10, wherein the p-channel transistor contains silicon in a semiconductor layer where a channel is formed.

12. The semiconductor device according to claim 3, wherein the third transistor and the fourth transistor are n-channel transistors, and wherein the fifth transistor is a p-channel transistor.

13. The semiconductor device according to claim 12, wherein the p-channel transistor contains silicon in a semiconductor layer where a channel is formed.

* * * * *